United States Patent
Bibi et al.

(10) Patent No.: US 11,552,046 B2
(45) Date of Patent: *Jan. 10, 2023

(54) MICRO DEVICE TRANSFER HEAD ASSEMBLY

(71) Applicant: Apple Inc., Cupertino, CA (US)

(72) Inventors: Andreas Bibi, Los Altos, CA (US); John A. Higginson, Santa Clara, CA (US); Hung-Fai Stephen Law, Los Altos, CA (US); Hsin-Hua Hu, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 248 days.

This patent is subject to a terminal disclaimer.

(21) Appl. No.: 16/809,386

(22) Filed: Mar. 4, 2020

(65) Prior Publication Data
US 2020/0219840 A1    Jul. 9, 2020

Related U.S. Application Data

(63) Continuation of application No. 16/117,414, filed on Aug. 30, 2018, now Pat. No. 10,607,961, which is a
(Continued)

(51) Int. Cl.
*H01L 23/00*    (2006.01)
*H01L 21/67*    (2006.01)
(Continued)

(52) U.S. Cl.
CPC .............. *H01L 24/83* (2013.01); *B32B 38/18* (2013.01); *H01L 21/67144* (2013.01);
(Continued)

(58) Field of Classification Search
CPC ... H04L 24/83; H04L 21/67144; H04L 24/75; H04L 24/95; H04L 24/97; H04L 25/0753;
(Continued)

(56) References Cited

U.S. PATENT DOCUMENTS 3,717,743 A    2/1973 Costello
3,935,986 A    2/1976 Lattari et al.
(Continued)

FOREIGN PATENT DOCUMENTS

CN    101728288 A    1/2003
CN     1639841 A    7/2005
(Continued)

OTHER PUBLICATIONS

"Characteristics of electrostatic Chuck(ESC)" Advanced Materials Research Group New Technology Research Laboratory 2000 pp. 51-53 accessed at http://www.socnb.com/report/ptech_e/2000p51_e.pdf.
(Continued)

*Primary Examiner* — Jacob T Minskey
*Assistant Examiner* — Caroline Beha
(74) *Attorney, Agent, or Firm* — Aikin & Gallant, LLP

(57) ABSTRACT

A method of transferring a micro device and an array of micro devices are disclosed. A carrier substrate carrying a micro device connected to a bonding layer is heated to a temperature below a liquidus temperature of the bonding layer, and a transfer head is heated to a temperature above the liquidus temperature of the bonding layer. Upon contacting the micro device with the transfer head, the heat from the transfer head transfers into the bonding layer to at least partially melt the bonding layer. A voltage applied to the transfer head creates a grip force which picks up the micro device from the carrier substrate.

20 Claims, 37 Drawing Sheets

Related U.S. Application Data continuation of application No. 15/282,200, filed on Sep. 30, 2016, now Pat. No. 10,121,864, which is a continuation of application No. 14/307,321, filed on Jun. 17, 2014, now Pat. No. 9,463,613, which is a continuation of application No. 13/708,686, filed on Dec. 7, 2012, now Pat. No. 8,789,573, which is a continuation of application No. 13/372,422, filed on Feb. 13, 2012, now Pat. No. 8,349,116.

(60) Provisional application No. 61/597,658, filed on Feb. 10, 2012, provisional application No. 61/597,109, filed on Feb. 9, 2012, provisional application No. 61/594,919, filed on Feb. 3, 2012, provisional application No. 61/561,706, filed on Nov. 18, 2011.

(51) Int. Cl.
*B32B 38/18* (2006.01)
*H01L 33/62* (2010.01)
*H01L 25/075* (2006.01)
*H01L 29/167* (2006.01)

(52) U.S. Cl.
CPC ............ *H01L 24/75* (2013.01); *H01L 24/95* (2013.01); *H01L 24/97* (2013.01); *H01L 25/0753* (2013.01); *H01L 29/167* (2013.01); *H01L 33/62* (2013.01); *H01L 2221/68368* (2013.01); *H01L 2224/7598* (2013.01); *H01L 2224/75252* (2013.01); *H01L 2224/75725* (2013.01); *H01L 2224/83005* (2013.01); *H01L 2224/95001* (2013.01); *H01L 2224/97* (2013.01); *H01L 2924/10253* (2013.01); *H01L 2924/10329* (2013.01); *H01L 2924/12041* (2013.01); *H01L 2924/12042* (2013.01); *H01L 2924/14* (2013.01); *H01L 2924/1421* (2013.01); *H01L 2924/1431* (2013.01); *H01L 2924/1434* (2013.01); *H01L 2924/1461* (2013.01); *H01L 2933/0066* (2013.01); *Y10T 156/1153* (2015.01); *Y10T 156/17* (2015.01); *Y10T 156/1705* (2015.01); *Y10T 156/1707* (2015.01); *Y10T 156/1744* (2015.01); *Y10T 156/1749* (2015.01); *Y10T 156/1776* (2015.01); *Y10T 156/1911* (2015.01)

(58) Field of Classification Search
CPC ............ H04L 29/167; H04L 33/62; H04L 2221/68368; H04L 2224/75252; H04L 2224/75725; H04L 2224/7598; H04L 2224/83005; H04L 2224/95001; H04L 2224/97; H04L 2924/10253; H04L 2924/10329; H04L 2924/12041; H04L 2924/12042; H04L 2924/14; H04L 2924/1421; H04L 2924/1431; H04L 2924/1434; H04L 2924/1461; H04L 2933/0066; H04L 21/67712; H04L 21/67733; Y10T 156/1153; Y10T 156/17; Y10T 156/1705; Y10T 156/1707; Y10T 156/1744; Y10T 156/1749; Y10T 156/1776; Y10T 156/1911; B32B 38/18
See application file for complete search history.

(56) References Cited

U.S. PATENT DOCUMENTS

| | | |
|---|---|---|
| 5,131,582 A | 7/1992 | Kaplan et al. |
| 5,378,926 A | 1/1995 | Chi et al. |
| 5,435,857 A | 7/1995 | Han et al. |
| 5,439,161 A | 8/1995 | Kawatani et al. |
| 5,592,358 A | 1/1997 | Shamouilian et al. |
| 5,611,481 A | 3/1997 | Akamatsu et al. |
| 5,740,956 A | 4/1998 | Seo et al. |
| 5,794,839 A | 8/1998 | Kimura et al. |
| 5,839,187 A | 11/1998 | Sato et al. |
| 5,851,664 A | 12/1998 | Bennett et al. |
| 5,851,849 A | 12/1998 | Comizzoli et al. |
| 5,857,610 A | 1/1999 | Hoshiba et al. |
| 5,878,942 A | 3/1999 | Kodama et al. |
| 5,888,847 A | 3/1999 | Rostoker et al. |
| 5,903,428 A * | 5/1999 | Grimard ............ H01L 21/6833 279/128 |
| 5,996,218 A | 12/1999 | Shamouilian et al. |
| 6,071,795 A | 6/2000 | Cheung et al. |
| 6,080,650 A | 6/2000 | Edwards |
| 6,081,414 A | 6/2000 | Flanigan et al. |
| 6,142,356 A | 11/2000 | Yamazaki et al. |
| 6,240,634 B1 | 6/2001 | Kira et al. |
| 6,320,209 B1 | 11/2001 | Hata et al. |
| 6,335,263 B1 | 1/2002 | Cheung et al. |
| 6,337,723 B1 | 1/2002 | Bae |
| 6,403,985 B1 | 6/2002 | Fan et al. |
| 6,420,242 B1 | 7/2002 | Cheung et al. |
| 6,427,901 B2 | 8/2002 | Dautartas |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,621,157 B1 | 9/2003 | Wirz et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,769,469 B2 | 8/2004 | Yamada |
| 6,786,390 B2 | 9/2004 | Yang et al. |
| 6,841,802 B2 | 1/2005 | Yoo |
| 6,878,607 B2 | 4/2005 | Inoue et al. |
| 6,918,530 B2 | 7/2005 | Shinkai et al. |
| 7,033,842 B2 | 4/2006 | Haji et al. |
| 7,148,127 B2 | 12/2006 | Oohata et al. |
| 7,165,711 B2 | 1/2007 | Barretto et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,439,549 B2 | 10/2008 | Marchl et al. |
| 7,508,065 B2 | 3/2009 | Sherrer et al. |
| 7,585,703 B2 | 9/2009 | Matsumura et al. |
| 7,622,367 B1 | 11/2009 | Nuzzo et al. |
| 7,628,309 B1 | 12/2009 | Erikssen et al. |
| 7,649,266 B2 | 1/2010 | Ploessl et al. |
| 7,669,210 B2 | 2/2010 | Izumisawa |
| 7,714,336 B2 | 5/2010 | Imai |
| 7,723,764 B2 | 5/2010 | Dohata et al. |
| 7,732,301 B1 | 6/2010 | Pinnington et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,880,315 B2 | 2/2011 | Beyne et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,968,897 B2 | 6/2011 | Hata et al. |
| 7,972,875 B2 | 7/2011 | Rogers et al. |
| 7,982,296 B2 | 7/2011 | Nuzzo et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater et al. |
| 8,186,568 B2 | 5/2012 | Coronel et al. |
| 8,317,077 B2 | 11/2012 | Hwang et al. |
| 8,333,860 B1 | 12/2012 | Bibl et al. |
| 8,349,116 B1 | 1/2013 | Bibl et al. |
| 8,381,965 B2 | 2/2013 | Jang et al. |
| 8,383,506 B1 | 2/2013 | Golda et al. |
| 8,426,227 B1 | 4/2013 | Bibl et al. |

(56) References Cited

U.S. PATENT DOCUMENTS

| | | | |
|---|---|---|---|
| 8,440,546 B2 | 5/2013 | Nuzzo et al. |
| 8,506,867 B2 | 8/2013 | Menard |
| 8,518,204 B2 | 8/2013 | Hu et al. |
| 8,552,436 B2 | 10/2013 | Bibl et al. |
| 8,558,243 B2 | 10/2013 | Bibl et al. |
| 8,573,469 B2 | 11/2013 | Hu et al. |
| 8,646,505 B2 | 2/2014 | Bibl et al. |
| 8,664,699 B2 | 3/2014 | Nuzzo et al. |
| 8,789,573 B2 | 7/2014 | Bibl et al. |
| 8,865,489 B2 | 10/2014 | Rogers et al. |
| 8,877,648 B2 | 11/2014 | Bower et al. |
| 8,889,485 B2 | 11/2014 | Bower |
| 8,934,259 B2 | 1/2015 | Bower et al. |
| 9,255,001 B2 * | 2/2016 | Golda ............... B81C 99/002 |
| 9,773,750 B2 | 9/2017 | Bibl |
| 10,607,961 B2 | 3/2020 | Bibl et al. |
| 2001/0029088 A1 | 10/2001 | Odajima et al. |
| 2002/0056740 A1 | 5/2002 | Hayashi |
| 2002/0076848 A1 | 6/2002 | Spooner et al. |
| 2003/0010975 A1 | 1/2003 | Gibb et al. |
| 2003/0177633 A1 | 9/2003 | Haji et al. |
| 2003/0207644 A1 | 11/2003 | Green et al. |
| 2003/0232478 A1 | 12/2003 | Hiratsuka |
| 2004/0100164 A1 | 5/2004 | Murata et al. |
| 2004/0232439 A1 | 11/2004 | Gibb et al. |
| 2004/0266048 A1 | 12/2004 | Platt et al. |
| 2005/0110033 A1 | 5/2005 | Heremans et al. |
| 2005/0184951 A1 | 8/2005 | Kim et al. |
| 2005/0212140 A1 | 9/2005 | Fujinaga et al. |
| 2005/0224822 A1 | 10/2005 | Liu |
| 2005/0232728 A1 | 10/2005 | Rice et al. |
| 2005/0253156 A1 | 11/2005 | Horio et al. |
| 2005/0253161 A1 | 11/2005 | Horio et al. |
| 2006/0038291 A1 | 2/2006 | Chung et al. |
| 2006/0055035 A1 | 3/2006 | Lin et al. |
| 2006/0065905 A1 | 3/2006 | Eisert et al. |
| 2006/0154390 A1 | 7/2006 | Tran et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2006/0226419 A1 | 10/2006 | Birnstock et al. |
| 2006/0292757 A1 | 12/2006 | Wu et al. |
| 2007/0000592 A1 | 1/2007 | Fares et al. |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2007/0284409 A1 | 12/2007 | Kobrinsky et al. |
| 2007/0284598 A1 | 12/2007 | Shakuda et al. |
| 2007/0284604 A1 | 12/2007 | Slater et al. |
| 2008/0035949 A1 | 2/2008 | Fudeta et al. |
| 2008/0048206 A1 | 2/2008 | Lee et al. |
| 2008/0135859 A1 | 6/2008 | Cho et al. |
| 2008/0150134 A1 | 6/2008 | Shinkai et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0205027 A1 | 8/2008 | Coronel et al. |
| 2008/0210955 A1 | 9/2008 | Uemura et al. |
| 2008/0237629 A1 | 10/2008 | Ando et al. |
| 2008/0283190 A1 | 11/2008 | Papworth et al. |
| 2008/0283849 A1 | 11/2008 | Imai |
| 2008/0303038 A1 | 12/2008 | Grotsch et al. |
| 2009/0059586 A1 | 3/2009 | Livesay et al. |
| 2009/0068774 A1 | 3/2009 | Slater et al. |
| 2009/0072382 A1 | 3/2009 | Guzek |
| 2009/0103292 A1 | 4/2009 | Iwafuchi et al. |
| 2009/0125141 A1 | 5/2009 | Noda et al. |
| 2009/0127315 A1 | 5/2009 | Okita |
| 2009/0146303 A1 | 6/2009 | Kwon |
| 2009/0239324 A1 | 9/2009 | Chinone et al. |
| 2009/0242918 A1 | 10/2009 | Edmond et al. |
| 2009/0278233 A1 | 11/2009 | Pinnington et al. |
| 2009/0303713 A1 | 12/2009 | Chang et al. |
| 2009/0314991 A1 | 12/2009 | Cho et al. |
| 2010/0046134 A1 | 2/2010 | Mizuno et al. |
| 2010/0052004 A1 | 3/2010 | Slater et al. |
| 2010/0060553 A1 | 3/2010 | Zimmerman et al. |
| 2010/0078656 A1 | 4/2010 | Seo et al. |
| 2010/0097738 A1 | 4/2010 | Kang et al. |
| 2010/0105172 A1 | 4/2010 | Li et al. |
| 2010/0123163 A1 | 5/2010 | Ohtorii et al. |
| 2010/0123164 A1 | 5/2010 | Suehiro et al. |
| 2010/0176415 A1 | 7/2010 | Lee et al. |
| 2010/0188794 A1 | 7/2010 | Park et al. |
| 2010/0200884 A1 | 8/2010 | Lee et al. |
| 2010/0203659 A1 | 8/2010 | Akaike et al. |
| 2010/0203661 A1 | 8/2010 | Hodota |
| 2010/0213471 A1 | 8/2010 | Fukasawa et al. |
| 2010/0214777 A1 | 8/2010 | Suehiro et al. |
| 2010/0248484 A1 | 9/2010 | Bower et al. |
| 2010/0258818 A1 | 10/2010 | Lee et al. |
| 2010/0272712 A1 | 10/2010 | Patterson et al. |
| 2010/0276726 A1 | 11/2010 | Cho et al. |
| 2010/0283064 A1 | 11/2010 | Samuelson et al. |
| 2010/0316242 A1 | 12/2010 | Cohen et al. |
| 2011/0001145 A1 | 1/2011 | Park |
| 2011/0003410 A1 | 1/2011 | Tsay et al. |
| 2011/0049540 A1 | 3/2011 | Wang et al. |
| 2011/0132655 A1 | 6/2011 | Horiguchi et al. |
| 2011/0132656 A1 | 6/2011 | Horiguchi et al. |
| 2011/0143467 A1 | 6/2011 | Xiong et al. |
| 2011/0147760 A1 | 6/2011 | Ogihara et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0215292 A1 | 9/2011 | Zaima et al. |
| 2011/0244611 A1 | 10/2011 | Kim |
| 2011/0272712 A1 | 11/2011 | Jeong et al. |
| 2011/0291134 A1 | 12/2011 | Kang |
| 2011/0297914 A1 | 12/2011 | Zheng et al. |
| 2011/0297972 A1 | 12/2011 | Seo et al. |
| 2011/0312131 A1 | 12/2011 | Renavikar et al. |
| 2012/0018494 A1 | 1/2012 | Jang et al. |
| 2012/0027557 A1 | 2/2012 | Ashdown et al. |
| 2012/0064642 A1 | 3/2012 | Huang et al. |
| 2012/0091110 A1 | 4/2012 | Kaneyama |
| 2012/0134065 A1 | 5/2012 | Furuya et al. |
| 2013/0019996 A1 | 1/2013 | Routledge |
| 2013/0032836 A1 | 2/2013 | Chen et al. |
| 2013/0038416 A1 | 2/2013 | Arai et al. |
| 2013/0126098 A1 | 5/2013 | Bibl et al. |
| 2013/0130440 A1 | 5/2013 | Hu et al. |
| 2013/0134591 A1 | 5/2013 | Sakamoto et al. |
| 2013/0161682 A1 | 6/2013 | Liang et al. |
| 2014/0373898 A1 | 12/2014 | Rogers et al. |
| 2019/0096846 A1 | 3/2019 | Bibl et al. |

FOREIGN PATENT DOCUMENTS

| | | |
|---|---|---|
| CN | 1666879 A | 9/2005 |
| CN | 1667846 A | 9/2005 |
| CN | 1675731 A | 9/2005 |
| CN | 1742394 A | 3/2006 |
| CN | 1819255 A | 8/2006 |
| CN | 1822400 A | 8/2006 |
| CN | 1960830 A | 5/2007 |
| CN | 101103499 | 1/2008 |
| CN | 101132040 A | 2/2008 |
| CN | 101807649 A | 8/2010 |
| CN | 101919074 A | 12/2010 |
| CN | 102263182 A | 11/2011 |
| DE | 101 24 328 A1 | 11/2002 |
| DE | 10 2009 058 796 A1 | 6/2011 |
| EP | 1677366 A2 | 7/2006 |
| EP | 2211379 A1 | 7/2010 |
| JP | S54-069957 | 6/1978 |
| JP | S58-50582 A | 3/1983 |
| JP | S58-180043 A | 10/1983 |
| JP | S59-65490 A | 4/1984 |
| JP | 05-013820 A | 1/1993 |
| JP | 05-074873 A | 3/1993 |
| JP | H05-63242 A | 3/1993 |
| JP | H06-334217 A | 12/1994 |
| JP | 07-060675 A | 3/1995 |

(56) References Cited

FOREIGN PATENT DOCUMENTS

| | | |
|---|---|---|
| JP | H07-094786 A | 4/1995 |
| JP | H07-111339 | 4/1995 |
| JP | 61-102787 | 5/1996 |
| JP | 11-142878 | 5/1999 |
| JP | H11-168132 A | 6/1999 |
| JP | 11-340288 A | 12/1999 |
| JP | H11-333765 A | 12/1999 |
| JP | 2001-144168 | 5/2001 |
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2003-282957 A | 10/2003 |
| JP | 2004-22846 | 1/2004 |
| JP | 2004-095944 A | 3/2004 |
| JP | 2004-096046 A | 3/2004 |
| JP | 2004-111680 | 4/2004 |
| JP | 2004-253403 A | 9/2004 |
| JP | 2004-537158 A | 12/2004 |
| JP | 2005-150386 A | 6/2005 |
| JP | 2005-322847 A | 11/2005 |
| JP | 2006-040946 | 2/2006 |
| JP | 2006-515716 A | 6/2006 |
| JP | 2006-196692 | 7/2006 |
| JP | 2006-196693 A | 7/2006 |
| JP | 2007-013107 A | 1/2007 |
| JP | 2007-158286 A | 6/2007 |
| JP | 2007-214339 A | 8/2007 |
| JP | 2007-532003 A | 11/2007 |
| JP | 2008-135736 | 6/2008 |
| JP | 2008-140872 A | 6/2008 |
| JP | 2008-200821 A | 6/2008 |
| JP | 2008-186959 A | 8/2008 |
| JP | 2008-235362 A | 10/2008 |
| JP | 2009-054897 A | 3/2009 |
| JP | 2009-076752 A | 4/2009 |
| JP | 2009-182076 A | 8/2009 |
| JP | 2009-535802 A | 10/2009 |
| JP | 2010-056458 A | 3/2010 |
| JP | 2010-087515 A | 4/2010 |
| JP | 2010-123780 A | 6/2010 |
| JP | 2010-123843 | 6/2010 |
| JP | 2010-161212 A | 7/2010 |
| JP | 2010-186829 A | 8/2010 |
| JP | 2010-263251 A | 11/2010 |
| JP | 2011-501415 A | 1/2011 |
| JP | 2011-055010 A | 3/2011 |
| JP | 2011-108911 A | 6/2011 |
| JP | 2011-119383 | 6/2011 |
| JP | 2011-181834 A | 9/2011 |
| JP | 4778107 B | 9/2011 |
| KR | 10-2002-0005152 | 1/2002 |
| KR | 10-2002-0069357 | 8/2002 |
| KR | 20040009818 A | 1/2004 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 20100112536 A | 10/2010 |
| KR | 10-1001454 B1 | 12/2010 |
| KR | 10-2007-0006885 A | 1/2011 |
| KR | 10-2011-0084888 A | 7/2011 |
| TW | 465130 | 11/2001 |
| TW | 549448 | 8/2005 |
| TW | 200826325 A | 6/2008 |
| TW | 20084004 A | 10/2008 |
| TW | 200903860 A | 1/2009 |
| TW | 201034114 A1 | 9/2010 |
| TW | 201123524 A | 7/2011 |
| WO | 01/41219 A | 6/2001 |
| WO | 2004/0066409 A1 | 8/2004 |
| WO | 2005/097390 | 10/2005 |
| WO | 2005/099310 A2 | 10/2005 |
| WO | 2008/093880 A | 8/2008 |
| WO | 2009/117848 A1 | 10/2009 |
| WO | 2010/065070 A2 | 6/2010 |
| WO | 2010/082606 A1 | 7/2010 |
| WO | 2010/114250 A2 | 7/2010 |
| WO | 2011/006719 | 1/2011 |
| WO | 2011/072372 A1 | 6/2011 |
| WO | 2011/123285 | 10/2011 |
| WO | 2013/109593 | 7/2013 |
| WO | 2013/109593 A2 | 7/2013 |
| WO | 2013/109593 A3 | 7/2013 |

OTHER PUBLICATIONS

"Major Research Thrust: Epitaxial Layer Transfer by Laser Lift-off" Purdue University Heterogeneous Integration Research Group accessed at https://engineering.purdue.edu/HetInt/project_epitaxial_layer_transfer_llo.htm last updated Aug. 2003.

"Principles of Electrostatic Chucks: 1—Techniques for High Performance Grip and Release" ElectroGrip Principles1 rev3 May 2006 2 pgs accessed at www.electrogrip.com.

Asano Kazutoshi et al. "Fundamental Study of an Electrostatic Chuck for Silicon Wafer Handling" IEEE Transactions on Industry Applications vol. 38 No. 3 May/Jun. 2002 pp. 840-845.

Bower C.A. et al. "Active-Matrix OLED Display Backplanes Using Transfer-Printed Microscale Integrated Circuits" IEEE 2010 Electronic Components and Technology Conference pp. 1339-1343.

Dragoi et al. "Metal Wafer Bonding for MEMS Devices" Romanian Journal of Information Science and Technology vol. 13 No. 1 2010 pp. 65-72.

European Patent Application No. 12849914.2 European Search Report dated Jun. 25, 2015 7 pages.

European Patent Application No. 12850120.2 European Search Report dated Oct. 1, 2015 6 pages.

Guerre Roland et al "Selective Transfer Technology for Microdevice Distribution" Journal of Microelectromechanical Systems vol. 17 No. 1 Feb. 2008 pp. 157-165.

Han Min-Koo "AM backplane for AMOLED" Proc. Of ASID '06 OCt. 8-12 New Delhi pp. 53-58.

Harris Jonathan H. "Sintered Aluminum Nitride Ceramics for High-Power Electronic Applications" Journal of the Minerals Metals and Materials Society vol. 50 No. 6 Jun. 1998 p. 56.

Horwitz Chris M. "Electrostatic Chucks: Frequently Asked Questions" Electrogrip 2006 10 pgs accessed at www.electrogrip.com.

Hossick-Schott Joachim "Prospects for the ultimate energy density of oxide-based capacitor anodes" Proceedings of CARTS Europe Barcelona Spain 2007 10 pgs.

Lee San Youl et al. "Wafer-level fabrication of GAN-based vertical light-emitting diodes using a multi-functional bonding material system" Semicond. Sci. Technol. 24 2009 4 pgs.

Mei Zequn et al. "Low-Temperature Solders" Hewlett-Packard Journal Article Aug. 10, 1996 pp. 1-10.

Mercado Lei L. et al. "A Mechanical Approach to Overcome RF MEMS Switch Stiction Problem" 2003 Electronic Components and Technology Conference pp. 377-384.

Miskys Claudio R. et al. "Freestanding GaN-substrates and devices" phys. Stat. sol. © 0 No. 6 2003 pp. 1627-1650.

PCT International Search Report and Written Opinion for International Application No. PCT/US2013/024939 dated May 13, 2013 12 pages.

PCT International Search Report and Written Opinion for International Application No. PCT/US2012/064221 dated Mar. 29, 2013 11 pages.

Roman et al. "Low Stress Die Attach by Low Temperature Transient liquid Phase Bonding" The International Society for Hybrid Microelectronics (ISHM) Symposium Proceedings Oct. 1992 pp. 1-6.

Steigerwald Daniel et al. "III-V Nitride Semiconductors for High-Performance Blue and Green Light-Emitting Devices" article appears in journal JOM 49 (9) 1997 pp. 18-23. Article accessed Nov. 2, 2011 at http://www.tms.org/pubs/journals/jom/9709/setigerwald-9709.html 12 pgs.

Studnitzky et al. "Diffusion Soldering for Stable High-Temperature Thin-Film Bonds" JOM Dec. 2002 pp. 58-63.

(56) References Cited

OTHER PUBLICATIONS

Welch et al. "Gold-Indium Transient Liquid Phase (TLP) Wafer Bonding for MEMS Vacuum Packaging" MEMS 2008 Tucson AZ Jan. 13-17, 2008 pp. 806-809.
Widas Robert "Electrostatic Substrate Clamping For Next Generation Semiconductor Devices" Apr. 21, 1999 4 pgs.

* cited by examiner

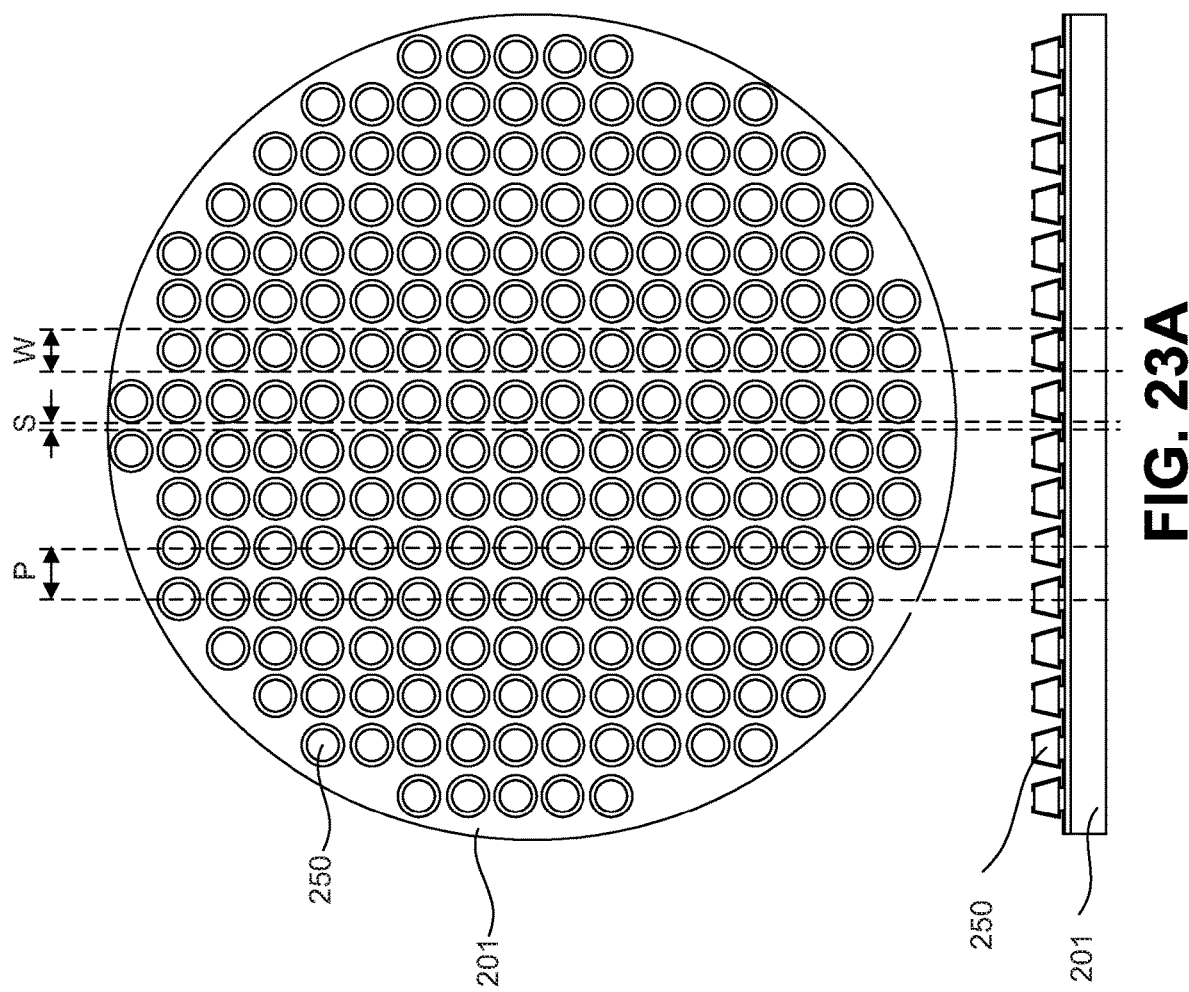

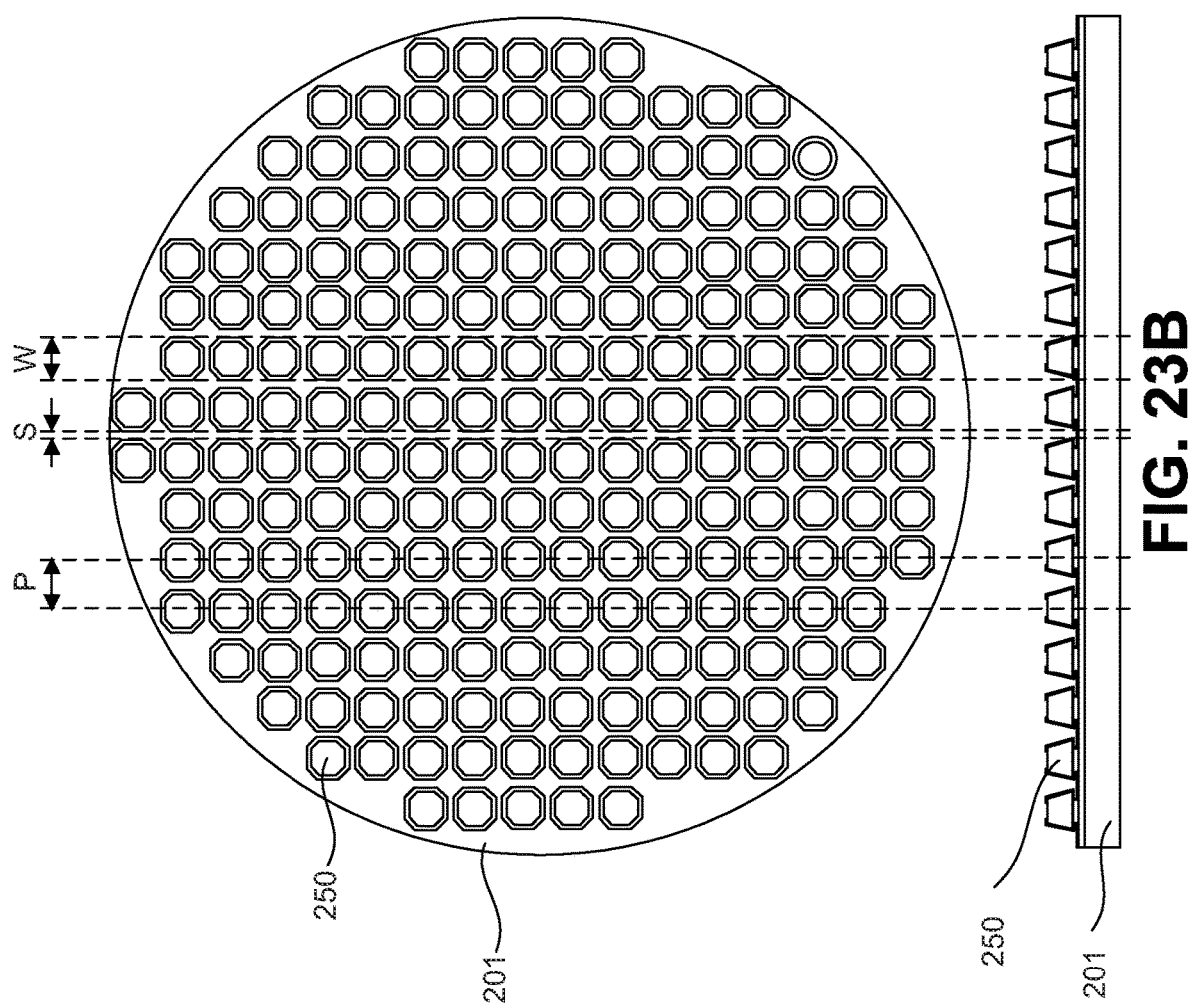

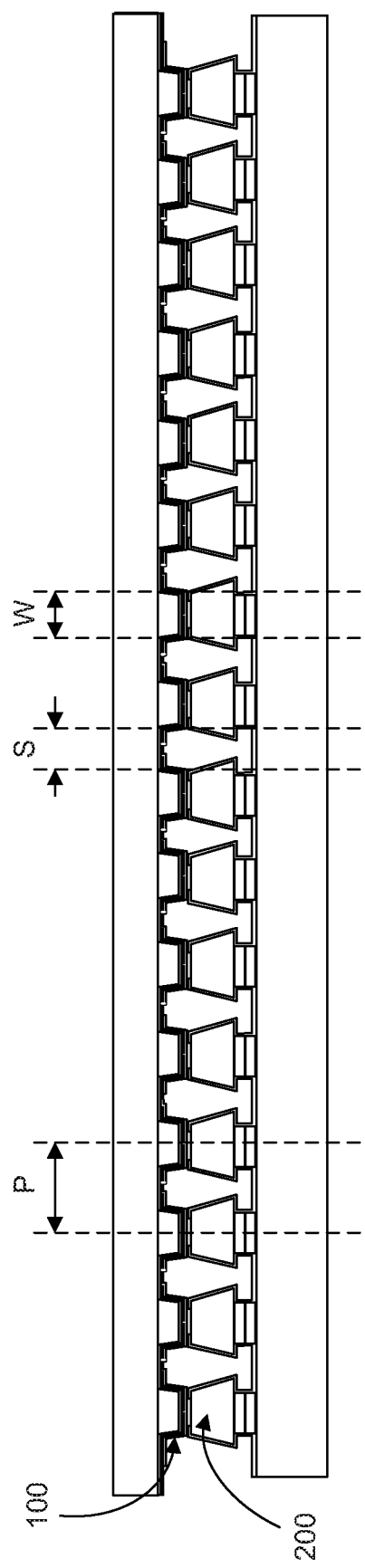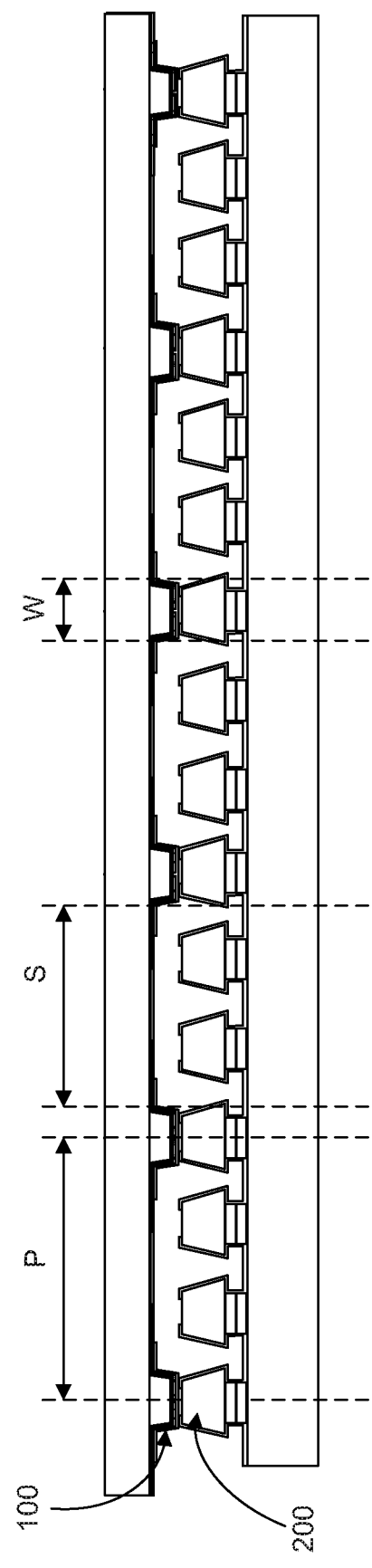

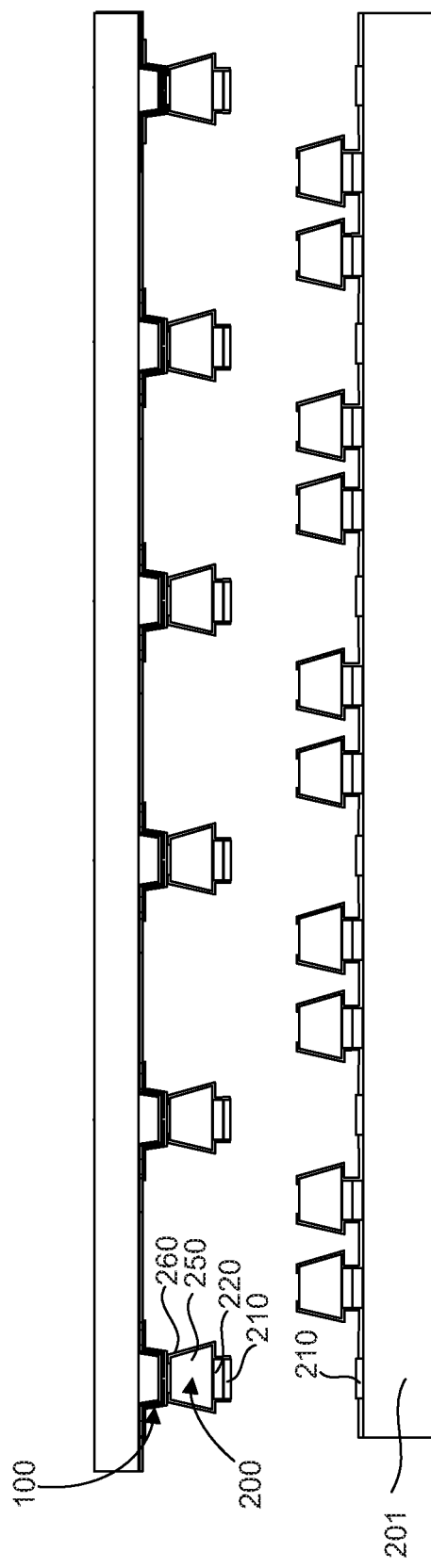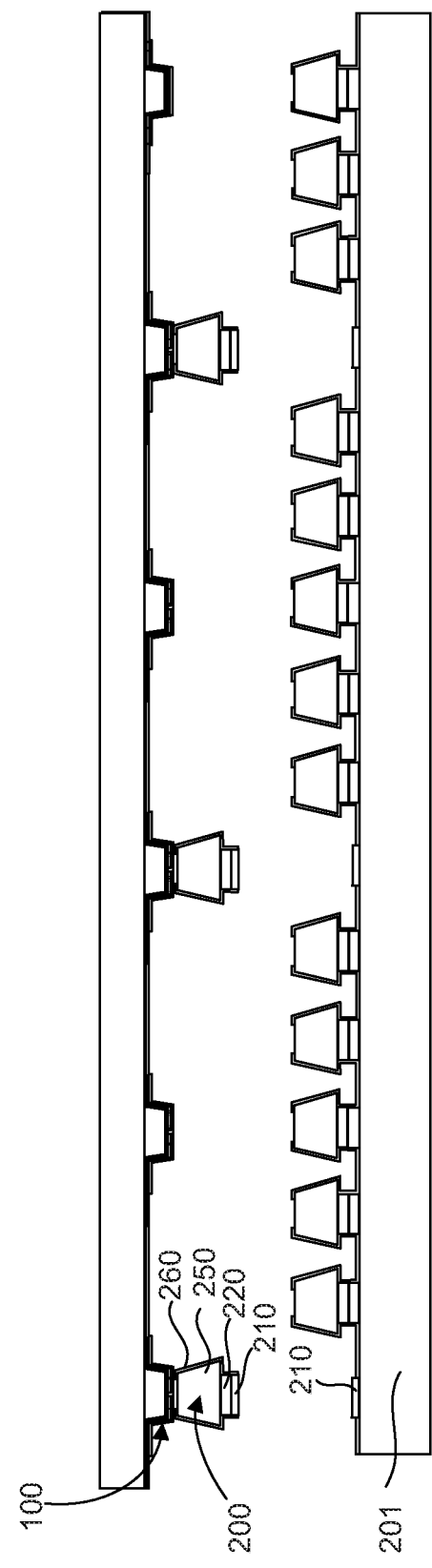

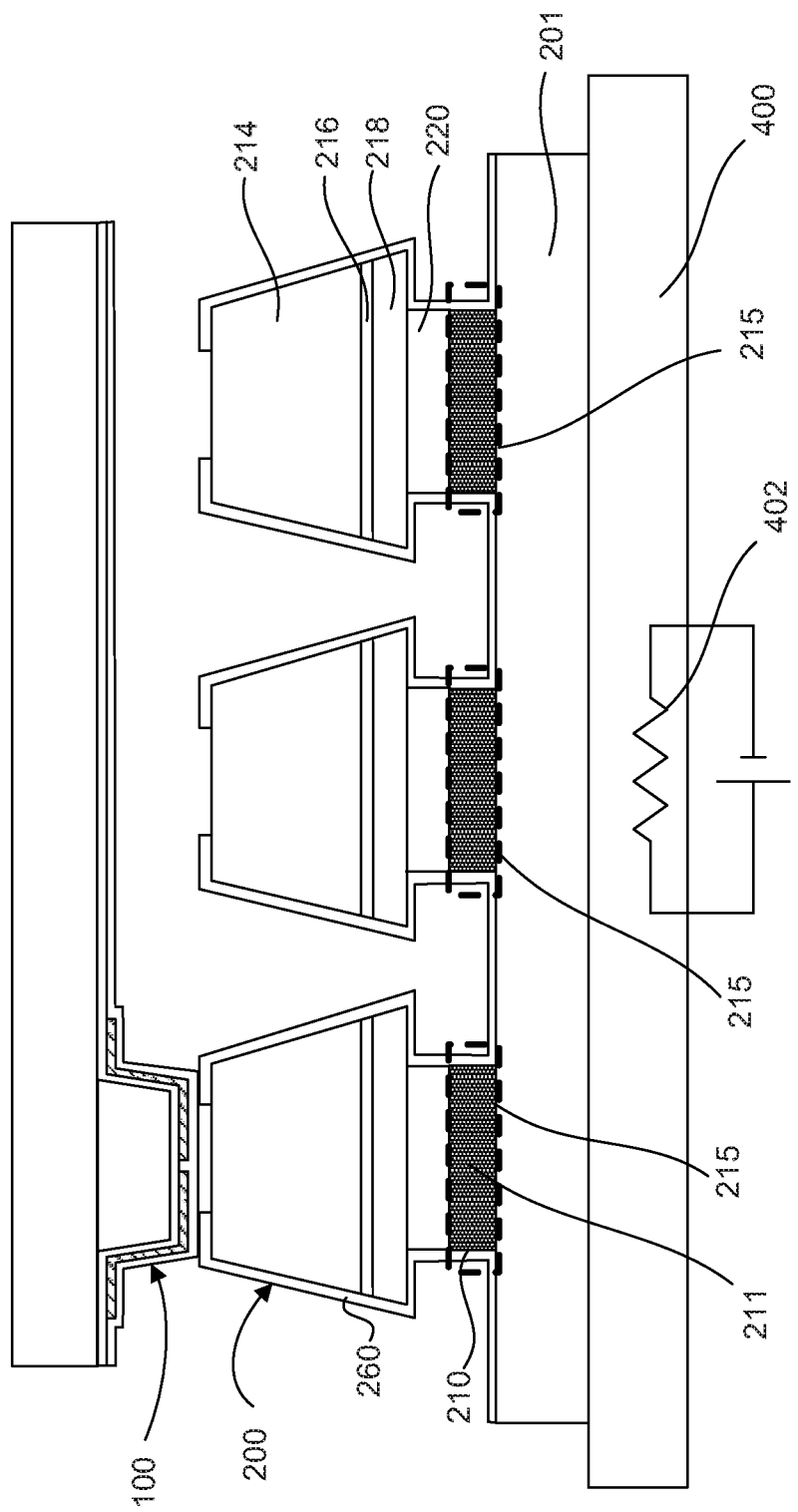

MICRO DEVICE TRANSFER HEAD ASSEMBLY

RELATED APPLICATIONS

This application is a continuation of U.S. patent application Ser. No. 16/117,414, filed Aug. 30, 2018, which is a continuation of U.S. patent application Ser. No. 15/282,200, filed Sep. 30, 2016, now U.S. Pat. No. 10,121,864, which is a continuation of U.S. patent application Ser. No. 14/307,321, filed Jun. 17, 2014, now U.S. Pat. No. 9,463,613, which is a continuation of U.S. patent application Ser. No. 13/708,686, filed Dec. 7, 2012, now U.S. Pat. No. 8,789,573, which is a continuation of U.S. patent application Ser. No. 13/372,422 filed on Feb. 13, 2012, now U.S. Pat. No. 8,349,116, and claims the benefit of priority from U.S. Provisional Patent Application No. 61/561,706 filed on Nov. 18, 2011, U.S. Provisional Patent Application No. 61/594,919 filed on Feb. 3, 2012, U.S. Provisional Patent Application No. 61/597,109 filed on Feb. 9, 2012, and U.S. Provisional Patent Application No. 61/597,658 filed on Feb. 10, 2012, the full disclosures of which are incorporated herein by reference.

BACKGROUND

Field

The present invention relates to micro devices. More particularly embodiments of the present invention relate to a method of transferring one or more micro devices to a receiving substrate with a micro device transfer head.

Background Information

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing a transfer wafer may pick up an array of devices from a donor wafer, and then bond the array of devices to a receiving wafer, followed by removal of the transfer wafer.

Some printing process variations have been developed where a device can be selectively bonded and de-bonded during the transfer process. In both traditional and variations of the direct printing and transfer printing technologies, the transfer wafer is de-bonded from a device after bonding the device to the receiving wafer. In addition, the entire transfer wafer with the array of devices is involved in the transfer process.

SUMMARY OF THE INVENTION

A micro device transfer head and head array, and a method of transferring one or more micro devices to a receiving substrate are disclosed. For example, the receiving substrate may be, but is not limited to, a display substrate, a lighting substrate, a substrate with functional devices such as transistors or integrated circuits (ICs), or a substrate with metal redistribution lines.

In an embodiment, a micro device transfer head includes a base substrate, a mesa structure including sidewalls, at least one is electrode formed over the mesa structure, and a dielectric layer covering the electrode. For example, the micro device transfer head can incorporate a monopolar or bipolar electrode structure. The mesa structure can be separately or integrally formed with the base substrate. The sidewalls can be tapered and protrude away from the base substrate to a top surface of the mesa structure, with the electrode formed on the top surface. An electrode lead may extend from the electrode in order to make contact with wiring in the base substrate and connect the micro device transfer head to the working electronics of an electrostatic gripper assembly. The electrode leads can run from the electrode on the top surface of the mesa structure and along a sidewall of the mesa structure. The electrode lead can alternatively run underneath the mesa structure and connect to a via running through the mesa structure to the electrode.

The electrode and electrode leads may be covered with a deposited dielectric layer. Suitable materials for the dielectric layer include, but are not limited to, aluminum oxide ($Al_2O_3$) and tantalum oxide ($Ta_2O_5$). Since the dielectric layer is deposited, the electrode and electrode leads may be formed of a material which can withstand high deposition temperatures, including high melting temperature metals such as platinum and refractory metals or refractory metal alloys such as titanium tungsten (TiW).

In an embodiment, a method of transferring a micro device includes positioning a transfer head over a micro device connected to a carrier substrate. The micro device is contacted with the transfer head and a voltage is applied to an electrode in the transfer head to create a grip pressure on the micro device. The transfer head picks up the micro device and then releases the micro device onto a receiving substrate. The voltage can be applied to the electrode prior to, while or after contacting the micro device with the transfer head. The voltage can be a constant current voltage, or alternating current voltage. In an embodiment, an alternating current voltage is applied to a bipolar electrode structure. In an embodiment, an operation is additionally performed to create a phase change in a bonding layer connecting the micro device to the carrier substrate prior to or while picking up the micro device.

In an embodiment, the bonding layer is heated to create a phase change from solid to liquid in the bonding layer prior to or while picking up the micro device. Depending upon the operating conditions, a substantial portion of the bonding layer can be picked up and transferred with the micro device. A variety of operations can be performed to control the phase of the portion of the bonding layer when picking up, transferring, contacting the receiving substrate, and releasing the micro device and portion of the bonding layer on the receiving substrate. For example, the portion of the bonding layer which is picked up with the micro device can be maintained in the liquid state when contacting the receiving substrate and during the release operation onto the receiving substrate. In another embodiment, the portion of the bonding layer can be allowed to cool to a solid phase after being pick up. For example, the portion of the bonding layer can be in a solid phase prior to or during contacting the receiving substrate, and again melted to the liquid state during the release operation. A variety of temperature and material phase cycles can be performed in accordance with embodiments of the invention.

In an embodiment, a method of transferring an array of micro devices includes positioning an array of transfer heads over an array of micro devices. The array of micro devices is contacted with the array of transfer heads, and a voltage is selectively applied to a portion of the array of transfer heads. Selectively applying a voltage may include applying a voltage to all of the transfer heads in the array, or to a portion corresponding to less than all of the transfer heads in the array. The corresponding portion of the array of micro devices is then picked up with the portion of the array of transfer heads, and the portion of the array of micro devices is selectively released onto at least one receiving substrate. In an embodiment, the array of transfer heads may be rubbed on the array of micro devices while making contact in order to dislodge any particles which may be present on the contacting surface of either of the transfer heads or micro devices. In an embodiment, a phase change is created in an array of laterally separate locations of the bonding layer connecting the array of micro devices to the carrier substrate prior to picking up the array of micro devices.

In an embodiment, a method of fabricating a micro device transfer head array includes forming an array of mesa structures on a base substrate, with each mesa structure including sidewalls. A separate electrode is formed over each mesa structure, and a dielectric layer is deposited over the array of mesa structures and each electrode. In an embodiment, the dielectric layer is deposited with atomic layer deposition (ALD), and may be pin-hole free. The dielectric layer may include one or multiple dielectric layers. A conformal passivation layer may optionally be grown or deposited over the base substrate and the array of mesa structures prior to forming the separate electrode over each corresponding mesa structure. In an embodiment, a conductive ground plane is formed over the dielectric layer and surrounding each of the mesa structures.

In an embodiment, a method of transferring a micro device includes heating a carrier substrate carrying a micro device connected to a bonding layer to a temperature below a liquidus temperature of the bonding layer, and heating a transfer head to a temperature above the liquidus temperature of the bonding layer. The micro device is contacted with the transfer head and heat transfers from the transfer head into the bonding layer to at least partially melt the bonding layer. A voltage is applied to the transfer head to create a grip pressure on the micro device, and the micro device is picked up with the transfer head. The micro device can then be placed in contact with and released onto a receiving substrate. The receiving substrate may be globally or locally heated to assist with the transfer process.

In an embodiment, a method of transferring an array of micro devices includes heating a substrate carrying an array of micro devices connected to a plurality of locations of a bonding layer to a temperature below a liquidus temperature of the bonding layer, and heating an array of transfer heads to a temperature above the liquidus temperature of the bonding layer. The array of micro devices are contacted with the array of transfer heads and heat is transferred from the array of transfer heads into the plurality of locations of the bonding layer to at least partially melt portions of the plurality of locations of the bonding layer. A voltage is selectively applied to a portion of the array of transfer heads, and a corresponding portion of the array of micro devices is picked up with the portion of the array of transfer heads. The portion of the array of micro devices can then be placed in contact with and selectively released onto at least one receiving substrate. The receiving substrate may be globally or locally heated to assist with the transfer process.

In an embodiment, the micro device and array of micro devices are micro LED devices, each including a micro p-n diode and a metallization layer, with the metallization layer between the micro p-n diode and a bonding layer formed on a substrate. When picking up the micro LED device and array of micro LED devices may include picking up the micro p-n diode, the metallization layer and a portion of the bonding layer. A conformal dielectric barrier layer may span sidewalls of the micro p-n diode and a bottom surface of the micro p-n diode. The conformal dielectric barrier layer may be cleaved below the bottom surface of the micro p-n diode.

BRIEF DESCRIPTION OF THE DRAWINGS

FIGS. 23A-23B include top and cross-sectional side view illustrations of a carrier wafer and array of micro LED devices in accordance with embodiments of the invention.

FIG. 26 is a cross-sectional side view illustration of an array of micro device transfer heads in contact with an array of micro LED devices in accordance with an embodiment of the invention.

FIG. 27 is a cross-sectional side view illustration of an array of micro device transfer heads in contact with an array of micro LED devices in accordance with an embodiment of the invention.

FIG. 28 is a cross-sectional side view illustration of an array of micro device transfer heads picking up an array of micro LED devices in accordance with an embodiment of the invention.

FIG. 29 is a cross-sectional side view illustration of an array of micro device transfer heads picking up a portion of an array of micro LED devices in accordance with an embodiment of the invention.

FIG. 34B is a cross-sectional side view illustration of at least partially melted laterally separate locations of a bonding layer in accordance with an embodiment of the invention.

DETAILED DESCRIPTION OF THE INVENTION

Figure 1:
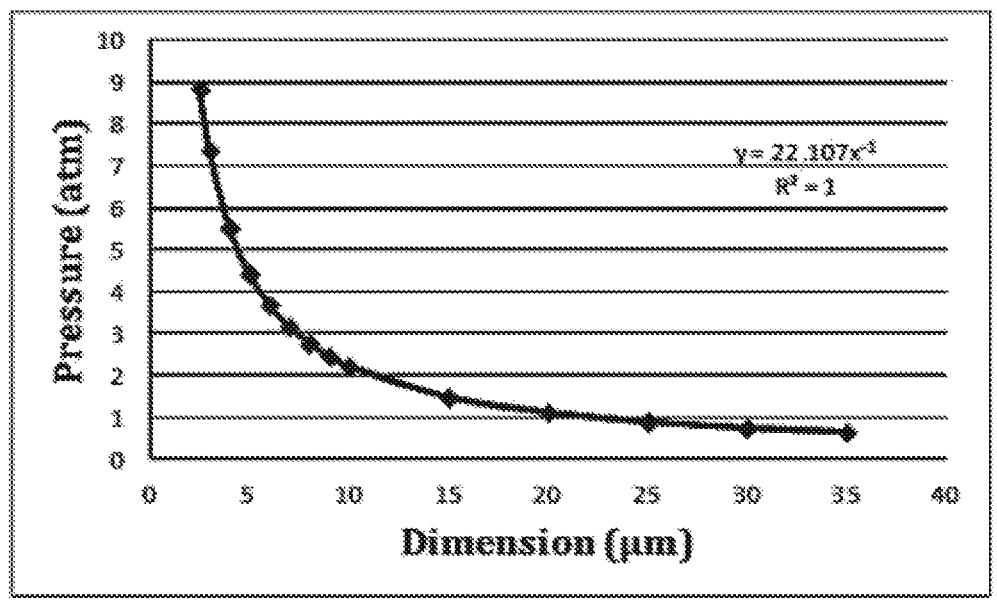
FIG. 1 is a graphical illustration showing the pressure required to overcome the force of surface tension to pick up a micro device of various dimensions in accordance with an embodiment of the invention.

Embodiments of the present invention describe a micro device transfer head and head array, and method of transferring a micro device and an array of micro devices to a receiving substrate. For example, the receiving substrate may be, but is not limited to, a display substrate, a lighting substrate, a substrate with functional devices such as transistors or integrated circuits (ICs), or a substrate with metal redistribution lines. In some embodiments, the micro devices and array of micro devices described herein may be any of the micro LED device structures illustrated in FIGS. 19-21, and those described in related U.S. Provisional Application No. 61/561,706 and U.S. Provisional Application No. 61/594,919. While some embodiments of the present invention are described with specific regard to micro LEDs, it is to be appreciated that embodiments of the invention are not so limited and that certain embodiments may also be applicable to other micro devices such as diodes, transistors, ICs, and MEMS.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiments.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "micro" device or "micro" LED structure as used herein may refer to the descriptive size of certain devices or structures in accordance with embodiments of the invention. As used herein, the terms "micro" devices or structures are meant to refer to the scale of 1 to 100 µm. However, it is to be appreciated that embodiments of the present invention are not necessarily so limited, and that certain aspects of the embodiments may be applicable to larger, and possibly smaller size scales.

In one aspect, embodiments of the invention describe a manner for mass transfer of an array of pre-fabricated micro devices with an array of transfer heads. For example, the pre-fabricated micro devices may have a specific functionality such as, but not limited to, a LED for light-emission, silicon IC for logic and memory, and gallium arsenide (GaAs) circuits for radio frequency (RF) communications. In some embodiments, arrays of micro LED devices which are poised for pick up are described as having a 10 µm by 10 µm pitch, or 5 µm by 5 µm pitch. At these densities a 6 inch substrate, for example, can accommodate approximately 165 million micro LED devices with a 10 µm by 10 µm pitch, or approximately 660 million micro LED devices with a 5 µm by 5 µm pitch. A transfer tool including an array of transfer heads matching an integer multiple of the pitch of the corresponding array of micro LED devices can be used to pick up and transfer the array of micro LED devices to a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of micro device transfer heads can pick up and transfer more than 100,000 micro devices, with larger arrays of micro device transfer heads being capable of transferring more micro devices. Each transfer head in the array of transfer heads may also be independently controllable, which enables selective pick up and release of the micro devices.

In one aspect, without being limited to a particular theory, embodiments of the invention describe micro device transfer heads and head arrays which operate in accordance with principles of electrostatic grippers, using the attraction of opposite charges to pick up micro devices. In accordance with embodiments of the present invention, a pull-in voltage is applied to a micro device transfer head in order to generate a grip force on a micro device and pick up the micro device. Grip force is proportional to charged plate area so is calculated as a pressure. According to ideal electrostatic theory, a non-conductive dielectric layer between a monopolar electrode and a conductive substrate yields a grip pressure in Pascal (Pa) in equation (1) of:

$$P=[\varepsilon_o/2][V\varepsilon_r/d]^2 \quad (1)$$

where $\varepsilon_o=8.85 \cdot 10^{-12}$, V=electrode-substrate voltage in volts (V), $\varepsilon_r$=dielectric constant, and d=dielectric thickness in meters (m). With a bipolar gripper using two grip electrodes the voltage (V) in the above equation is half of the voltage between electrodes A and B, $[V_A-V_B]/2$. The substrate potential is centered at the average potential, $[V_A=V_B]/2$. This average is generally zero with $V_A=[-V_B]$.

In another aspect, embodiments of the invention describe a bonding layer which can maintain a micro device on a carrier substrate during certain processing and handling operations, and upon undergoing a phase change provides a medium on which the micro device can be retained yet is also readily releasable from during a pick up operation. For example, the bonding layer may be remeltable or reflowable such that the bonding layer undergoes a phase change from solid to liquid state prior to or during the pick up operation. In the liquid state the bonding layer may retain the micro device in place on a carrier substrate while also providing a medium from which the micro device is readily releasable. Without being limited to a particular theory, in determining the grip pressure which is necessary to pick up the micro device from the carrier substrate the grip pressure should exceed the forces holding the micro device to the carrier substrate, which may include but are not limited to, surface tension forces, capillary forces, viscous effects, elastic restoration forces, van-der-Waals forces, stiction and gravity.

In accordance with embodiments of the invention, when the dimensions of a micro device are reduced below a certain range, the surface tension forces of the liquid bonding layer holding the micro device to the carrier substrate may become dominant over other forces holding the micro device. FIG. 1 is a graphical illustration of one embodiment obtained by modeling analysis showing the pressure required to overcome the force of surface tension to pick up a micro device of various dimensions, assuming a liquid indium (In) bonding layer with a surface tension of 560 mN/m at the melting temperature of 156.7° C. For example, referring to FIG. 1 an exemplary 10 µm by 10 µm wide micro device is retained on a carrier substrate with a surface tension pressure of approximately 2.2 atmospheres (atm) with an indium bonding layer having a liquid surface tension of 560 mN/m at its melting temperature of 156.7° C. This is significantly larger than the pressure due to gravity, which is approximately $1.8 \times 10^{-6}$ atm for an exemplary 10 µm×10 µm wide×3 µm tall piece of gallium nitride (GaN).

Figure 2:
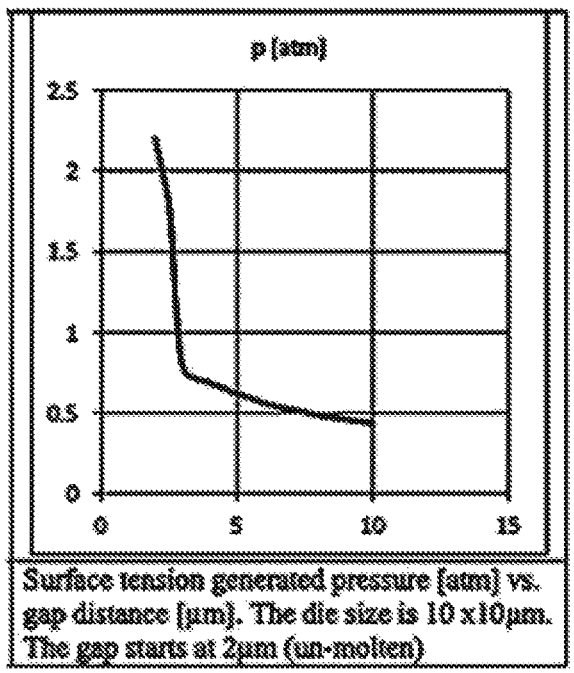
FIG. 2 is a graphical illustration of the relationship between surface tension and increasing gap distance created during a pick up operation in accordance with an embodiment of the invention.

Surface tension pressures and viscous effects may also be dynamic during the pick up operation. FIG. 2 is a graphical illustration of one embodiment obtained by modeling analysis showing the relationship of surface tension and increasing gap distance created during the pick up operation of an exemplary 10 µm by 10 µm wide micro device retained on a carrier substrate with a molten indium (In) bonding layer. The gap distance along the x-axis referred to in FIG. 2 is the distance between the bottom of the micro device and the carrier substrate, and starts at 2 µm corresponding to an un-molten thickness of the In bonding layer. As illustrated in FIG. 2, a surface tension pressure of 2.2 atm along the y-axis is initially overcome by the grip pressure at the beginning of the pick up operation. As the micro device is then lifted from the carrier substrate, the surface tension rapidly falls, with the pressure leveling out as the micro device is lifted further away from the carrier substrate.

Figure 3:
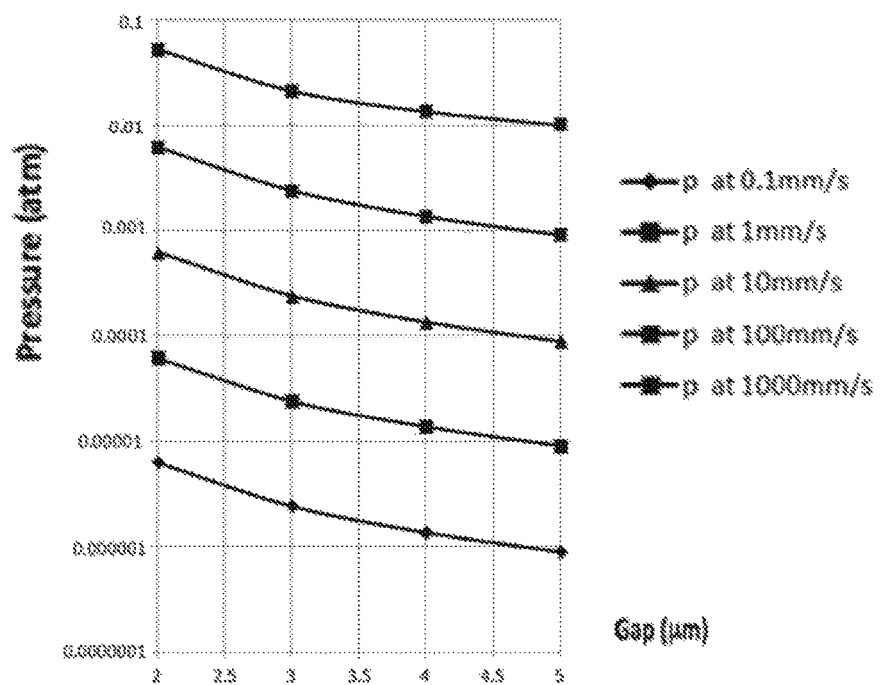
FIG. 3 is a graphical illustration of the relationship between viscous force pressures and increasing gap distance created during a pick up operation at various pull rates in accordance with an embodiment of the invention.

FIG. 3 is a graphical illustration of one embodiment obtained by modeling analysis showing the relationship of viscous force pressures (atm) and increasing gap distance (μm) created during a pick up operation at various pull rates for an exemplary 10 μm by 10 μm micro device retained on a carrier substrate with a molten indium (In) bonding layer. The gap distance referred to in FIG. 3 is the distance between the bottom of the micro device and the carrier substrate, and starts at 2 μm corresponding to an un-molten thickness of the In bonding layer. As illustrated, viscous force pressures are more apparent during faster lift speeds such as 1,000 mm/s than for slower lift speeds such as 0.1 mm/s. Yet, the pressures generated from the viscous effects using the exemplary lift speeds illustrated in FIG. 3 are significantly less than the surface tension pressure generated and illustrated in FIG. 2 which suggests that surface tension pressure is the dominant pressure which must be overcome by the grip pressure during the pick up operation.

If an air gap of size (g) is present between the dielectric layer of the micro device transfer head and a top conductive surface of the micro device then the grip pressure in equation (2) is:

$$P=[\varepsilon/2][V\varepsilon_r/(d+\varepsilon_r g)]^2 \quad (2)$$

It is contemplated that an air gap can be present due to a variety of sources including, but not limited to, particulate contamination, warpage, and misalignment of either surface of the transfer head or micro device, or the presence of an additional layer on the transfer head or micro device, such as a lip of a conformal dielectric barrier layer around the top conductive surface of a micro device. In a embodiment, a lip of a conformal dielectric barrier layer may create both an air gap where a contact opening is formed and increase the effective thickness of the dielectric layer of the transfer head where the lip is present.

As seen from equations (1) and (2) above, lower voltages may be utilized where no air gap is present between the micro device transfer head and micro device to be picked up. However, when an air gap is present this presents a series capacitance in which the air capacitance may compete with the dielectric layer capacitance. In order to compensate for the possibility of an air capacitance between any of an array of micro device transfer heads over a corresponding array of micro devices to be picked up, a higher operating voltage, higher dielectric constant for the dielectric material, or thinner dielectric material may be used to maximize the electric field. However, use of a higher electric field has limitations due to possible dielectric breakdown and arcing.

Figure 4:
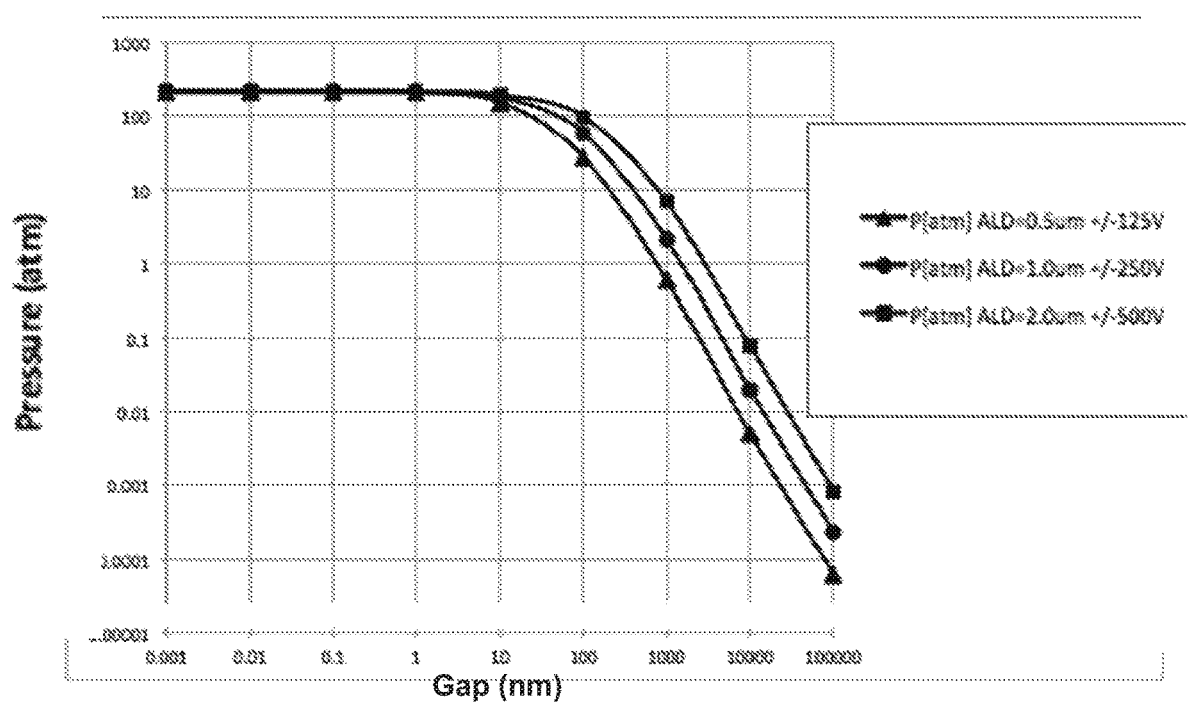
FIG. 4 is a graphical illustration obtained by modeling analysis showing the grip pressure exerted by a transfer head on a micro device as the transfer head is withdrawn from the micro device in accordance with an embodiment of the invention.

FIG. 4 is a graphical illustration of one embodiment obtained by modeling analysis showing the grip pressure exerted by a transfer head on a micro device as the transfer head is withdrawn from the top conductive surface of the micro device, corresponding to an increasing air gap size. The different lines correspond to different $Ta_2O_5$ dielectric layer thicknesses between 0.5 μm and 2.0 μm on the transfer head, with the electric field being kept constant. As illustrated, no appreciable effect on grip pressure is observed at these conditions below air gap sizes of approximately 1 nm (0.001 μm), and even as high as 10 nm (0.01 μm) for some conditions. However, it is to be appreciated that the tolerable air gap can be increased or decreased by changing the conditions. Thus, in accordance with some embodiments of the invention a certain amount of air gap tolerance is possible during the pick up operation and actual contact with the micro device transfer head and the top conductive surface of the micro device may not be necessary.

Now assuming that the grip pressure required to pick up the micro device from the carrier substrate should exceed the sum of pressures retaining the micro device on the carrier substrate (as well as any pressure reduction due to air gap) it is possible to derive the interrelationship of operating voltage, dielectric constant and dielectric thickness of the dielectric material in the micro device transfer head by solving the grip pressure equations. For purposes of clarity, assuming that the air gap distance is zero, for a monopolar electrode this becomes:

$$\mathrm{sqrt}(P*2/\varepsilon_o)=V\varepsilon_r/d \quad (3)$$

Exemplary ranges of calculated dielectric thickness values are provided in Table 1 for desired grip pressures of 2 atm (202650 Pa) and 20 atm (2026500 Pa) for $Al_2O_3$ and $Ta_2O_5$ dielectric materials between operating voltages between 25 V and 300 V in order to illustrate the interdependence of grip pressure, voltage, dielectric constant and dielectric thickness in accordance with an embodiment of the invention. The dielectric constants provided are approximate, and it is understood that the values can vary depending upon manner of formation.

TABLE 1

| Dielectric Material | Voltage (V) | Dielectric constant, $\varepsilon_r$ (Hz-MHz range) | Dielectric thickness, d (microns) |
|---|---|---|---|
| Grip pressure = 2 atm | | | |
| $Al_2O_3$ | 25 | 9.8 | 1.1 |
| $Al_2O_3$ | 100 | 9.8 | 4.6 |
| $Al_2O_3$ | 300 | 9.8 | 13.7 |
| $Ta_2O_5$ | 25 | 25 | 2.9 |
| $Ta_2O_5$ | 100 | 25 | 11.7 |
| $Ta_2O_5$ | 300 | 25 | 35.0 |
| Grip pressure = 20 atm | | | |
| $Al_2O_3$ | 25 | 9.8 | 0.4 |
| $Al_2O_3$ | 100 | 9.8 | 1.4 |
| $Al_2O_3$ | 300 | 9.8 | 4.3 |
| $Ta_2O_5$ | 25 | 25 | 0.9 |
| $Ta_2O_5$ | 100 | 25 | 3.7 |
| $Ta_2O_5$ | 300 | 25 | 11.1 |

Since the grip pressure is proportional to the inverse square of the dielectric thickness, the calculated dielectric thicknesses in Table 1 represents the maximum thicknesses which can be formed to achieve the necessary grip pressure with the set operating voltage. Thicknesses lower than those provided in Table 1 may result in higher grip pressures at the set operating voltage, however lower thicknesses increase the applied electric field across the dielectric layer which requires that the dielectric material possess a dielectric strength sufficient to withstand the applied electric field without shorting. It is to be appreciated that the grip pressure, voltage, dielectric constant and dielectric thickness values provided in Table 1 are exemplary in nature, and provided in order to provide a foundation for working ranges of the micro device transfer head in accordance with embodiments of the invention. The relationship between grip pressure, voltage, dielectric constant and dielectric thickness values provided in Table 1 has been illustrated in accordance with ideal electrostatic theory, and embodiments of the invention are not limited by such.

Figure 5:
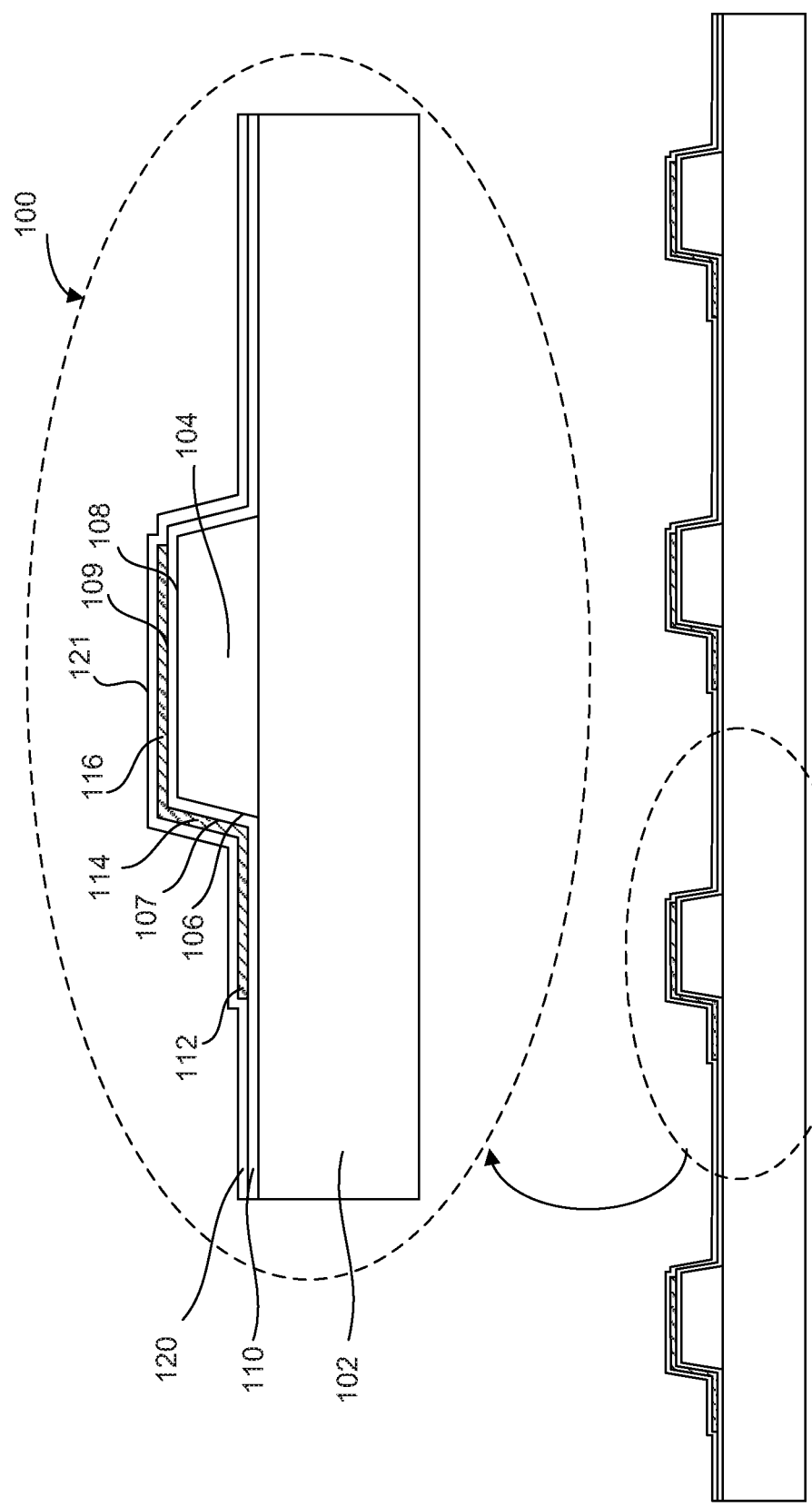
FIG. 5 is a cross-sectional side view illustration of a monopolar micro device transfer head in accordance with an embodiment of the invention.

Referring now to FIG. 5, a side view illustration is provided of a monopolar micro device transfer head and head array in accordance with an embodiment of the invention. As shown, each monopolar device transfer head 100 may include a base substrate 102, a mesa structure 104 including a top surface 108 and sidewalls 106, an optional passivation layer 110 formed over the mesa structure 104 and including a top surface 109 and sidewalls 107, an electrode 116 formed over the mesa structure 104 (and optional passivation layer 110) and a dielectric layer 120 with a top surface 121 covering the electrode 116. Base substrate 102 may be formed from a variety of materials such as silicon, ceramics and polymers which are capable of providing structural support. In an embodiment, base substrate has a conductivity between $10^3$ and $10^{18}$ ohm-cm. Base substrate 102 may additionally include wiring (not shown) to connect the micro device transfer heads 100 to the working electronics of an electrostatic gripper assembly.

Mesa structure 104 may be formed using suitable processing techniques, and may be formed from the same or different material than base substrate 102. In one embodiment, mesa structure 104 is integrally formed with base substrate 102, for example by using lithographic patterning and etching, or casting techniques. In an embodiment, anisotropic etching techniques can be utilized to form tapered sidewalls 106 for mesa structure 104. In another embodiment, mesa structure 104 may be deposited or grown, and patterned on top of the base substrate 102. In an embodiment, mesa structure 104 is a patterned oxide layer, such as silicon dioxide, formed over a semiconductor substrate, such as silicon.

In one aspect, the mesa structures 104 generate a profile which protrudes away from the base substrate so as to provide a localized contact point to pick up a specific micro device during a pick up operation. In an embodiment, mesa structures 104 have a height of approximately 1 µm to 5 µm, or more specifically approximately 2 µm. Specific dimensions of the mesa structures 104 may depend upon the specific dimensions of the micro devices to be picked up, as well as the thickness of any layers formed over the mesa structures. In an embodiment, the height, width, and planarity of the array of mesa structures 104 on the base substrate 102 are uniform across the base substrate so that each micro device transfer head 100 is capable of making contact with each corresponding micro device during the pick up operation. In an embodiment, the width across the top surface 121 of each micro device transfer head is slightly larger, approximately the same, or less than the width of the top surface of the each micro device in the corresponding micro device array so that a transfer head does not inadvertently make contact with a micro device adjacent to the intended corresponding micro device during the pick up operation. As described in further detail below, since additional layers 110, 112, 120 may be formed over the mesa structure 104, the width of the mesa structure may account for the thickness of the overlying layers so that the width across the top surface 121 of each micro device transfer head is slightly larger, approximately the same, or less than the width of the top surface of the each micro device in the corresponding micro device array.

Still referring to FIG. 5, mesa structure 104 has a top surface 108, which may be planar, and sidewalls 106. In an embodiment, sidewalls 106 may be tapered up to 10 degrees, for example. Tapering the sidewalls 106 may be beneficial in forming the electrodes 116 and electrode leads 114 as described further below. A passivation layer 110 may then be optionally deposited or grown over the base substrate 102 and array of mesa structures 104. Passivation layer 110 can be deposited by a variety of suitable techniques such as chemical vapor deposition (CVD), sputtering, or atomic layer deposition (ALD). In an embodiment, passivation layer 110 may be 0.5 µm-2.0 µm thick oxide such as, but not limited to, silicon oxide ($SiO_2$), aluminum oxide ($Al_2O_3$) or tantalum oxide ($Ta_2O_5$).

A conductive layer 112 may then be deposited over the array of mesa structures 104 and optional passivation layer 110, and patterned to form electrodes 116 and electrode leads 114. For example, a lift off technique can be utilized to form the electrodes 116 and electrode leads 114 in which a resist layer is deposited and patterned over the substrate, followed by deposition of a metal layer, and lift off of the resist and portion of the metal layer on the resist leaving behind the desired pattern. Alternatively, metal layer deposition followed by patterning and etching can be performed to achieve the desired pattern. Electrode leads 114 may run from the electrode 116 over the top surface 108 of a mesa structure 104 (and top surface 109 of optional passivation layer 110) and along a sidewall 106 of the mesa structure 104 (and along a sidewall 107 of optional passivation layer 110). Conductive layer 112 used to form the electrodes 116 and electrode leads 114 may be a single layer or multiple layers. A variety of conductive materials including metals, metal alloys, refractory metals, and refractory metal alloys may be employed to form conductive layer 112. In an embodiment, the conductive layer 112 has a thickness up to 5,000 angstroms (0.5 µm). In an embodiment, the conductive layer 112 includes a high melting temperature metal such as platinum or a refractory metal or refractory metal alloy. For example, conductive layer may include platinum, titanium, vanadium, chromium, zirconium, niobium, molybdenum, ruthenium, rhodium, hafnium, tantalum, tungsten, rhenium, osmium, iridium and alloys thereof. Refractory metals and refractory metal alloys generally exhibit higher resistance to heat and wear than other metals. In an embodiment, conductive layer 112 is an approximately 500 angstrom (0.05 µm) thick titanium tungsten (TiW) refractory metal alloy.

A dielectric layer 120 is then deposited over the electrodes 116 and other exposed layers on the base substrate 102. In an embodiment, the dielectric layer 120 has a suitable thickness and dielectric constant for achieving the required grip pressure of the micro device transfer head 100, and sufficient dielectric strength to not break down at the operating voltage. The dielectric layer may be a single layer or multiple layers. In an embodiment, the dielectric layer is 0.5 µm-2.0 µm thick, though thickness may be more or less depending upon the specific topography of the transfer head 100 and underlying mesa structure 104. Suitable dielectric materials may include, but are not limited to, aluminum oxide ($Al_2O_3$) and tantalum oxide ($Ta_2O_5$). Referring back to Table 1 above, embodiments of $Al_2O_3$ dielectric layers with applied electric fields (determined by dividing the voltage by dielectric thickness) of 22 V/µm to 71 V/µm and $Ta_2O_5$ dielectric layers with applied electric fields of 9 V/µm to 28 V/µm were provided. In accordance with embodiments of the invention, the dielectric layer 120 possesses a dielectric strength greater than the applied electric field so as to avoid shorting of the transfer head during operation. Dielectric layer 120 can be deposited by a variety of suitable techniques such as chemical vapor deposition (CVD), atomic layer deposition (ALD) and physical vapor deposition (PVD) such as sputtering. Dielectric layer 120 may additionally be annealed following deposition. In one embodiment, the dielectric layer 120 possesses a dielectric strength of at least 400 V/µm. Such a high dielectric strength can allow for the use of a thinner dielectric layer than the calculated thicknesses provided in exemplary Table 1. Techniques such as ALD can be utilized to deposit uniform, conformal, dense, and/or pin-hole free dielectric layers with good dielectric strength. Multiple layers can also be utilized to achieve such a pin-hole free dielectric layer 120. Multiple layers of different dielectric materials may also be utilized to form dielectric layer 120. In an embodiment, the underlying conductive layer 112 includes platinum or a refractory metal or refractory metal alloy possessing a melting temperature above the deposition temperature of the dielectric layer material(s) so as to not be a limiting factor in selecting the deposition temperature of the dielectric layer. In an embodiment, following the deposition of dielectric layer 120 a thin coating (not illustrated) may be formed over the dielectric layer 120 to provide a specific stiction coefficient to add lateral friction and keep the micro devices from being knocked off the transfer head during the pick up operation. In such an embodiment, the additional thin coating replaces top surface 121 as the contacting surface, and this surface retains the dimensional array requirements described herein. Furthermore, the additional coating can affect the dielectric properties of the micro device transfer head which may affect the operability of the micro device transfer head. In an embodiment, the additional coating thickness can be minimal (e.g. below 10 nm) so as to have little to no appreciable effect on the grip pressure.

Figure 6:
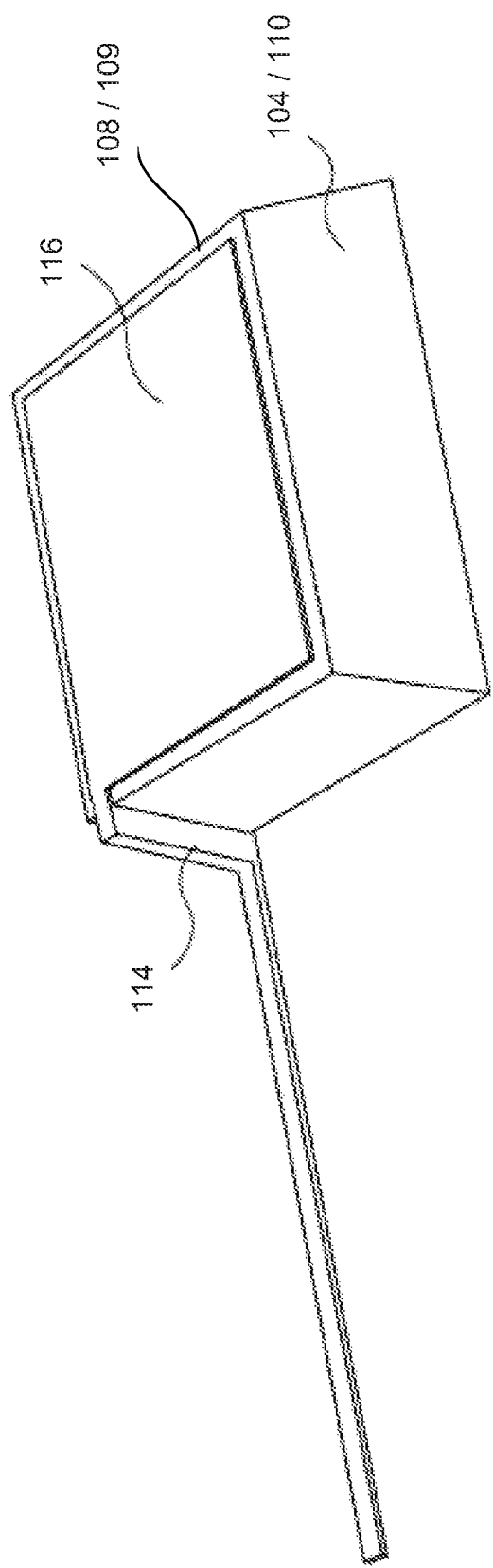
FIG. 6 is an isometric view illustration of a monopolar micro device transfer head in accordance with an embodiment of the invention.

FIG. 6 is a close-up isometric view of electrode 116 and electrode lead 114 formed over an optional passivation layer 110 covering a mesa structure 104. For purposes of clarity, the overlying dielectric layer 120 is not illustrated, and the optional passivation layer 110 and mesa structure 104 are illustrated as a single mesa structure/passivation layer 104/110. In an exemplary embodiment, where the passivation layer 110 and dielectric layer 120 are both 0.5 µm thick, the top surface 108/109 of the mesa structure/passivation layer 104/110 onto which the electrode 116 is formed is approximately 7 µm×7 µm in order to achieve a 8 µm×8 µm top surface of the transfer head 100. In accordance with an embodiment, the electrode 116 covers the maximum amount of surface area of the top surface 108/109 of the mesa structure/passivation layer 104/110 as possible while remaining within patterning tolerances. Minimizing the amount of free space increases the capacitance, and resultant grip pressure which can be achieved by the micro device transfer head. While a certain amount of free space is illustrated on the top surface 108/109 of the mesa structure/passivation layer 104/110 in FIG. 6, the electrode 116 may cover the entire top surface 108/109. The electrode 116 may also be slightly larger than the top surface 108/109, and partially extend down the sidewalls 106/107 of the mesa structure/passivation layer 104/110 to ensure complete coverage of the top surface 108/109. It is to be appreciated that the mesa array may have a variety of different pitches, and that embodiments of the invention are not limited to the exemplary 7 µm×7 µm top surface of the mesa structure/passivation layer 104/110 in a 10 µm pitch.

Figure 7:
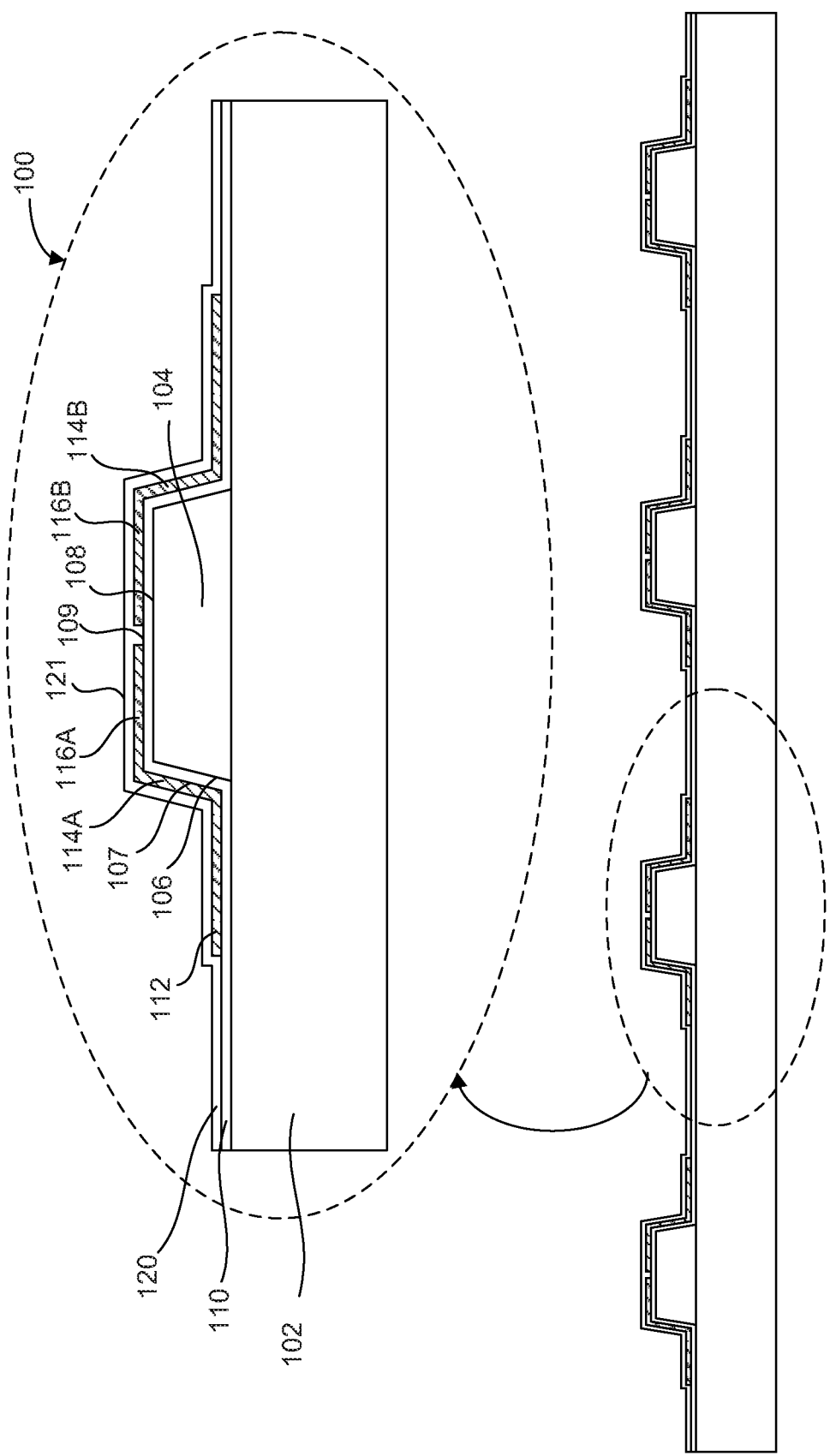
FIG. 7 is a cross-sectional side view illustration of a bipolar micro device transfer head in accordance with an embodiment of the invention.

Referring now to FIG. 7, a side view illustration is provided of a bipolar micro device transfer head 100 and head array in accordance with an embodiment of the invention. As shown, the bipolar device transfer head 100 may include a base substrate 102, a mesa structure 104 including a top surface 108 and sidewalls 106, passivation layer 110 including a top surface 109 and sidewalls 107, a pair of electrodes 116A, 116B and electrode leads 114A, 114B formed over the mesa structure 104, optional passivation layer 110 and a dielectric layer 120 covering the pair of electrodes 116A, 116B.

Figure 8:
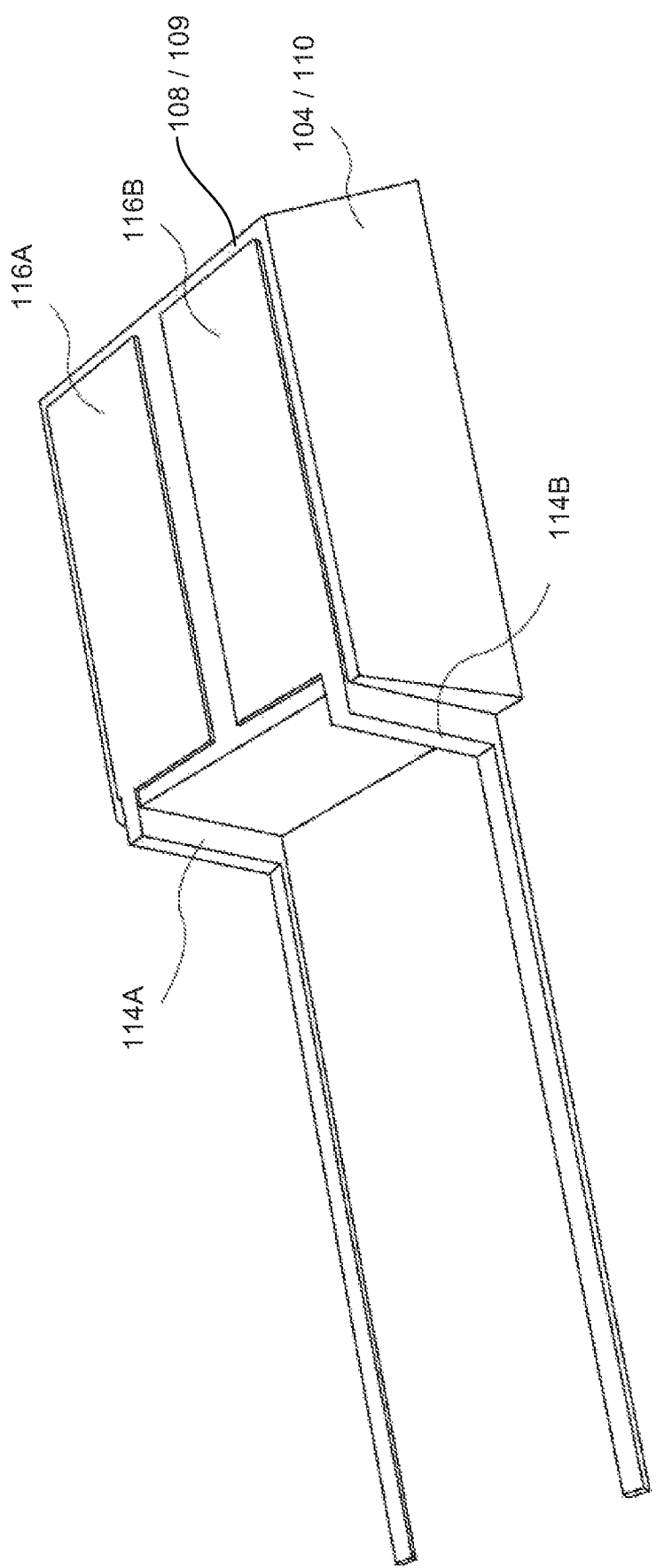
FIG. 8 is an isometric view illustration of a bipolar micro device transfer head in accordance with an embodiment of the invention.

FIG. 8 is a close-up isometric view of electrodes 116A, 116B and electrode leads 114A, 114B formed over an optional passivation layer 110 covering a mesa structure 104. For purposes of clarity, the overlying dielectric layer 120 is not illustrated, and the optional passivation layer 110 and mesa structure 104 are illustrated as a single mesa structure/passivation layer 104/110. FIG. 8 differs slightly from FIG. 7 in that the electrode leads 114A, 114B are illustrated as running along a single sidewall rather than on opposite sidewalls of the mesa structure/passivation layer 104/110. Electrode leads 114A, 114B may run along any suitable sidewall in accordance with embodiments of the invention. In an exemplary embodiment, where the top surface 108/109 of the mesa structure/passivation layer 104/110 is approximately 7 µm×7 µm corresponding to a mesa array with a 10 µm pitch the electrodes may cover the maximum amount of the surface area of the top surface 108/109 of the mesa structure/passivation layer 104/110 as possible while still providing separation between electrodes 116A, 116B. The minimum amount of separation distance may be balanced by considerations for maximizing surface area, while avoiding overlapping electric fields from the electrodes. For example, the electrodes 116A, 116B may be separated by 0.5 µm or less, and the minimum separation distance may be limited by the height of the electrodes. In an embodiment, the electrodes are slightly longer than the top surface 108/109 in one direction, and partially extend down the sidewalls of the mesa structure/passivation layer 104/110 to ensure maximum coverage of the top surface 108/109. It is to be appreciated that the mesa array may have a variety of different pitches, and that embodiments of the invention are not limited to the exemplary 7 µm×7 µm top surface of the mesa structure/passivation layer 104/110 in a 10 µm pitch.

Figure 9:
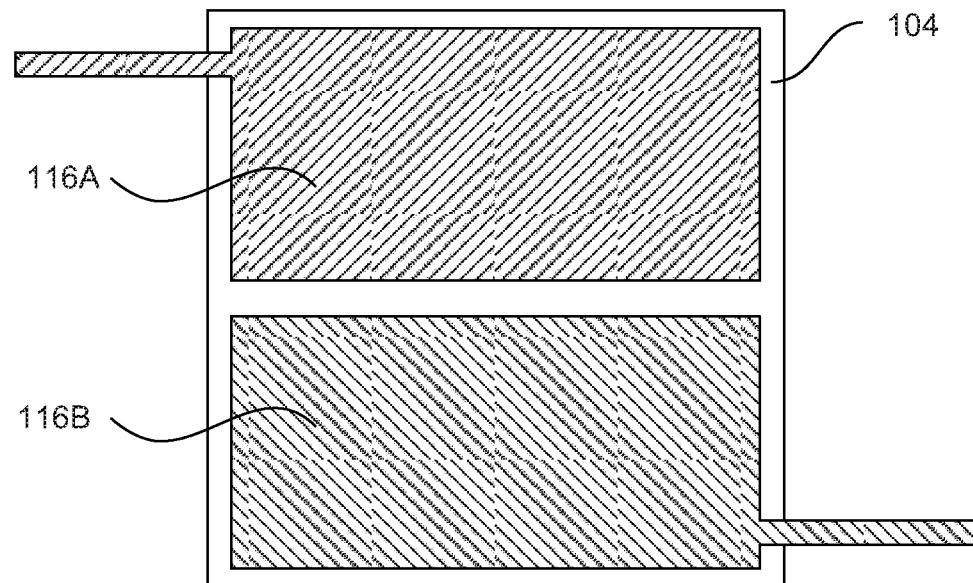
FIGS. 9-10 are top view illustrations of bipolar micro device transfer heads in accordance with an embodiment of the invention.
Figure 10:
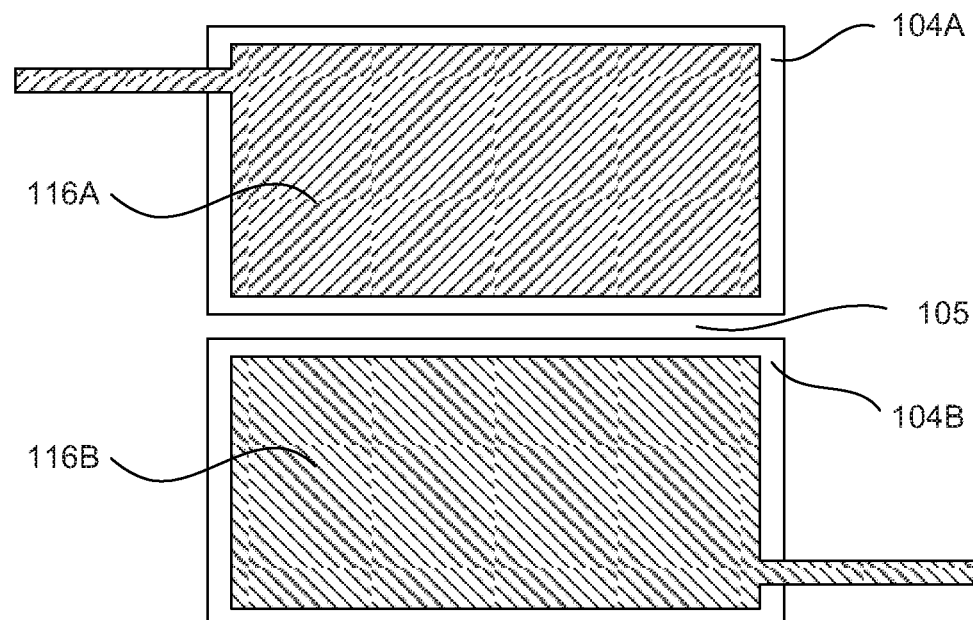

Referring now to FIGS. 9-10, top view illustrations of electrodes 116A, 116B of a bipolar micro device transfer head are provided in accordance with embodiments of the invention. Thus far, mesa structure 104 has been described as a single mesa structure as shown in FIG. 9. However, embodiments of the invention are not so limited. In the embodiment illustrated in FIG. 10, each electrode 116 is formed on a separate mesa structure 104A, 104B separated by a trench 105. An optional passivation layer 110 (not illustrated) can cover both mesa structures 104A, 104B.

Figure 11:
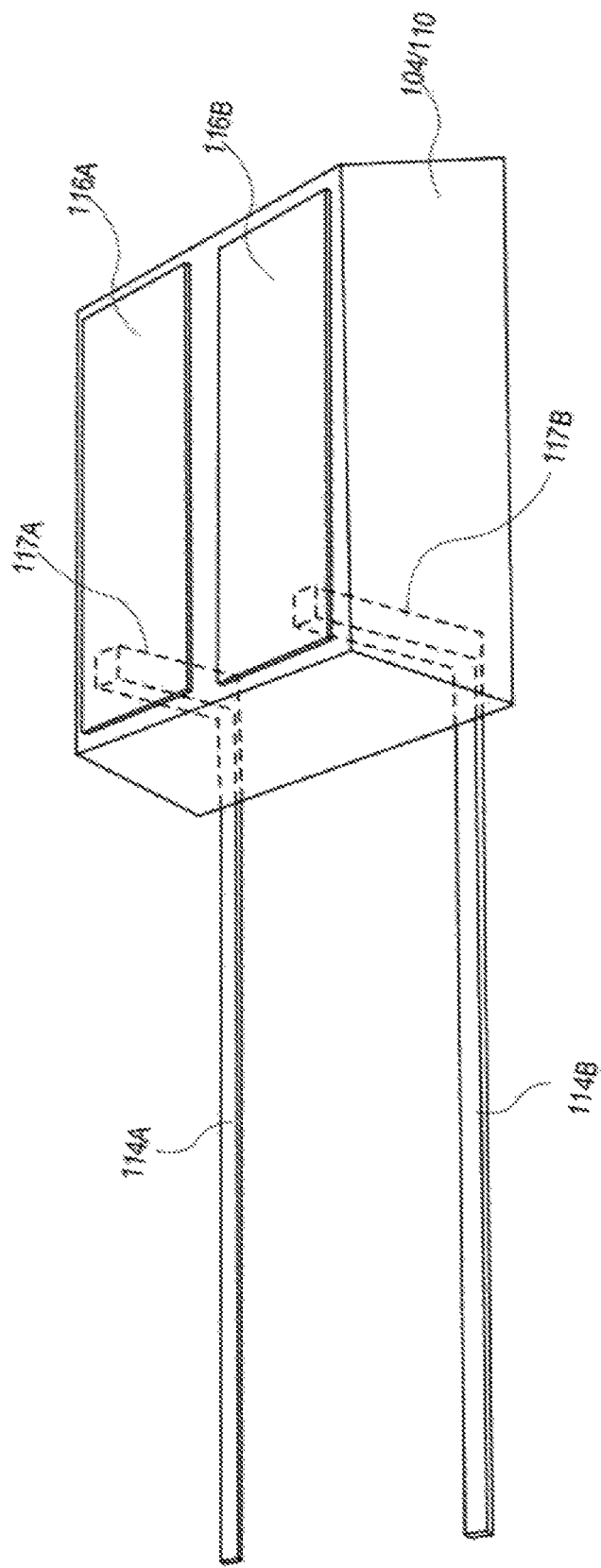
FIG. 11 is an isometric view illustration of a bipolar micro device transfer head including conductive vias in accordance with an embodiment of the invention.

Referring now to FIG. 11, an isometric view illustration of an alternative electrode lead configuration is provided in accordance with an embodiment of the invention. In such an embodiment the electrode leads 114A, 114B run underneath a portion of the mesa structure 104, and conductive vias 117A, 117B run through the mesa structure 104 (and optional passivation layer 110 not illustrated) connecting the electrodes 116A, 116B to the respective electrode leads 114A, 114B. In such an embodiment, electrode leads 114A, 114B may be formed prior to formation of mesa structure 104, and may be formed of the same or different conductive material as electrode leads 114A, 114B and electrodes 116A, 116B. While vias 117A, 117B are illustrated with regard to a bipolar electrode structure in FIG. 11 it is to be appreciated that the above described via or vias may also be integrated into monopolar electrode structures.

Figure 12:
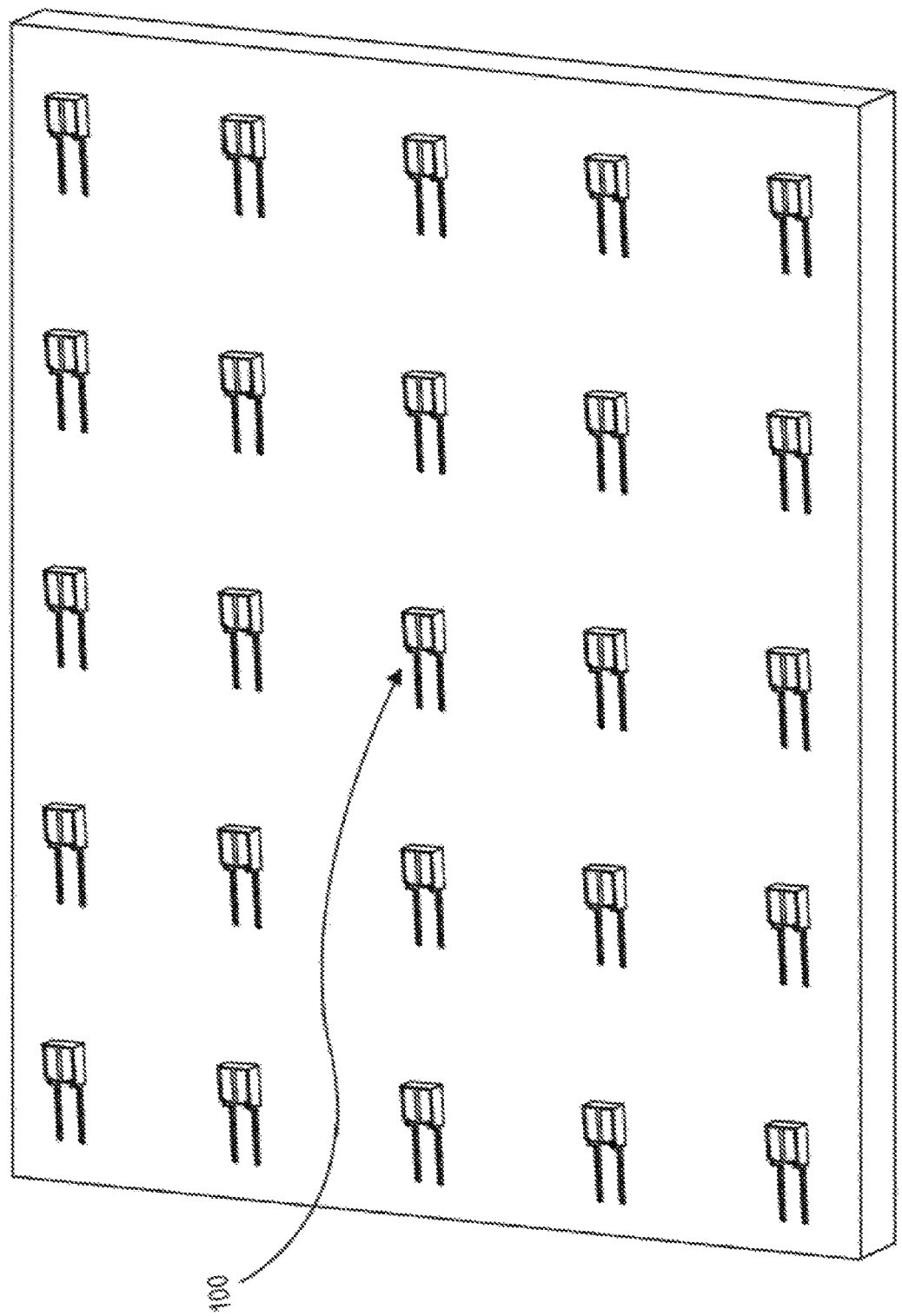
FIG. 12 is an isometric view illustration of a bipolar micro device transfer head array in accordance with an embodiment of the invention.
Figure 13:
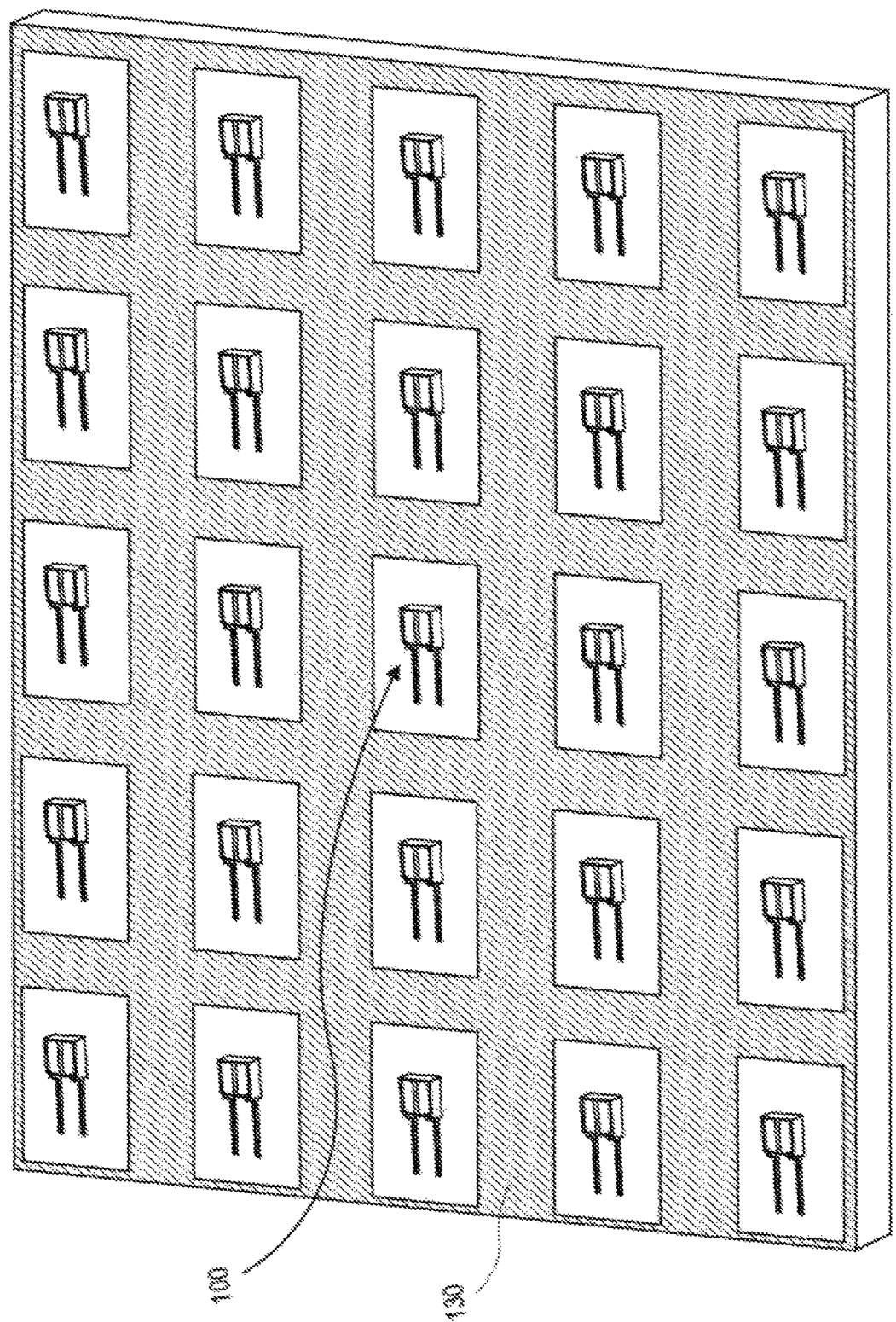
FIG. 13 is an isometric view illustration of a bipolar micro device transfer head array including a conductive ground plane in accordance with an embodiment of the invention.
Figure 14:
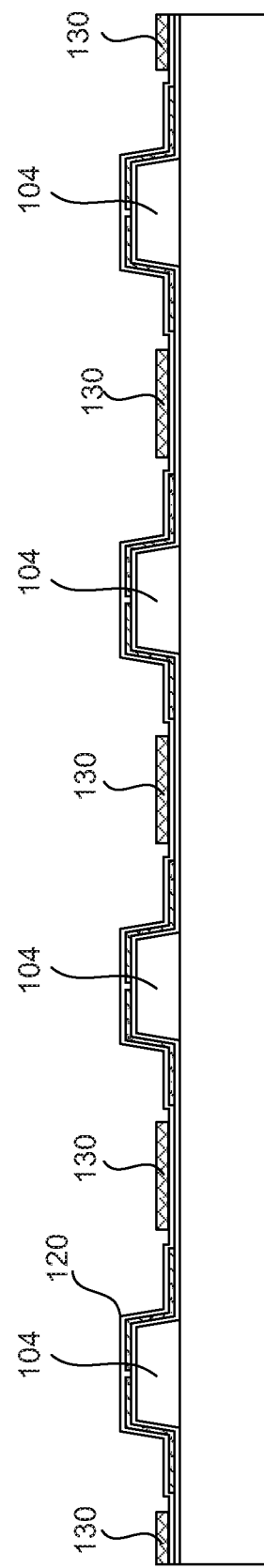
FIG. 14 is a cross-sectional side view illustration of a bipolar micro device transfer head array including a conductive ground plane in accordance with an embodiment of the invention.

Referring now to FIGS. 12-14, an embodiment of the invention is illustrated in which a conductive ground plane is formed over the dielectric layer and surrounding the array of mesa structures. FIG. 12 is an isometric view illustration of an array of micro device transfer heads 100 with a bipolar electrode configuration as previously described with regard to FIG. 8. For purposes of clarity, the optional underlying passivation layer and overlying dielectric layer have not been illustrated. Referring now to FIGS. 13-14, a conductive ground plane 130 is formed over the dielectric layer 120 and surrounding the array of mesa structures 104. The presence of ground plane 130 may assist in the prevention of arcing between transfer heads 100, particularly during the application of high voltages. Ground plane 130 may be formed of a conductive material which may be the same as, or different as the conductive material used to form the electrodes, or vias. Ground plane 130 may also be formed of a conductive material having a lower melting temperature than the conductive material used to form the electrodes since it is not necessary to deposit a dielectric layer of comparable quality (e.g. dielectric strength) to dielectric layer 120 after the formation of ground plane 130.

Figure 15:
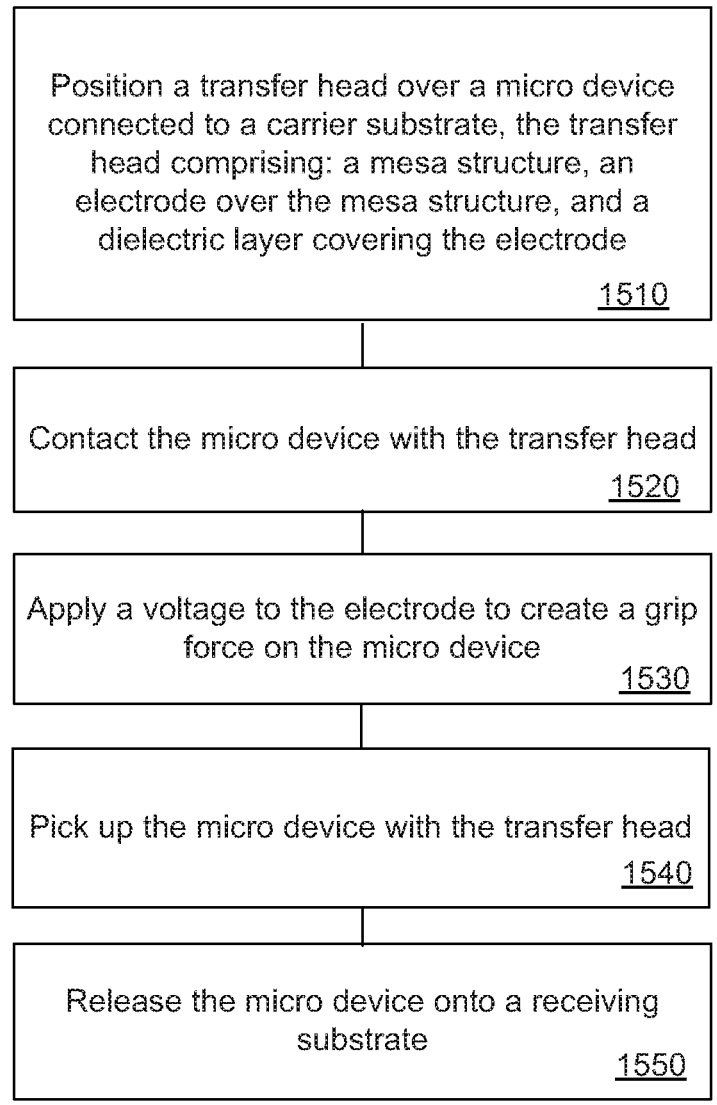
FIG. 15 is a flow chart illustrating a method of picking up and transferring a micro device from a carrier substrate to a receiving substrate in accordance with an embodiment of the invention.

FIG. 15 is a flow chart illustrating a method of picking up and transferring a micro device from a carrier substrate to a receiving substrate in accordance with an embodiment of the invention. At operation 1510 a transfer head is positioned over a micro device connected to a carrier substrate. The transfer head may comprise a mesa structure, an electrode over the mesa structure, and a dielectric layer covering the electrode as described in the above embodiments. Thus, the transfer head may have a monopolor or bipolar electrode configuration, as well as any other structural variations as described in the above embodiments. The micro device is then contacted with the transfer head at operation 1520. In an embodiment, the micro device is contacted with the dielectric layer 120 of the transfer head. In an alternative embodiment, the transfer head is positioned over the micro device with a suitable air gap separating them which does not significantly affect the grip pressure, for example, 1 nm (0.001 µm) or 10 nm (0.01 µm). At operation 1530 a voltage is applied to the electrode to create a grip pressure on the micro device, and the micro device is picked up with the transfer head at operation 1540. The micro device is then released onto a receiving substrate at operation 1550.

While operations 1510-1550 have been illustrated sequentially in FIG. 15, it is to be appreciated that embodiments are not so limited and that additional operations may be performed and certain operations may be performed in a different sequence. For example, in one embodiment, after contacting the micro device with the transfer head, the transfer head is rubbed across a top surface of the micro device in order to dislodge any particles which may be present on the contacting surface of either of the transfer head or micro device. In another embodiment, an operation is performed to create a phase change in the bonding layer connecting the micro device to the carrier substrate prior to or while picking up the micro device. If a portion of the bonding layer is picked up with the micro device, additional operations can be performed to control the phase of the portion of the bonding layer during subsequent processing.

Operation 1530 of applying the voltage to the electrode to create a grip pressure on the micro device can be performed in various orders. For example, the voltage can be applied prior to contacting the micro device with the transfer head, while contacting the micro device with the transfer head, or after contacting the micro device with the transfer head. The voltage may also be applied prior to, while, or after creating the phase change in the bonding layer.

Figure 16:
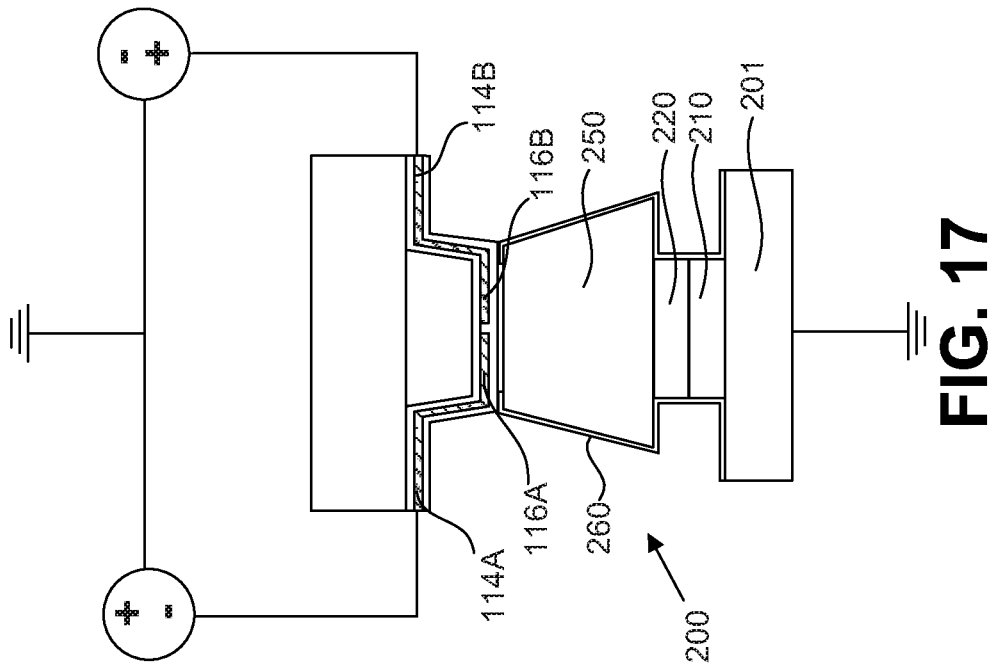
FIG. 16 is a schematic illustration of an alternating voltage applied across a bipolar electrode in accordance with an embodiment of the invention.
Figure 17:
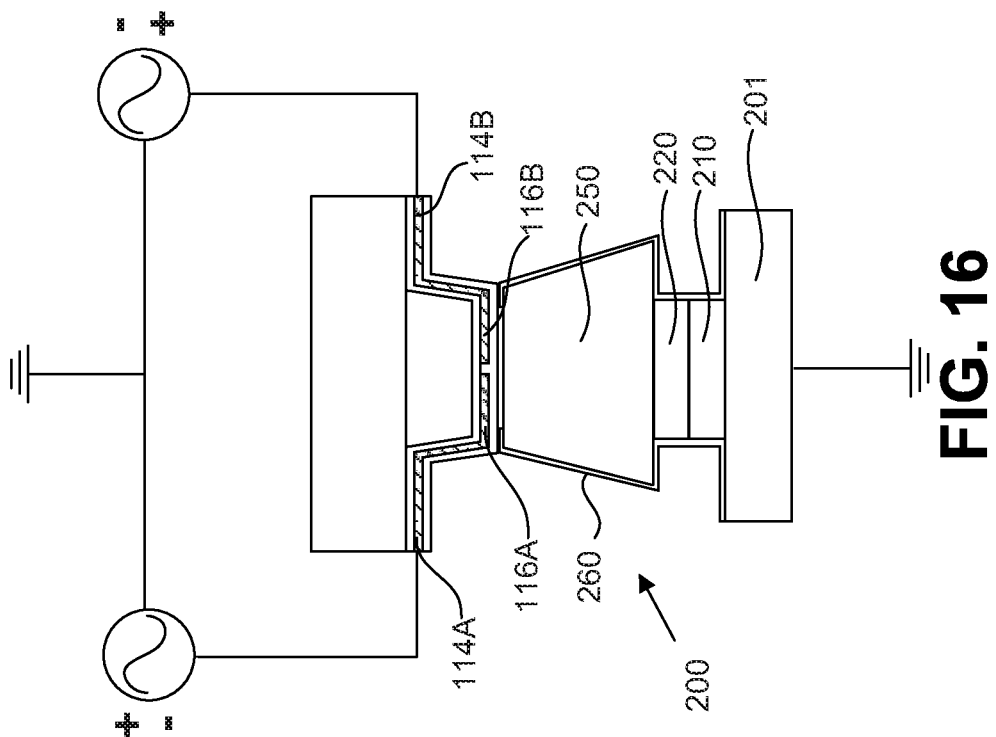
FIG. 17 is a schematic illustration of a constant voltage applied across a bipolar electrode in accordance with an embodiment of the invention.
Figure 18:
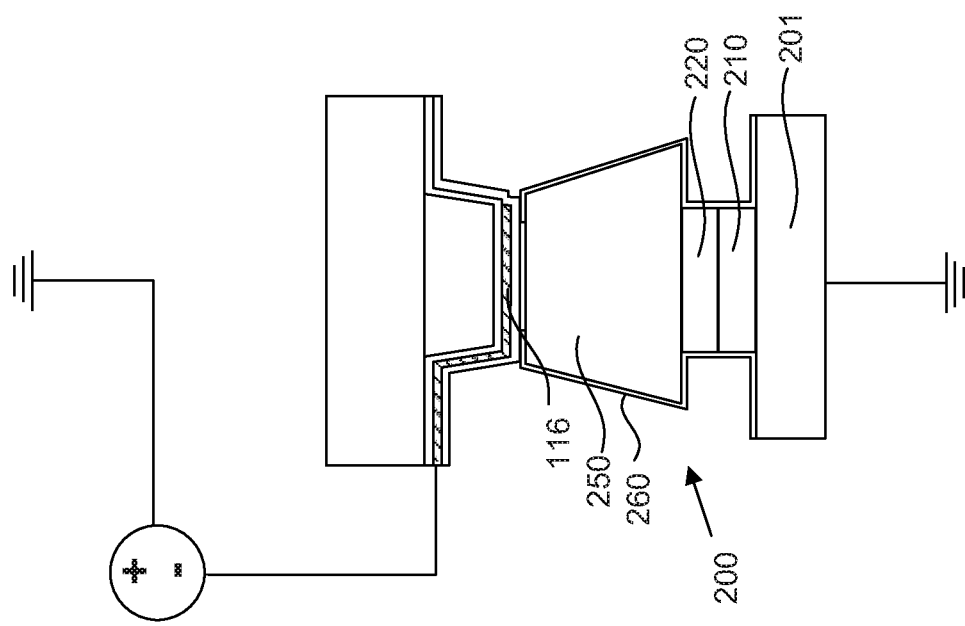
FIG. 18 is a schematic illustration of a constant voltage applied to a monopolar electrode in accordance with an embodiment of the invention.

FIG. 16 is a schematic illustration of an alternating voltage applied across a bipolar electrode with the transfer head in contact with a micro device in accordance with an embodiment of the invention. As illustrated, a separate alternating current (AC) voltage source may be applied to each electrode lead 114A, 114B with an alternating voltage applied across the pair of electrodes 116A, 116B so that at a particular point in time when a negative voltage is applied to electrode 116A, a positive voltage is applied to electrode 116B, and vice versa. Releasing the micro device from the transfer head may be accomplished with a variety of methods including turning off the voltage sources, lowering the voltage across the pair of electrodes, changing a waveform of the AC voltage, and grounding the voltage source. FIG. 17 is a schematic illustration of a constant voltage applied to a bipolar electrode in accordance with an embodiment of the invention. In the particular embodiment illustrated, a negative voltage is applied to electrode 116A while a positive voltage is applied to electrode 116B. FIG. 18 is a schematic illustration of a constant voltage applied to a monopolar electrode in accordance with an embodiment of the invention. Once the transfer head picks up the micro device illustrated in FIG. 18, the amount of time the transfer head can hold the micro device may be a function of the discharge rate of the dielectric layer since only single voltage is applied to electrode 116. Releasing the micro device from the transfer head illustrated in FIG. 14 may be accomplished by turning off the voltage source, grounding the voltage source, or reversing the polarity of the constant voltage.

Figure 19:
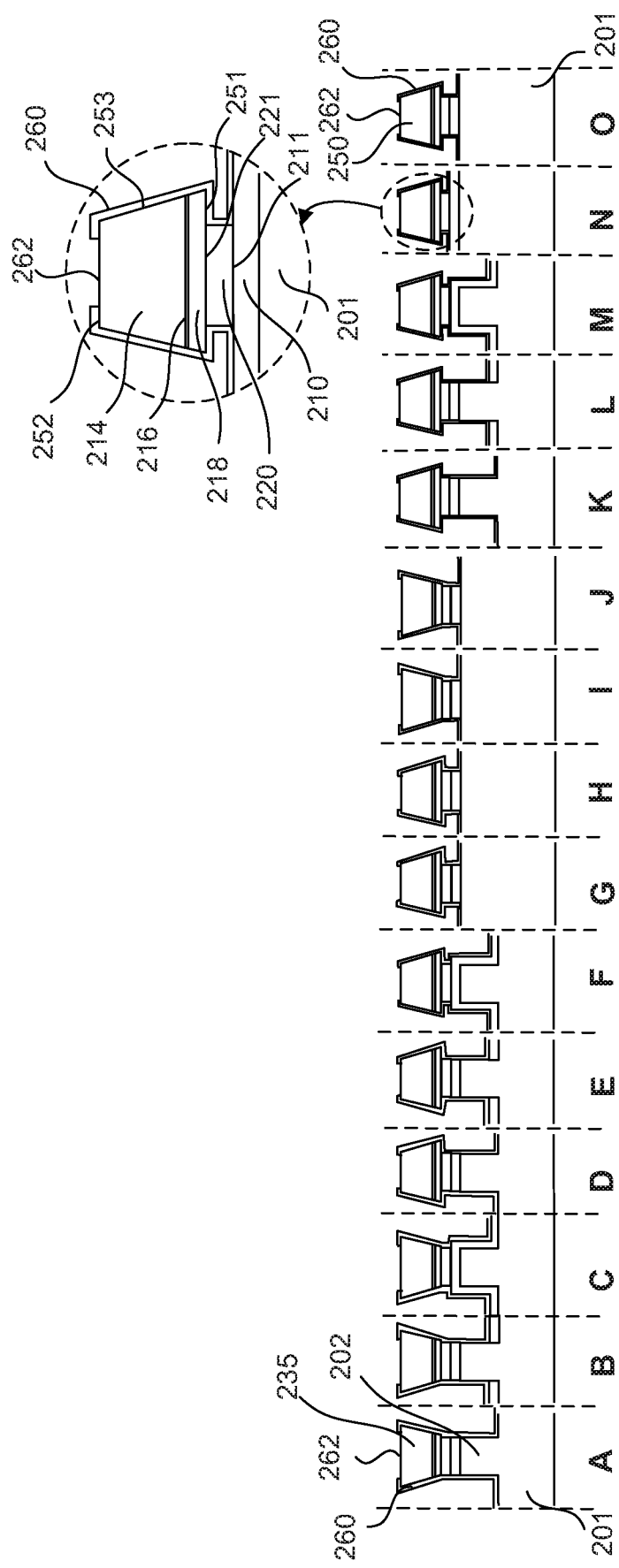
FIG. 19 is a cross-sectional side view illustration of a variety of micro LED structures including contact openings with a smaller width than the top surface of the micro p-n diode.

In the particular embodiments illustrated in FIGS. 16-18, the micro devices 200 are those illustrated in FIG. 19, Example 19O. Though the micro devices illustrated in FIGS. 16-18 may be from any of the micro LED device structures illustrated in FIGS. 19-21, and those described in related U.S. Provisional Application No. 61/561,706 and U.S. Provisional Application No. 61/594,919. For example, a micro LED device 200 may include a micro p-n diode 235, 250 and a metallization layer 220, with the metallization layer between the micro p-n diode 235, 250 and a bonding layer 210 formed on a substrate 201. In an embodiment, the micro p-n diode 250 includes a top n-doped layer 214, one or more quantum well layers 216, and a lower p-doped layer 218. The micro p-n diodes can be fabricated with straight sidewalls or tapered sidewalls. In certain embodiments, the micro p-n diodes 250 possess outwardly tapered sidewalls 253 (from top to bottom). In certain embodiments, the micro p-n diodes 235 possess inwardly tapered sidewalls 253 (from top to bottom). The metallization layer 220 may include one or more layers. For example, the metallization layer 220 may include an electrode layer and a barrier layer between the electrode layer and the bonding layer. The micro p-n diode and metallization layer may each have a top surface, a bottom surface and sidewalls. In an embodiment, the bottom surface 251 of the micro p-n diode 250 is wider than the top surface 252 of the micro p-n diode, and the sidewalls 253 are tapered outwardly from top to bottom. The top surface of the micro p-n diode 235 may be wider than the bottom surface of the p-n diode, or approximately the same width. In an embodiment, the bottom surface 251 of the micro p-n diode 250 is wider than the top surface 221 of the metallization layer 220. The bottom surface of the micro p-n diode may also be wider than the top surface of the metallization layer, or approximately the same width as the top surface of the metallization layer.

A conformal dielectric barrier layer 260 may optionally be formed over the micro p-n diode 235, 250 and other exposed surfaces. The conformal dielectric barrier layer 260 may be thinner than the micro p-n diode 235, 250, metallization layer 220 and optionally the bonding layer 210 so that the conformal dielectric barrier layer 260 forms an outline of the topography it is formed on. In an embodiment, the micro p-n diode 235, 250 is several microns thick, such as 3 µm, the metallization layer 220 is 0.1 µm-2 µm thick, and the bonding layer 210 is 0.1 µm-2 µm thick. In an embodiment, the conformal dielectric barrier layer 260 is approximately 50-600 angstroms thick aluminum oxide ($Al_2O_3$). Conformal dielectric barrier layer 260 may be deposited by a variety of suitable techniques such as, but not limited to, atomic layer deposition (ALD). The conformal dielectric barrier layer 260 may protect against charge arcing between adjacent micro p-n diodes during the pick up process, and thereby protect against adjacent micro p-n diodes from sticking together during the pick up process. The conformal dielectric barrier layer 260 may also protect the sidewalls 253, quantum well layer 216 and bottom surface 251, of the micro p-n diodes from contamination which could affect the integrity of the micro p-n diodes. For example, the conformal dielectric barrier layer 260 can function as a physical barrier to wicking of the bonding layer material 210 up the sidewalls and quantum well layer 216 of the micro p-n diodes 250. The conformal dielectric barrier layer 260 may also insulate the micro p-n diodes 250 once placed on a receiving substrate. In an embodiment, the conformal dielectric barrier layer 260 span sidewalls 253 of the micro p-n diode, and may cover a quantum well layer 216 in the micro p-n diode. The conformal dielectric barrier layer may also partially span the bottom surface 251 of the micro p-n diode, as well as span sidewalls of the metallization layer 220. In some embodiments, the conformal dielectric barrier layer also spans sidewalls of a patterned bonding layer 210. A contact opening 262 may be formed in the conformal dielectric barrier layer 260 exposing the top surface 252 of the micro p-n diode. In an embodiment, conformal dielectric barrier layer 260 is formed of the same material as dielectric layer 120 of the bonding head. Depending upon the particular micro LED device structure, the conformal dielectric barrier layer 260 may also span sidewalls of the bonding layer 210, as well as the carrier substrate and posts, if present.

Figure 20:
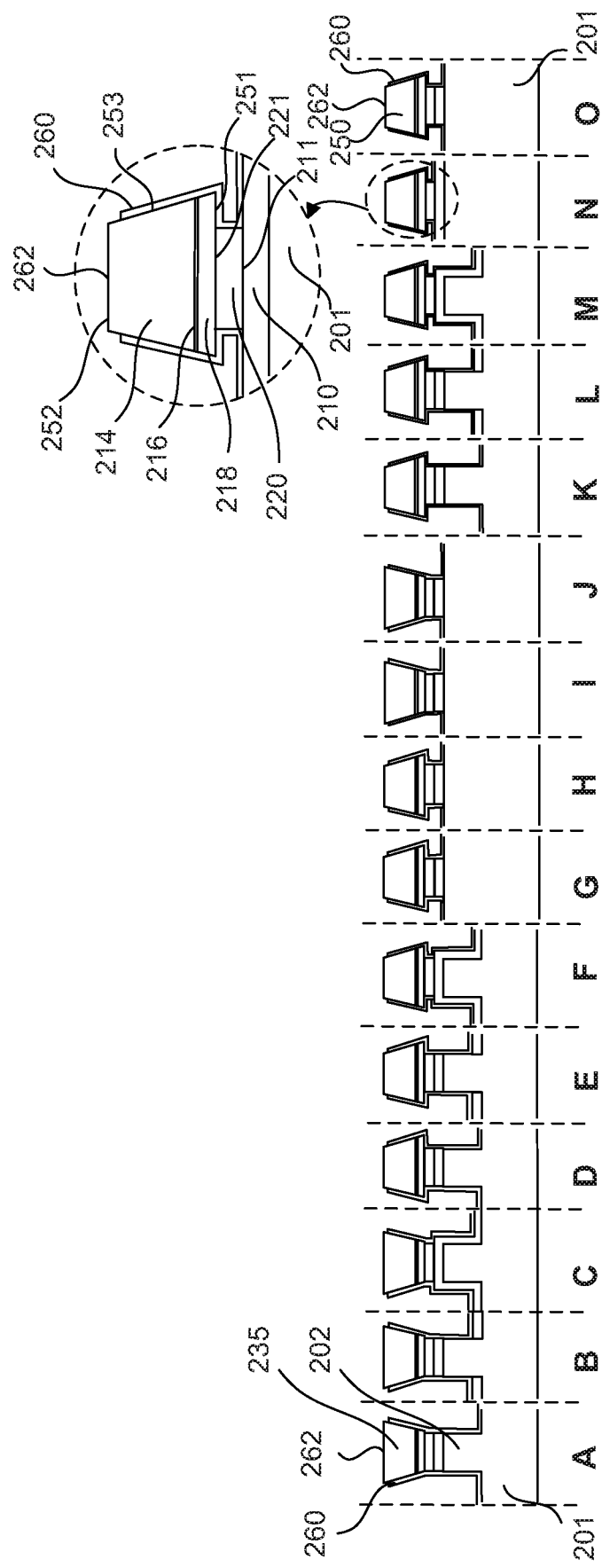
FIG. 20 is a cross-sectional side view illustration of a variety of micro LED structures including contact openings with a larger width than the top surface of the micro p-n diode.
Figure 21:
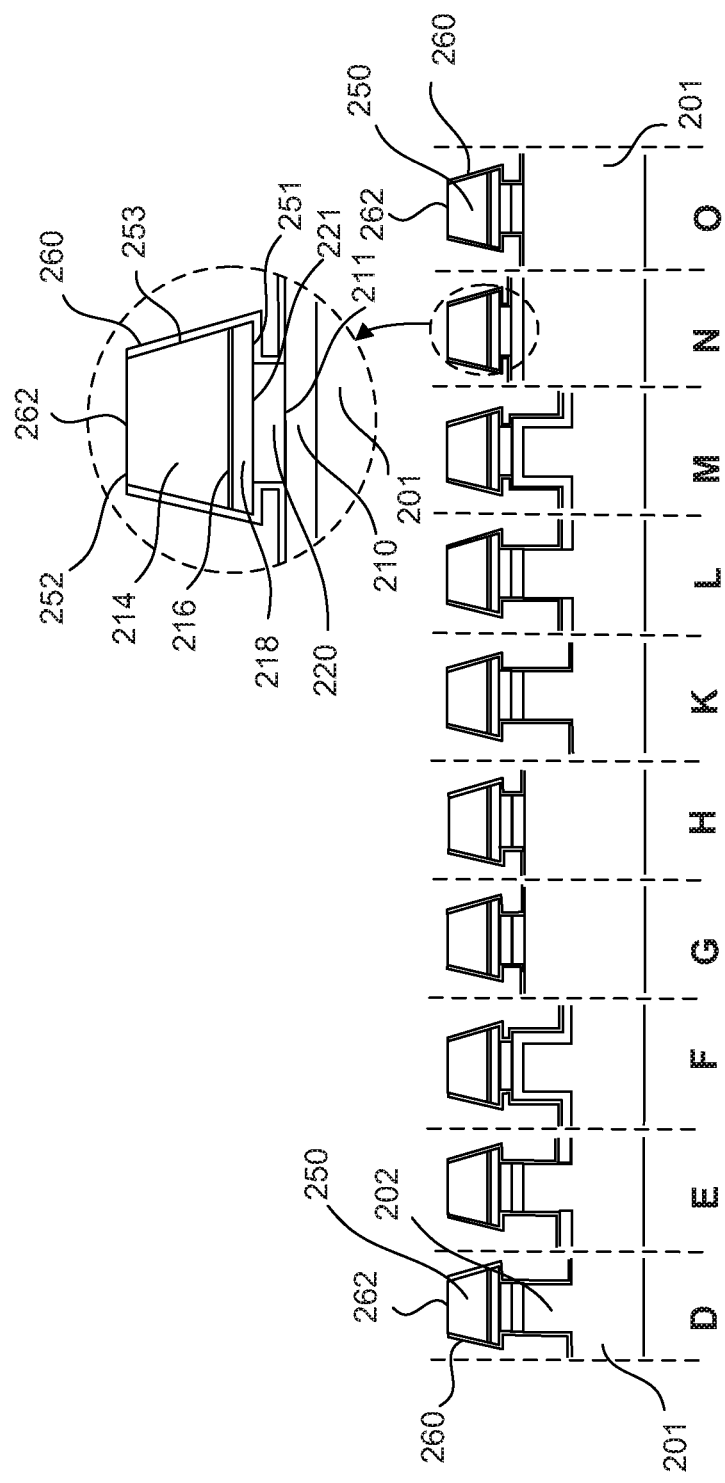
FIG. 21 is a cross-sectional side view illustration of a variety of micro LED structures including contact openings with the same width as the top surface of the micro p-n diode.

Referring to FIG. 19, the contact opening 262 may have a smaller width than the top surface 252 of the micro p-n diode and the conformal dielectric barrier layer 260 forms a lip around the edges of the top surface 252 of the micro p-n diode. Referring to FIG. 20, the contact opening 262 may have a slightly larger width than the top surface of the micro p-n diode. In such an embodiment, the contact opening 262 exposes the top surface 252 of the micro p-n diode and an upper portion of the sidewalls 253 of the micro p-n diode, while the conformal dielectric barrier layer 260 covers and insulates the quantum well layer(s) 216. Referring to FIG. 21, the conformal dielectric layer 260 may have approximately the same width as the top surface of the micro p-n diode. The conformal dielectric layer 260 may also span along a bottom surface 251 of the micro p-n diodes illustrated in FIGS. 19-21.

Bonding layer 210 may be formed from a material which can maintain the micro LED device 200 on the carrier substrate 201 during certain processing and handling operations, and upon undergoing a phase change provide a medium on which the micro LED device 200 can be retained yet also be readily releasable from during a pick up operation. For example, the bonding layer may be remeltable or reflowable such that the bonding layer undergoes a phase change from solid to liquid state prior to or during the pick up operation. In the liquid state the bonding layer may retain the micro LED device in place on the carrier substrate while also providing a medium from which the micro LED device 200 is readily releasable. In an embodiment, the bonding layer 210 has a liquidus temperature or melting temperature below approximately 350° C., or more specifically below approximately 200° C. At such temperatures the bonding layer may undergo a phase change without substantially affecting the other components of the micro LED device. For example, the bonding layer may be formed of a metal or metal alloy, or a thermoplastic polymer which is removable. For example, the bonding layer may include indium, tin or a thermoplastic polymer such as polyethylene or polypropylene. In an embodiment, the bonding layer may be conductive. For example, where the bonding layer undergoes a phase change from solid to liquid in response to a change in temperature a portion of the bonding layer may remain on the micro LED device during the pick up operation. In such an embodiment, it may be beneficial that the bonding layer is formed of a conductive material so that it does not adversely affect the micro LED device when it is subsequently transferred to a receiving substrate. In this case, the portion of conductive bonding layer remaining on the micro LED device during the transfer may aid in bonding the micro LED device to a conductive pad on a receiving substrate. In a specific embodiment, the bonding layer may be formed of indium, which has a melting temperature of 156.7° C. The bonding layer may be laterally continuous across the substrate 201, or may also be formed in laterally separate locations. For example, a laterally separate location of the bonding layer may have a width which is less than or approximately the same width as the bottom surface of the micro p-n diode or metallization layer. In some embodiments, the micro p-n diodes may optionally be formed on posts 202 on the substrate.

Solders may be suitable materials for bonding layer 210 since many are generally ductile materials in their solid state and exhibit favorable wetting with semiconductor and metal surfaces. A typical alloy melts not a single temperature, but over a temperature range. Thus, solder alloys are often characterized by a liquidus temperature corresponding to the lowest temperature at which the alloy remains liquid, and a solidus temperature corresponding to the highest temperature at which the alloy remains solid. An exemplary list of low melting solder materials which may be utilized with embodiments of the invention are provided in Table 2.

TABLE 2

| Chemical composition | Liquidus Temperature (° C.) | Solidus Temperature (° C.) |
| --- | --- | --- |
| 100 In | 156.7 | 156.7 |
| 66.3In33.7Bi | 72 | 72 |
| 51In32.5Bi16.5Sn | 60 | 60 |
| 57Bi26In17Sn | 79 | 79 |
| 54.02Bi29.68In16.3Sn | 81 | 81 |
| 67Bi33In | 109 | 109 |
| 50In50Sn | 125 | 118 |
| 52Sn48In | 131 | 118 |
| 58Bi42Sn | 138 | 138 |
| 97In3Ag | 143 | 143 |
| 58Sn42In | 145 | 118 |
| 99.3In0.7Ga | 150 | 150 |
| 95In5Bi | 150 | 125 |
| 99.4In0.6Ga | 152 | 152 |
| 99.6In0.4Ga | 153 | 153 |
| 99.5In0.5Ga | 154 | 154 |
| 60Sn40Bi | 170 | 138 |
| 100Sn | 232 | 232 |
| 95Sn5Sb | 240 | 235 |

An exemplary list thermoplastic polymers which may be utilized with embodiments of the invention are provided in Table 3.

TABLE 3

| Polymer | Melting Temperature (° C.) |
| --- | --- |
| Acrylic (PMMA) | 130-140 |
| Polyoxymethylene (POM or Acetal) | 166 |
| Polybutylene terephthalate (PBT) | 160 |
| Polycaprolactone (PCL) | 62 |
| Polyethylene terephthalate (PET) | 260 |
| Polycarbonate (PC) | 267 |
| Polyester | 260 |
| Polyethylene (PE) | 105-130 |
| Polyetheretherketone (PEEK) | 343 |
| Polylactic acid (PLA) | 50-80 |
| Polypropylene (PP) | 160 |
| Polystyrene (PS) | 240 |
| Polyvinylidene chloride (PVDC) | 185 |

Figure 22:
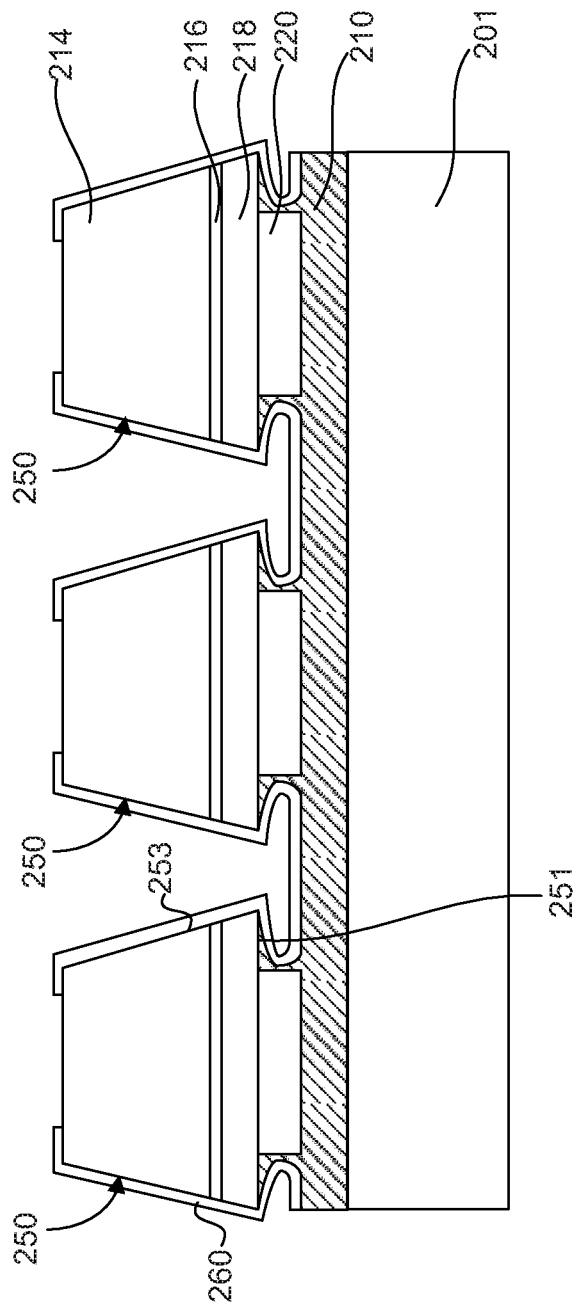
FIG. 22 is a cross-sectional side view illustration of a wicked up bonding layer in accordance with an embodiment of the invention.

Referring now to FIG. 22, in accordance with some embodiments it is possible that an amount of bonding layer wicked up along the side surfaces of the metallization layer 220 and along the bottom surface 251 of the micro p-n diode 250 during fabrication of the array of micro p-n diodes 250 on the carrier substrate 201. In this manner, conformal dielectric barrier layer 260 spanning along the bottom surface 251 of the micro p-n diodes 250 and side surfaces of the metallization layers 220 may function as a physical barrier to protect the sidewalls 253 and quantum well layer 216 of the micro p-n diodes 250 from contamination by the bonding layer material 210 during subsequent temperature cycles (particularly at temperatures above the liquidus or melting temperature of the bonding layer material 210) such as during picking up the micro LED devices from the carrier substrate, and releasing the micro LED devices onto the receiving substrate.

FIGS. 23A-23B include top and cross-sectional side view illustrations of a carrier substrate 201 and array of micro LED devices in accordance with an embodiment of the invention. In the particular embodiments illustrated, the arrays are produced from micro LED devices of Example 19N including micro p-n diode 250. However, it is to be appreciated that FIGS. 23A-23B are meant to be exemplary, and that the array of micro LED devices can be formed from any of the micro LED devices previously described. In the embodiment illustrated in FIG. 23A, each individual micro p-n diode 250 is illustrated as a pair of concentric circles having different diameters or widths corresponding the different widths of the top and bottom surfaces of the micro p-n diode 250, and the corresponding tapered sidewalls spanning between the top and bottom surfaces. In the embodiment illustrated in FIG. 23B, each individual micro p-n diode 250 is illustrated as a pair of concentric squares with tapered or rounded corners, with each square having a different width corresponding to the different widths of the top and bottom surfaces of the micro p-n diode 250, and the corresponding tapered sidewalls spanning from the top and bottom surfaces. However, embodiments of the invention do not require tapered sidewalls, and the top and bottom surfaces of the micro p-n diode 250 may have the same diameter, or width, and vertical sidewalls. As illustrated in FIGS. 23A-23B the array of micro LED devices is described as having a pitch (P), spacing (S) between each micro LED device and maximum width (W) of each micro LED device. In order for clarity and conciseness, only x-dimensions are illustrated by the dotted lines in the top view illustration, though it is understood that similar y-dimensions may exist, and may have the same or different dimensional values. In the particular embodiments illustrated in FIGS. 23A-23B, the x- and y-dimensional values are identical in the top view illustration. In one embodiment, the array of micro LED devices may have a pitch (P) of 10 µm, with each micro LED device having a spacing (S) of 2 µm and maximum width (W) of 8 µm. In another embodiment, the array of micro LED devices may have a pitch (P) of 5 µm, with each micro LED device having a spacing (S) of 2 µm and maximum width (W) of 3 µm. However, embodiments of the invention are not limited to these specific dimensions, and any suitable dimension may be utilized.

Figure 24:
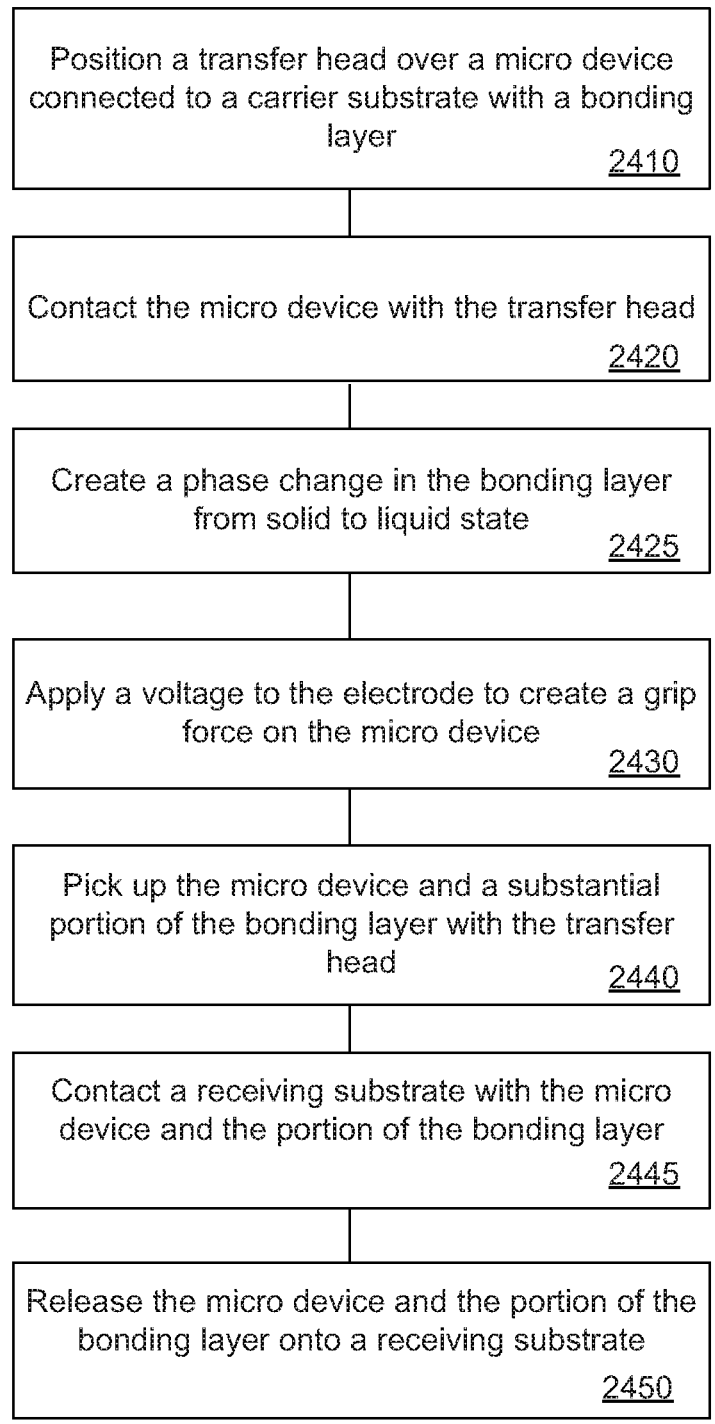
FIG. 24 is a flow chart illustrating a method of picking up and transferring a micro device from a carrier substrate to a receiving substrate in accordance with an embodiment of the invention.

FIG. 24 is a flow chart illustrating a method of picking up and transferring a micro device from a carrier substrate to a receiving substrate in accordance with an embodiment of the invention. At operation 2410 a transfer head is positioned over a micro device connected to a carrier substrate with a bonding layer. The transfer head may be any transfer head described herein. The micro device may be any of the micro LED device structures illustrated in FIGS. 19-21, and those described in related U.S. Provisional Application No. 61/561,706 and U.S. Provisional Application No. 61/594,919. The micro device is then contacted with the transfer head at operation 2420. In an embodiment, the micro device is contacted with the dielectric layer 120 of the transfer head. In an alternative embodiment, the transfer head is positioned over the micro device with a suitable air gap separating them which does not significantly affect the grip pressure, for example, 1 nm (0.001 µm) or 10 nm (0.01 µm). At operation 2425 an operation is performed to create a phase change in the bonding layer 210 from solid to liquid state. For example, the operation may include heating an In bonding layer at or above the melting temperature of 156.7° C. In another embodiment, operation 2425 can be performed prior to operation 2420. At operation 2430 a voltage is applied to the electrode to create a grip pressure on the micro device, and the micro device and a substantial portion of the bonding layer 210 are picked up with the transfer head at operation 2440. For example, approximately half of the bonding layer 210 may be picked up with the micro device. In an alternative embodiment, none of the bonding layer 210 is picked up with the transfer head. At operation 2445 the micro device and portion of the bonding layer 210 are placed in contact with a receiving substrate. The micro device and portion of the bonding layer 210 are then released onto the receiving substrate at operation 2450. A variety of operations can be performed to control the phase of the portion of the bonding layer when picking up, transferring, contacting the receiving substrate, and releasing the micro device and portion of the bonding layer 210 on the receiving substrate. For example, the portion of the bonding layer which is picked up with the micro device can be maintained in the liquid state during the contacting operation 2445 and during the release operation 2450. In another embodiment, the portion of the bonding layer can be allowed to cool to a solid phase after being picked up. For example, the portion of the bonding layer can be in a solid phase during contacting operation 2445, and again melted to the liquid state prior to or during the release operation 2450. A variety of temperature and material phase cycles can be performed in accordance with embodiments of the invention.

Figure 25:
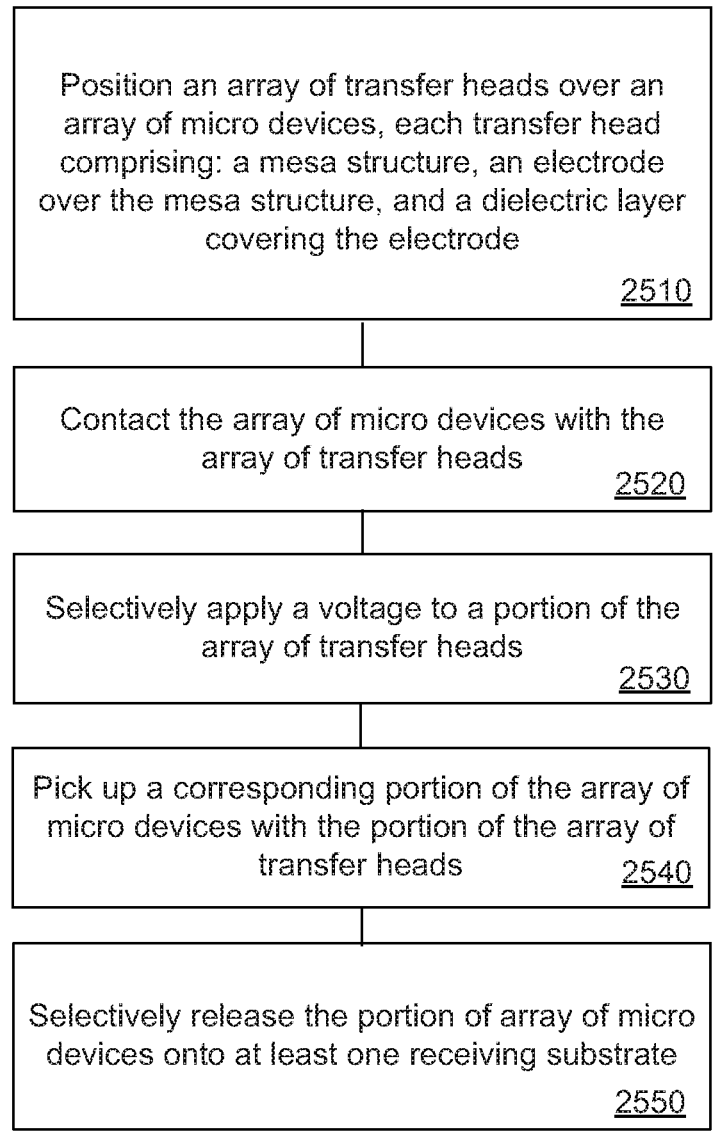
FIG. 25 is a flow chart illustrating a method of picking up and transferring an array of micro devices from a carrier substrate to at least one receiving substrate in accordance with an embodiment of the invention.

FIG. 25 is a flow chart illustrating a method of picking up and transferring an array of micro devices from a carrier substrate to at least one receiving substrate in accordance with an embodiment of the invention. At operation 2510 an array of transfer heads is positioned over an array of micro devices, with each transfer head having a mesa structure, an electrode over the mesa structure, and a dielectric layer covering the electrode. At operation 2520 the array of micro devices are contacted with the array of transfer heads. In an alternative embodiment, the array of transfer heads is positioned over the array of micro devices with a suitable air gap separating them which does not significantly affect the grip pressure, for example, 1 nm (0.001 µm) or 10 nm (0.01 µm). FIG. 26 is a side view illustration of an array of micro device transfer heads 100 in contact with an array of micro LED devices 200 in accordance with an embodiment of the invention. As illustrated in FIG. 26, the pitch (P) of the array of transfer heads 100 matches the pitch of the micro LED devices 200, with the pitch (P) of the array of transfer heads being the sum of the spacing (S) between transfer heads and width (W) of a transfer head.

In one embodiment, the array of micro LED devices 200 have a pitch of 10 µm, with each micro LED device having a spacing of 2 µm and a maximum width of 8 µm. In an exemplary embodiment, assuming a micro p-n diode 250 with straight sidewalls the top surface of the each micro LED device 200 has a width of approximately 8 µm. In such an exemplary embodiment, the width of the top surface 121 of a corresponding transfer head 100 is approximately 8 µm or smaller so as to avoid making inadvertent contact with an adjacent micro LED device. In another embodiment, the array of micro LED devices 200 may have a pitch of 5 µm, with each micro LED device having a spacing of 2 µm and a maximum width of 3 µm. In an exemplary embodiment, the top surface of the each micro LED device 200 has a width of approximately 3 µm. In such an exemplary embodiment, the width of the top surface 121 of a corresponding transfer head 100 is approximately 3 µm or smaller so as to avoid making inadvertent contact with an adjacent micro LED device 200. However, embodiments of the invention are not limited to these specific dimensions, and may be any suitable dimension.

FIG. 27 is a side view illustration of an array of micro device transfer heads in contact with an array of micro LED devices 200 in accordance with an embodiment of the invention. In the embodiment illustrated in FIG. 27, the pitch (P) of the transfer heads is an integer multiple of the pitch of the array of micro devices. In the particular embodiment illustrated, the pitch (P) of the transfer heads is 3 times the pitch of the array of micro LED devices. In such an embodiment, having a larger transfer head pitch may protect against arcing between transfer heads.

Referring again to FIG. 25, at operation 2530 a voltage is selectively applied to a portion of the array of transfer heads 100. Thus, each transfer head 100 may be independently operated. At operation 2540 a corresponding portion of the array of micro devices is picked up with the portion of the array of transfer heads to which the voltage was selectively applied. In one embodiment, selectively applying a voltage to a portion of the array of transfer heads means applying a voltage to every transfer head in the array of transfer heads. FIG. 28 is a side view illustration of every transfer head in an array of micro device transfer heads picking up an array of micro LED devices 200 in accordance with an embodiment of the invention. In another embodiment, selectively applying a voltage to a portion of the array of transfer heads means applying a voltage to less than every transfer head (e.g. a subset of transfer heads) in the array of transfer heads. FIG. 29 is a side view illustration of a subset of the array of micro device transfer heads picking up a portion of an array of micro LED devices 200 in accordance with an embodiment of the invention. In a particular embodiment illustrated in FIGS. 28-29, the pick up operation includes picking up the micro p-n diode 250, the metallization layer 220 and a portion of the conformal dielectric barrier layer 260 for the micro LED device 200. In a particular embodiment illustrated in FIGS. 28-29, the pick up operation includes picking up a substantial portion of the bonding layer 210. Accordingly, any of the embodiments described with regard to FIGS. 25-31 may also be accompanied by controlling the temperature of the portion of the bonding layer 210 as described with regard to FIG. 24. For example, embodiments described with regard to FIGS. 25-31 may include performing an operation to create a phase change from solid to liquid state in a plurality of locations of the bonding layer connecting the array of micro devices to the carrier substrate 201 prior to picking up the array of micro devices. In an embodiment, the plurality of locations of the bonding layer can be regions of the same bonding layer. In an embodiment, the plurality of locations of the bonding layer can be laterally separate locations of the bonding layer.

At operation 2550 the portion of the array of micro devices is then released onto at least one receiving substrate. Thus, the array of micro LEDs can all be released onto a single receiving substrate, or selectively released onto multiple substrates. For example, the receiving substrate may be, but is not limited to, a display substrate, a lighting substrate, a substrate with functional devices such as transistors or ICs, or a substrate with metal redistribution lines. Release may be accomplished by affecting the applied voltage with any of the manners described with regard to FIGS. 16-18.

Figure 30:
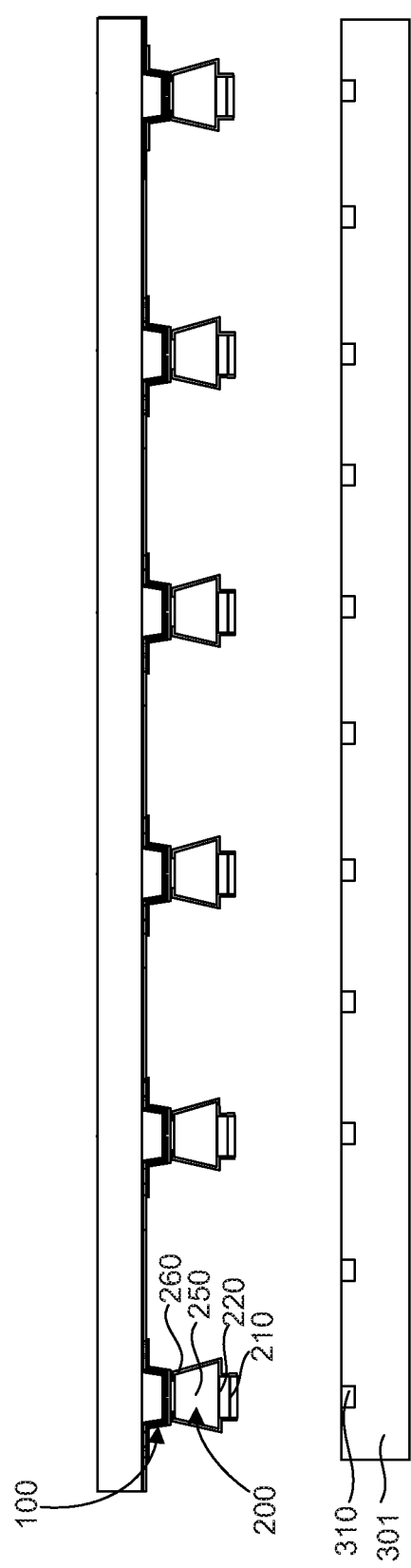
FIG. 30 is a cross-sectional side view illustration of an array of micro device transfer heads with an array of micro LED devices positioned over a receiving substrate in accordance with an embodiment of the invention.
Figure 31:
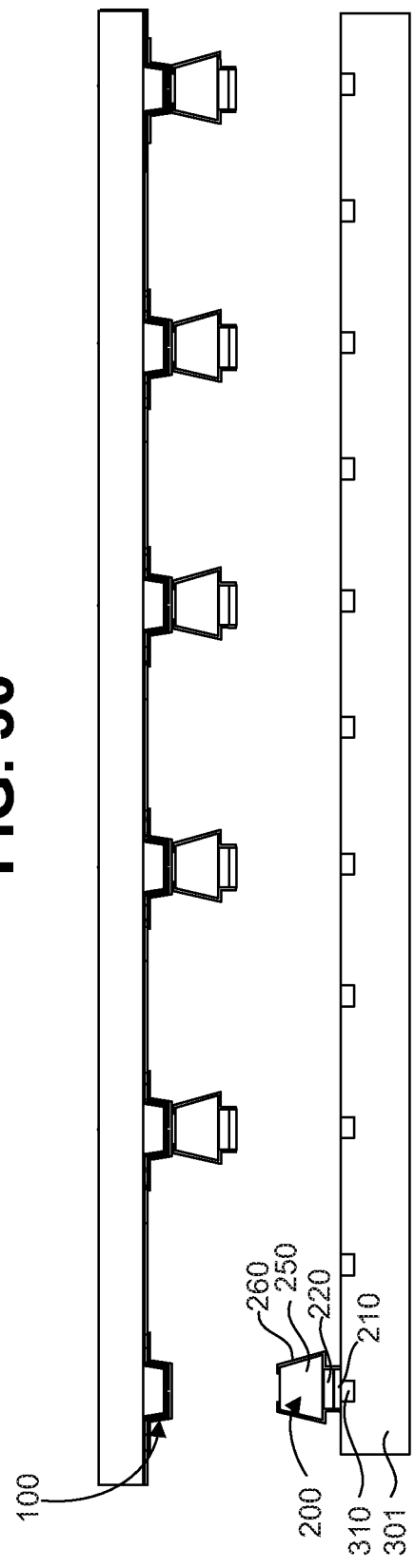
FIG. 31 is a cross-sectional side view illustration of a micro device selectively released onto a receiving substrate in accordance with an embodiment of the invention.

FIG. 30 is a side view illustration of an array of micro device transfer heads holding a corresponding array of micro LED devices 200 over a receiving substrate 301 including a plurality of driver contacts 310. The array of micro LED devices 200 may then be placed into contact with the receiving substrate and then selectively released. FIG. 31 is a side view illustration of a single micro LED device 200 selectively released onto the receiving substrate 301 over a driver contact 310 in accordance with an embodiment of the invention. In another embodiment, more than one micro LED device 200 is released, or the entire array of micro LED devices 200 are released.

Figure 32:
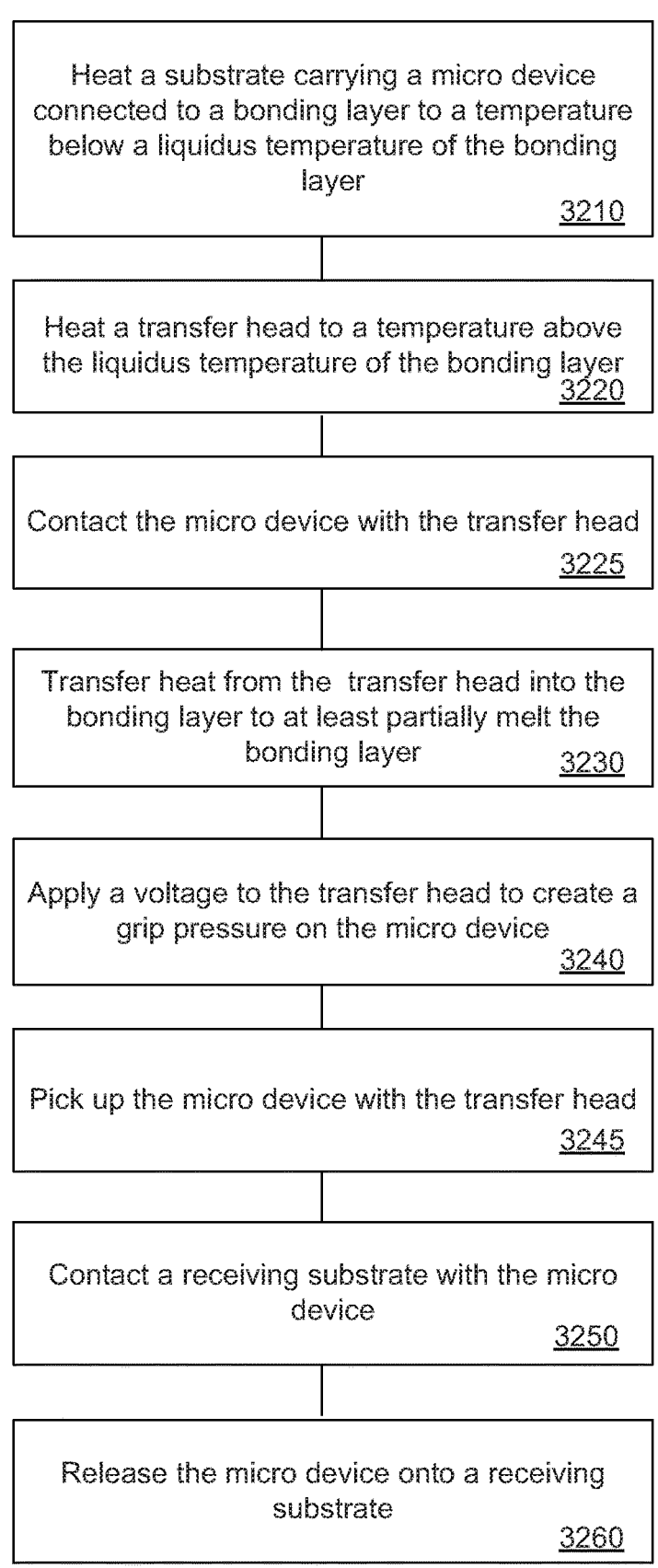
FIG. 32 is a flow chart illustrating a method of picking up and transferring a micro device from a carrier substrate to a receiving substrate in accordance with an embodiment of the invention.

FIG. 32 is a flow chart illustrating a method of picking up and transferring a micro device from a carrier substrate to a receiving substrate in accordance with an embodiment of the invention. For purpose of clarity, FIG. 32 is described in relation to various structural configurations illustrated in FIGS. 33A-35B, though embodiments of the invention are not so limited and may be practiced with other structural configurations referred to herein. At operation 3210 a carrier substrate carrying a micro device connected to a bonding layer is optionally heated to a temperature below a liquidus temperature of the bonding layer. In an embodiment, the carrier substrate is heated to a temperature of 1° C. to 10° C. below a liquidus temperature of the bonding layer, though lower or higher temperatures may be used. The heat from the carrier substrate may transfer from the carrier substrate to the bonding layer, to also maintain the bonding layer at approximately the same temperature. At operation 3220 a transfer head is heated to a temperature above the liquidus temperature of the bonding layer. For example, the transfer head may be heated to a temperature of 1° C. to 150° C., and more specifically 1° C. to 50° C., above the liquidus temperature of the bonding layer, though higher temperatures may be used. The micro device is then contacted with the transfer head at operation 3225, and heat is transferred from the transfer head 100 into the bonding layer 210 to at least partially melt the bonding layer at operation 3230. Alternatively, the micro device can be contacted with the transfer head at operation 3225, followed by heating the transfer head to the temperature above the liquidus temperature of the bonding layer at operation 3220 so that heat is transferred from the transfer head 100 into the bonding layer 210 to at least partially melt the bonding layer at operation 3230. Accordingly, it is to be understood that the order of operations in the flow charts illustrated in FIG. 32 and FIG. 36 can be performed in different orders than the sequentially numbered operations. In an embodiment, the transfer head and carrier substrate are heated to temperatures such that a sufficient portion of the bonding layer rapidly melts upon contacting the micro device with the transfer head which is heated above the liquidus temperature so that the micro device may be picked up by the transfer head upon creating a grip force which overcomes the surface tension forces holding the micro device to the carrier substrate. Size of the micro device, pick up speed, and thermal conductivity of the system are factors in determining the temperatures.

Figure 33A:
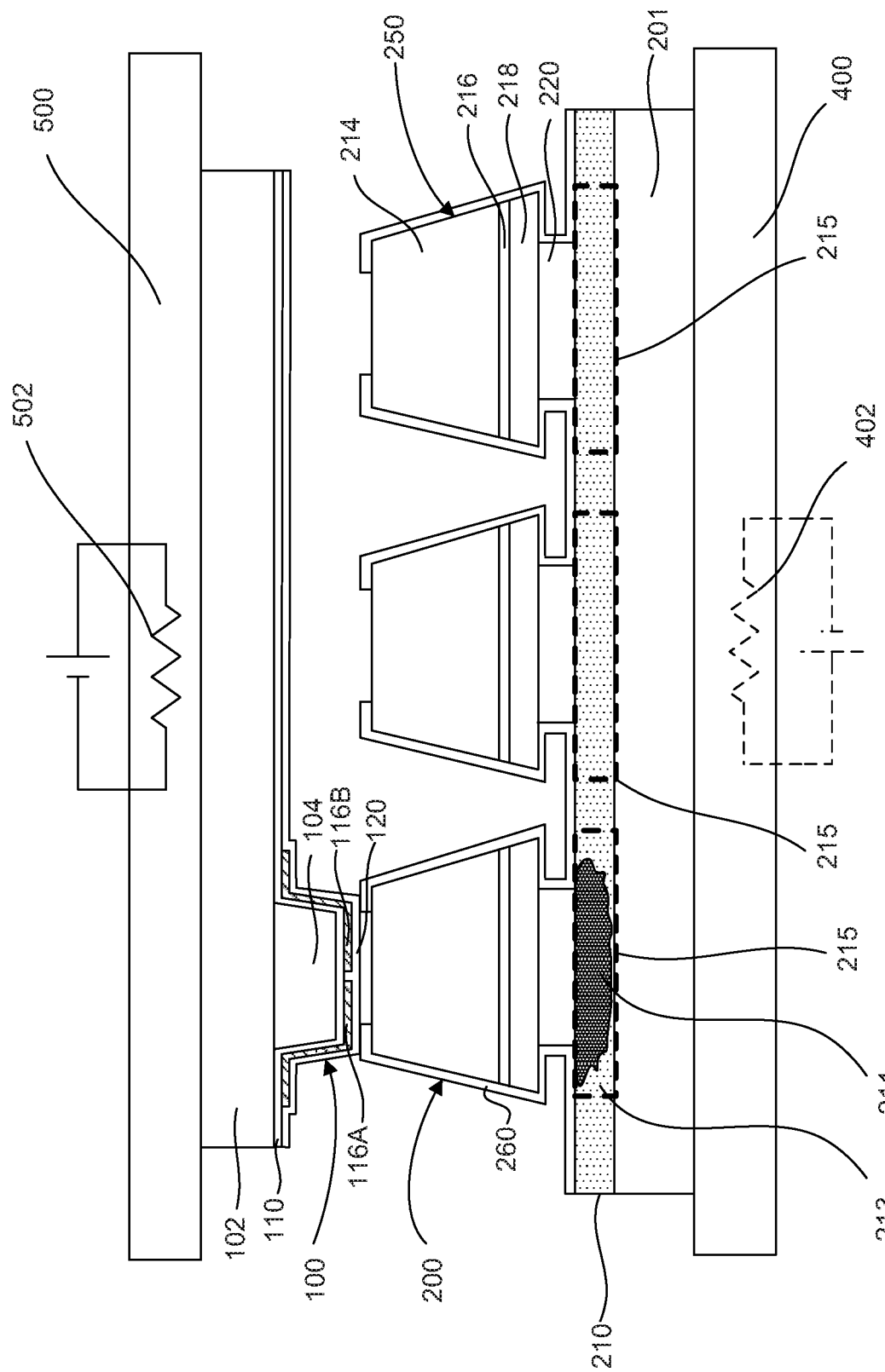
FIG. 33A is a cross-sectional side view illustration of an at least partially melted location of a laterally continuous bonding layer in accordance with an embodiment of the invention.

FIG. 33A is a side view illustration of an at least partially melted location 215 of a laterally continuous bonding layer directly below the micro LED device 200 in accordance with an embodiment of the invention. As illustrated, area 211 in location 215 of the bonding layer 210 located directly below the micro device 200 is illustrated with a darker shading indicating that the area 211 is in the liquid state, while the lighter shaded portions 213 of bonding layer 210 are in the solid state. In the particular embodiment illustrated in FIG. 33A, the localized melting of area 211 of the bonding layer 210 may be accomplished by separately heating the substrate 201 carrying the micro device 200, and the transfer head assembly carrying the transfer head 100. For example, the carrier substrate 201 can be globally heated with an optional heating element 402 (indicated by dotted lines) and heat distribution plate 400 to a temperature 1° C. to 10° C. below a liquidus temperature of the bonding layer, and the transfer head can be heated with a heating element 502 and heat distribution plate 500 to a temperature of 1° C. to 150° C., and more specifically 1° C. to 150° C., above the liquidus temperature of the bonding layer. Heat can be applied in other fashions, such as IR heat lamps, lasers, resistive heating elements, amongst others. Substrate 201 may also be locally heated.

Figure 33B:
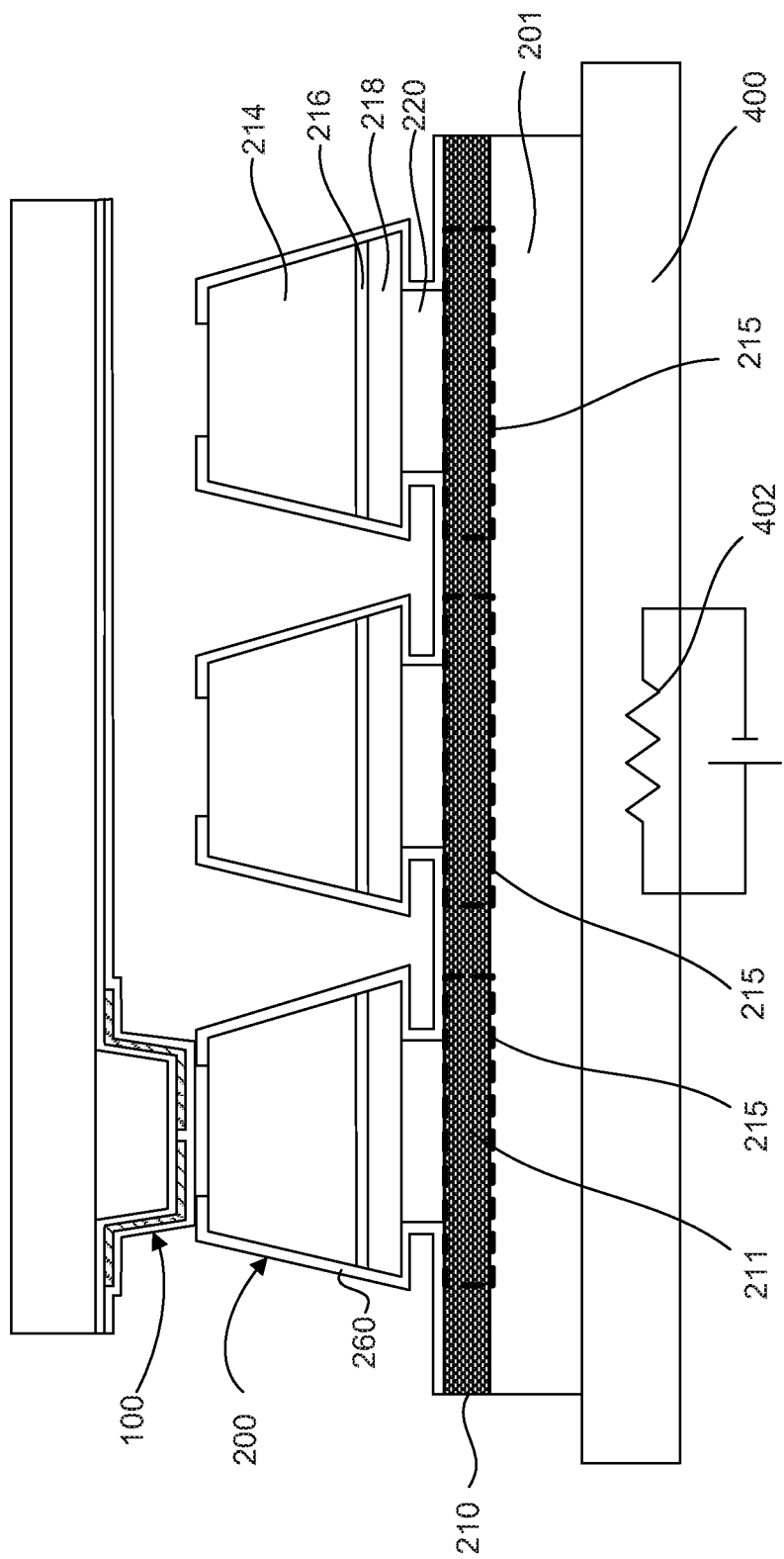
FIG. 33B is a cross-sectional side view illustration of at least partially melted locations of a laterally continuous bonding layer in accordance with an embodiment of the invention.

FIG. 33B is a side view illustration of at least partially melted locations of a laterally continuous bonding layer directly below the micro LED device 200 in accordance with an embodiment of the invention. As illustrated, the location of the bonding layer 210 located directly below the micro device 200 is illustrated with a darker shading indicating that the area 211 is in the liquid state. In the particular embodiment illustrated in FIG. 33B, substantially all of the laterally continuous bonding layer 210 is in the liquid state, which may be accomplished by globally heating the substrate 201 carrying the micro device 200 to or above the liquidus temperature of the bonding layer 210, for example with heating element 402 and heat distribution plate 400, without requiring separate heating of the transfer head 100.

Figure 34A:
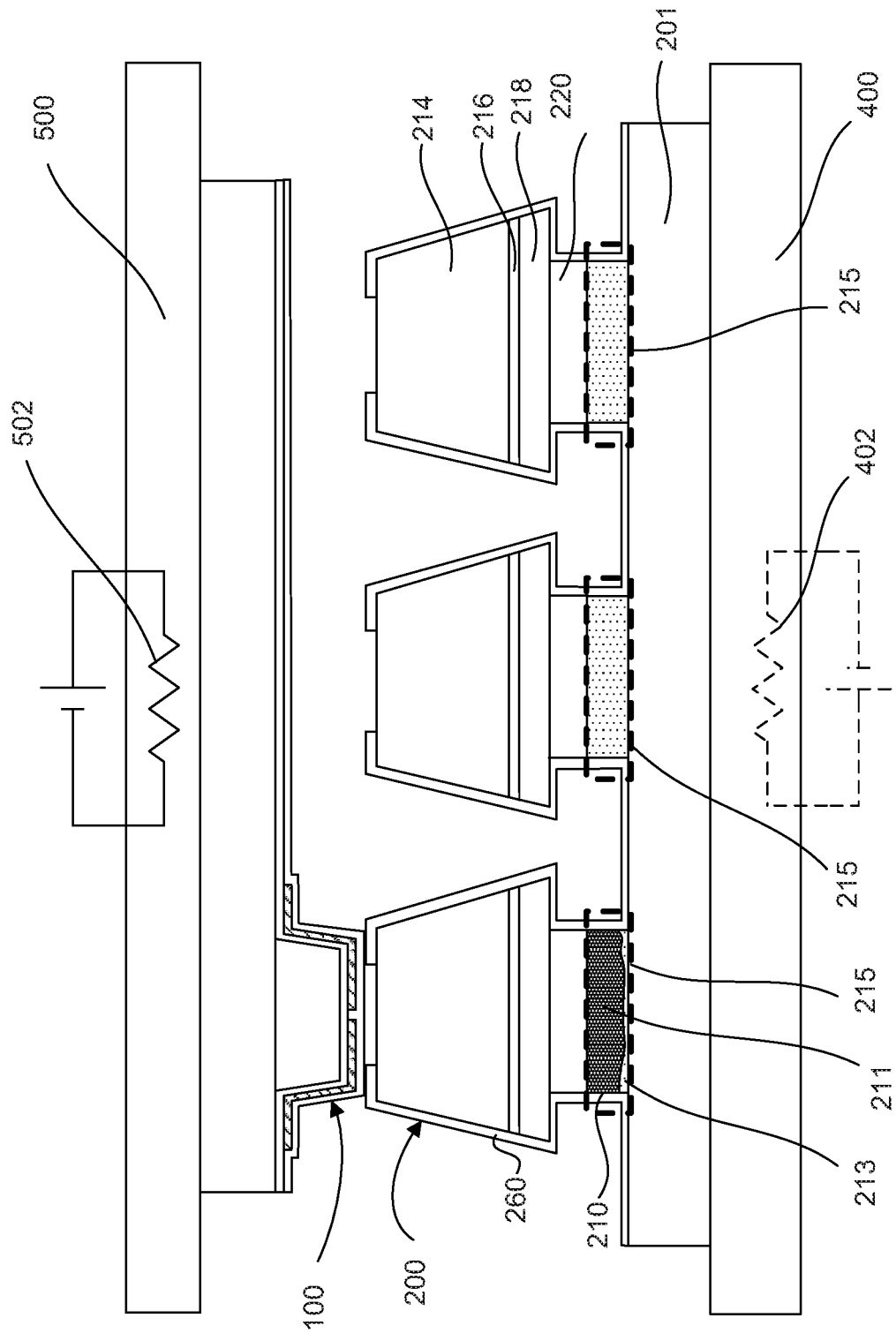
FIG. 34A is a cross-sectional side view illustration of an at least partially melted laterally separate location of a bonding layer in accordance with an embodiment of the invention.

FIG. 34A is a side view illustration of an at least partially melted laterally separate location 215 of a bonding layer directly below the micro LED device 200 in accordance with another embodiment of the invention. As illustrated, the locations 215 of the bonding layer 210 directly below the micro devices 200 are laterally separate locations, with the laterally separate location 215 of the bonding layer located directly below the micro device 200 which is in contact with the transfer head 100 at least partially melted, indicated by shading of area 211. Similar to FIG. 33A, localized melting of area 211 of the laterally separate location of bonding layer 210 may be accomplished by separately heating the substrate 201 carrying the micro device 200, and the transfer head assembly carrying the transfer head 100. Heating element 402 may be optional for localized heating, indicated by the dotted lines. Carrier substrate 201 may also be locally heated.

FIG. 34B is a side view illustration of at least partially melted laterally separate locations of a bonding layer in accordance with an embodiment of the invention. As illustrated, the laterally separate locations 215 of the bonding layer 210 located below the micro devices 200 are illustrated with a darker shading indicating that areas 211 are in the liquid state. In the particular embodiment illustrated in FIG. 34B, substantially all of each laterally separate location 215 of the bonding layer 210 is molten, which may be accomplished by globally heating the substrate 201 carrying the micro devices 200 to or above the liquidus temperature of the bonding layer 210, for example with heating element 402 and heat distribution plate 400, without requiring separate heating of the transfer head 100.

Figure 35A:
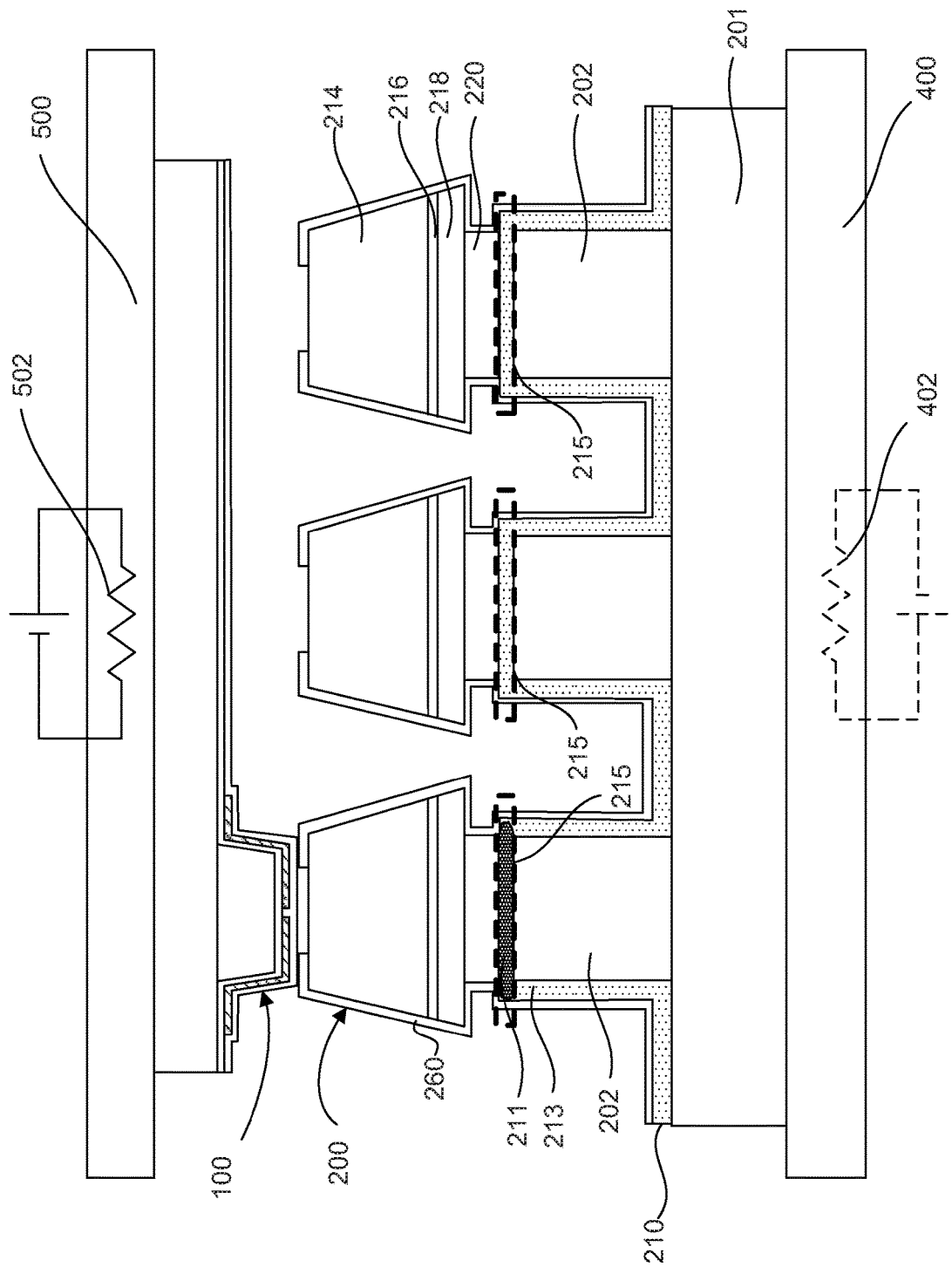
FIG. 35A is a cross-sectional side view illustration of an at least partially melted laterally separate location of a bonding layer on a post in accordance with an embodiment of the invention.

FIG. 35A is a side view illustration of an at least partially melted laterally separate location 215 of a bonding layer on a post 202 in accordance with an embodiment of the invention. As illustrated, the locations 215 of the bonding layer 210 located below the micro devices 200 are laterally separate locations, with the laterally separate location 215 of the bonding layer located below the micro device 200 in contact with the transfer head 100 at least partially melted, indicated by shading of area 211. Similar to FIG. 33A, localized melting of area 211 of the laterally separate location 215 of bonding layer 210 may be accomplished by separately heating the substrate 201 carrying the micro device 200, and the transfer head assembly carrying the transfer head 100. Heating element 402 may be optional for localized heating, indicated by the dotted lines. Carrier substrate 201 may also be locally heated.

Figure 35B:
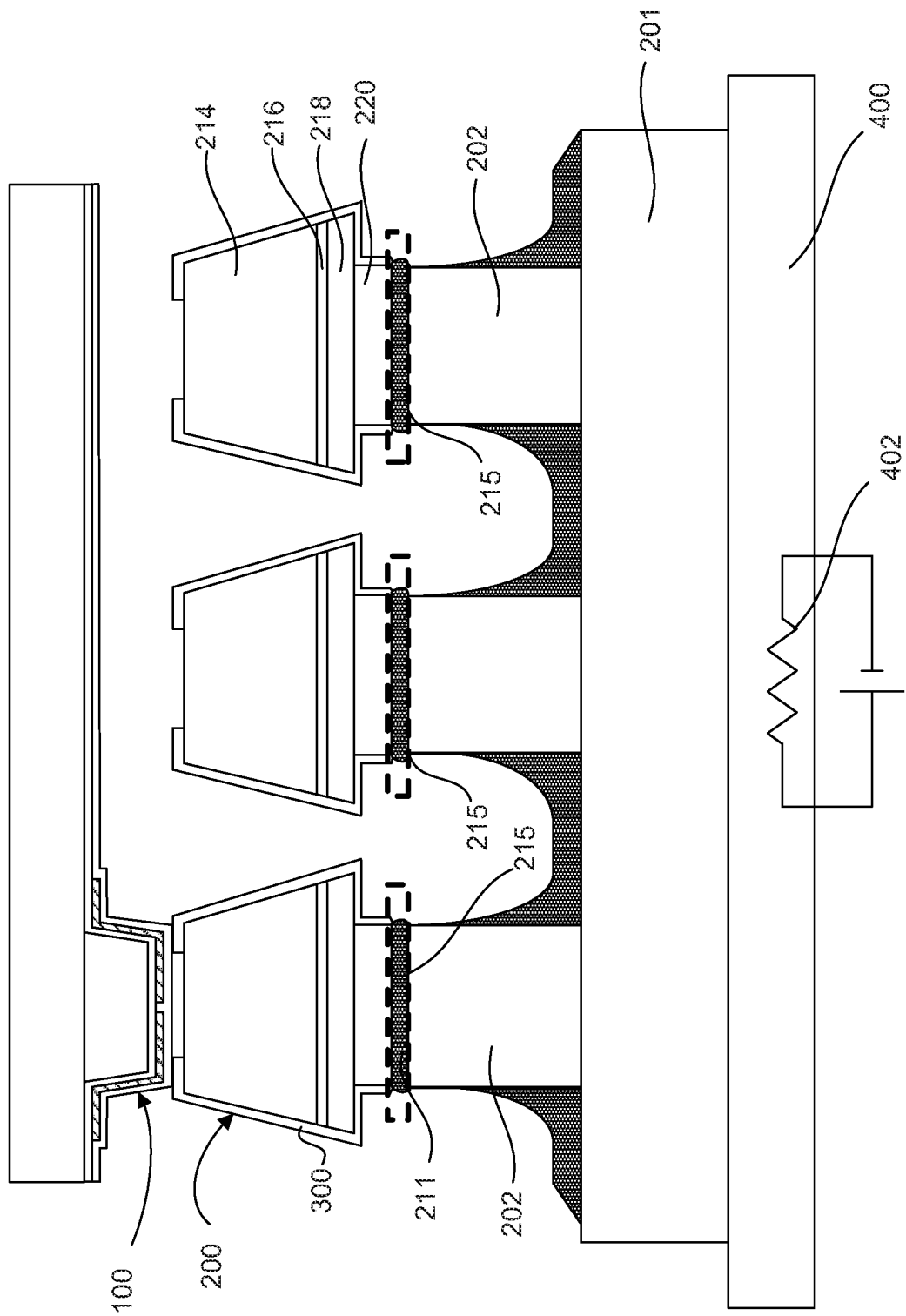
FIG. 35B is a cross-sectional side view illustration of at least partially melted laterally separate locations of a bonding layer on posts in accordance with an embodiment of the invention.

FIG. 35B is a side view illustration of at least partially melted laterally separate locations 215 of a bonding layer on posts 202 in accordance with an embodiment of the invention. As illustrated, the laterally separate locations of the bonding layer 210 located below the micro devices 200 are illustrated with a darker shading indicating that areas 211 are in the liquid state. In the particular embodiment illustrated in FIG. 35B, each laterally separate location 215 of the bonding layer 210 is molten, which may be accomplished by globally heating the substrate 201 carrying the micro devices 200 to or above the liquidus temperature of the bonding layer 210, for example with heating element 402 and heat distribution plate 400, without requiring separate heating of the transfer head 100.

Referring again to FIG. 32 a voltage is applied to the electrode(s) 116 in the transfer head 100 to create a grip pressure on the micro device 200 at operation 3240, and at operation 3245 the micro device is picked up with the transfer head. As described above, the order of operations in the flow charts illustrated in FIG. 32 and FIG. 36 can be performed in different orders than the sequentially numbered operations. For example, operation 3240 of applying a voltage to the transfer head to create a grip pressure on the micro device can be performed earlier in the sequence of operations. In an embodiment, a substantial portion of the bonding layer 210 is picked up with the transfer head 100 at operation 3245. For example, approximately half of the bonding layer 210 may be picked up with the micro device 200. In an alternative embodiment, none of the bonding layer 210 is picked up with the transfer head. In an embodiment, a portion of the conformal dielectric barrier layer 260 is picked up with the micro device 200. For example, a portion of the conformal dielectric barrier layer spanning sidewalls 253 and a portion of the bottom surface 251 of the micro device is picked up with the micro device. The portion of conformal dielectric barrier layer spanning the sidewalls 253 may cover a quantum well layer 216 of the micro device. At operation 3250 the micro device and optionally a portion of the bonding layer 210 and conformal dielectric barrier layer 260 are placed in contact with a receiving substrate. The micro device and optionally a portion of the bonding layer 210 and conformal dielectric barrier layer 260 are then released onto the receiving substrate at operation 3260.

Referring again to FIGS. 33A-35B, in the particular embodiment illustrated the bottom surface of the micro p-n diode 250 is wider than the top surface of the metallization layer 220, and the conformal dielectric barrier layer 260 spans the sidewalls of the micro p-n diode 250, a portion of the bottom surface of the micro p-n diode 250 and sidewalls of the metallization layer 220. In one aspect, the portion of the conformal dielectric barrier layer 260 wrapping underneath the micro p-n diode 250 protects the conformal dielectric barrier layer 260 on the sidewalls of the micro p-n diode 250 from chipping or breaking during the pick up operation with the transfer head 100. Stress points may be created in the conformal dielectric barrier layer 260 adjacent the metallization layer 220 or bonding layer 210, particularly at corners and locations with sharp angles. Upon contacting the micro LED device with the transfer head 100 and/or creating the phase change in the bonding layer, these stress points become natural break points in the conformal dielectric barrier layer 260 at which the conformal dielectric layer can be cleaved. In an embodiment, the conformal dielectric barrier layer 260 is cleaved at the natural break points after contacting the micro LED device with the transfer head and/or after creating the phase change in the bonding layer, which may be prior to or during picking up the micro p-n diode and the metallization layer. In the liquid state the bonding layer 210 may smooth out over the underlying structure in response to compressive forces associated with contacting the micro LED device with the transfer head 100. In an embodiment, after contacting the micro LED device with the transfer head, the transfer head is rubbed across a top surface of the micro LED device prior to creating the phase change in the bonding layer. Rubbing may dislodge any particles which may be present on the contacting surface of either of the transfer head or micro LED device. Rubbing may also transfer pressure to the conformal dielectric barrier layer. Thus, both transferring a pressure from the transfer head 100 to the conformal dielectric barrier layer 260 and heating the bonding layer above a liquidus temperature of the bonding layer can contribute to cleaving the conformal dielectric barrier layer 260 at a location underneath the micro p-n diode 250 and may preserve the integrity of the micro LED device and quantum well layer. In an embodiment, the bottom surface of the micro p-n diode 250 is wider than the top surface of the metallization layer 220 to the extent that there is room for the conformal dielectric barrier layer 260 to be formed on the bottom surface of the micro p-n diode 250 and create break points, though this distance may also be determined by lithographic tolerances. In an embodiment, a 0.25 µm to 1 µm distance on each side of the micro p-n diode 250 accommodates a 50 angstrom to 600 angstrom thick conformal dielectric barrier layer 260.

A variety of operations can be performed to control the phase of the portion of the bonding layer when picking up, transferring, contacting the receiving substrate, and releasing the micro device and portion of the bonding layer 210 on the receiving substrate. For example, the portion of the bonding layer which is picked up with the micro device can be maintained in the liquid state during the contacting operation 3250 and during the release operation 3260. In another embodiment, the portion of the bonding layer can be allowed to cool to a solid phase after being picked up. For example, the portion of the bonding layer can be in a solid phase during contacting operation 3250, and again melted to the liquid state prior to or during the release operation 3260. A variety of temperature and material phase cycles can be performed in accordance with embodiments of the invention.

Figure 36:
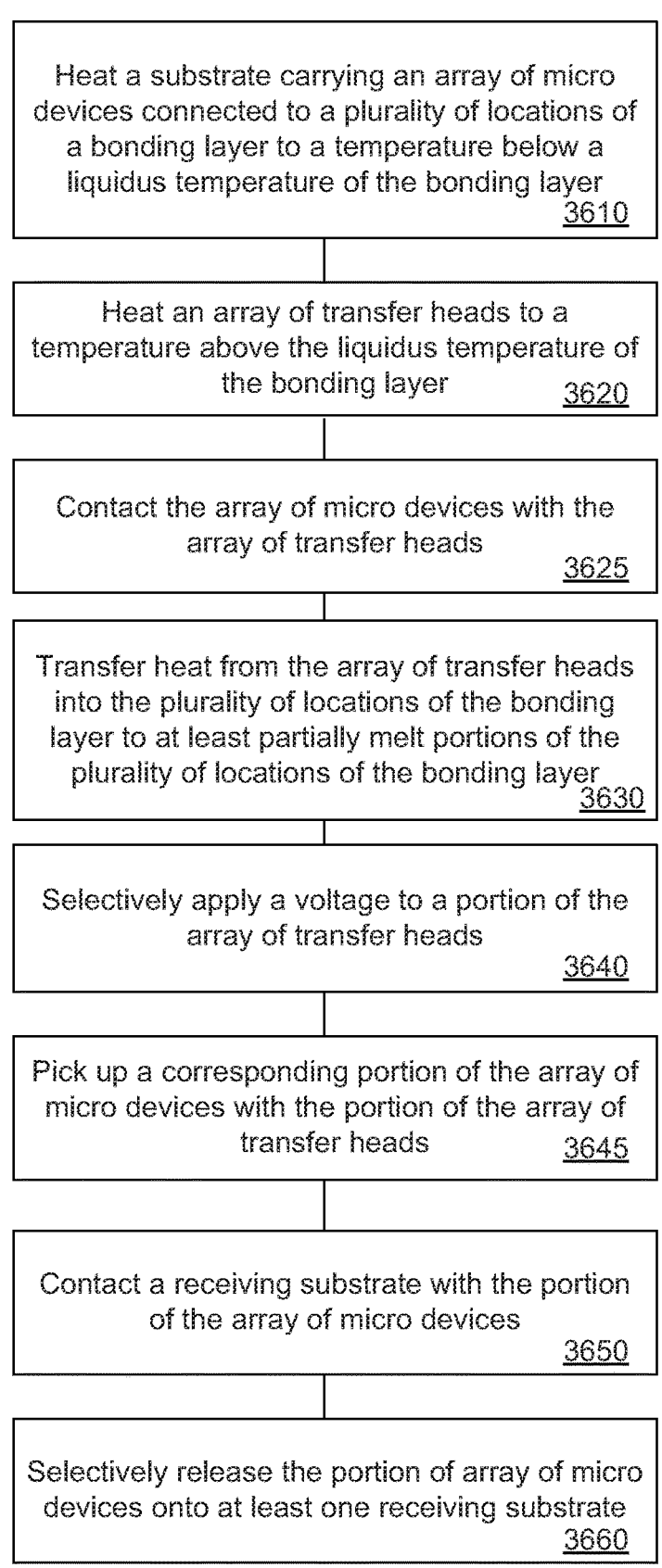
FIG. 36 is a flow chart illustrating a method of picking up and transferring an array of micro devices from a carrier substrate to at least one receiving substrate in accordance with an embodiment of the invention.

An exemplary embodiment which illustrates controlling the phase of the portion of the bonding layer when picking up, transferring, contacting the receiving substrate, and releasing the micro device of FIG. 33A is described in additional detail in the following method illustrated in FIG. 36 and the structural configurations illustrated in FIGS. 37-40, though embodiments of the invention are not so limited an may be practiced with other structural configurations. At operation 3610 a substrate carrying an array of micro devices connected to a plurality of locations of a bonding layer is optionally heated to a temperature below a liquidus temperature of the bonding layer. The heat from the carrier substrate may transfer from the carrier substrate to the bonding layer, to also maintain the bonding layer at approximately the same temperature. At operation 3620 a transfer head is heated to a temperature above the liquidus temperature of the bonding layer. The array of micro devices are then contacted with the array of transfer heads at operation 3625, and heat is transferred from the array of transfer heads 100 into the plurality of locations of the bonding layer 210 to at least partially melt portions of the plurality of locations of the bonding layer at operation 3630. Alternatively, the array of micro devices can be contacted with the array of transfer heads at operation 3625, followed by heating the array of transfer heads to the temperature above the liquidus temperature of the bonding layer at operation 3620 so that heat is transferred from the array of transfer heads 100 into the plurality of locations of the bonding layer 210 to at least partially melt the portions of the plurality of locations of the bonding layer at operation 3630. Accordingly, it is to be understood that the order of operations in the flow charts illustrated in FIG. 32 and FIG. 36 can be performed in different orders than the sequentially numbered operations.

Figure 37:
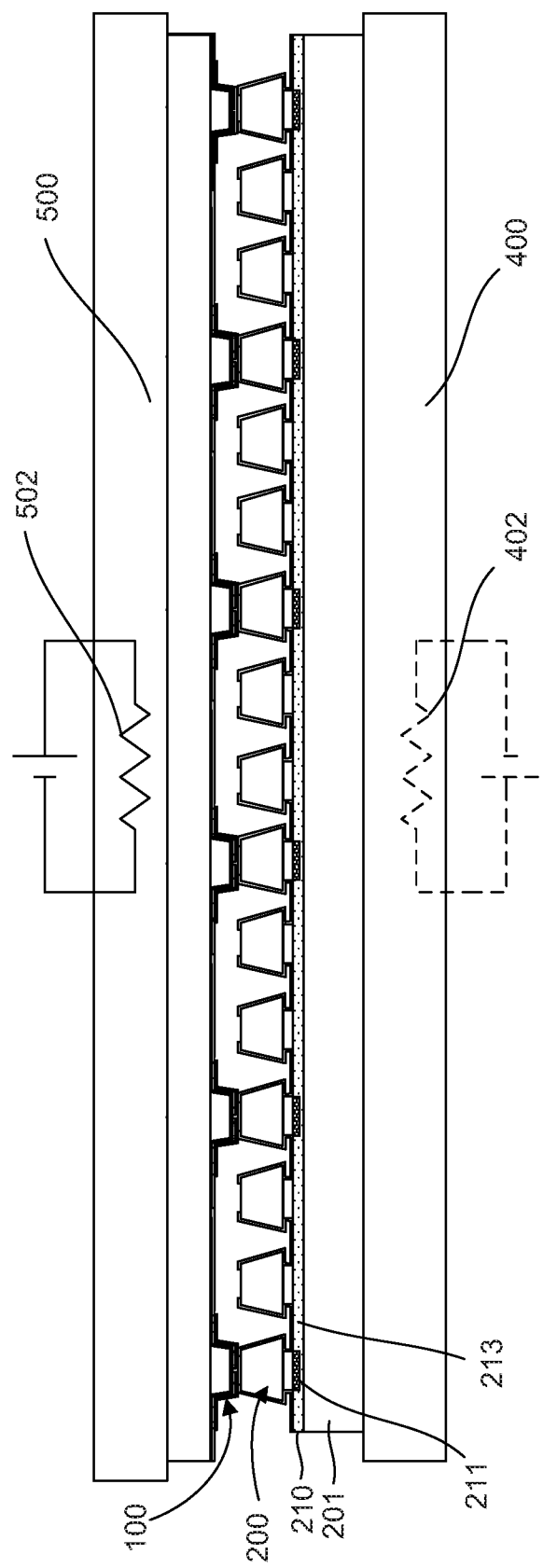
FIG. 37 is a cross-sectional side view illustration of an array of micro device transfer heads in contact with an array of micro LED devices in accordance with an embodiment of the invention.

FIG. 37 is a side view illustration of an array of micro device transfer heads in contact with an array of micro LED devices of FIG. 33A, in which the plurality of locations of the bonding layer are at least partially melted, indicated by the dark shaded areas 211, in accordance with an embodiment of the invention. In the particular embodiment illustrated in FIG. 37, the localized melting of areas 211 of the bonding layer 210 may be accomplished by separately heating the carrier substrate 201 carrying the micro devices 200, and the array of transfer heads 100. For example, the carrier substrate 201 can be heated with a heating element 402 and heat distribution plate 400 to a temperature 1° C. to 10° C. below a liquidus temperature of the bonding layer, and the base array of transfer heads 100 can be heated with a heating element 502 and heat distribution plate 500 to a temperature of 1° C. to 150° C., and more specifically 1° C. to 150° C., above the liquidus temperature of the bonding layer as described in relation to FIG. 33A. Heat can be applied in other fashions, such as IR heat lamps, lasers, resistive heating elements, amongst others. Carrier substrate 201 may also be locally heated.

Figure 38:
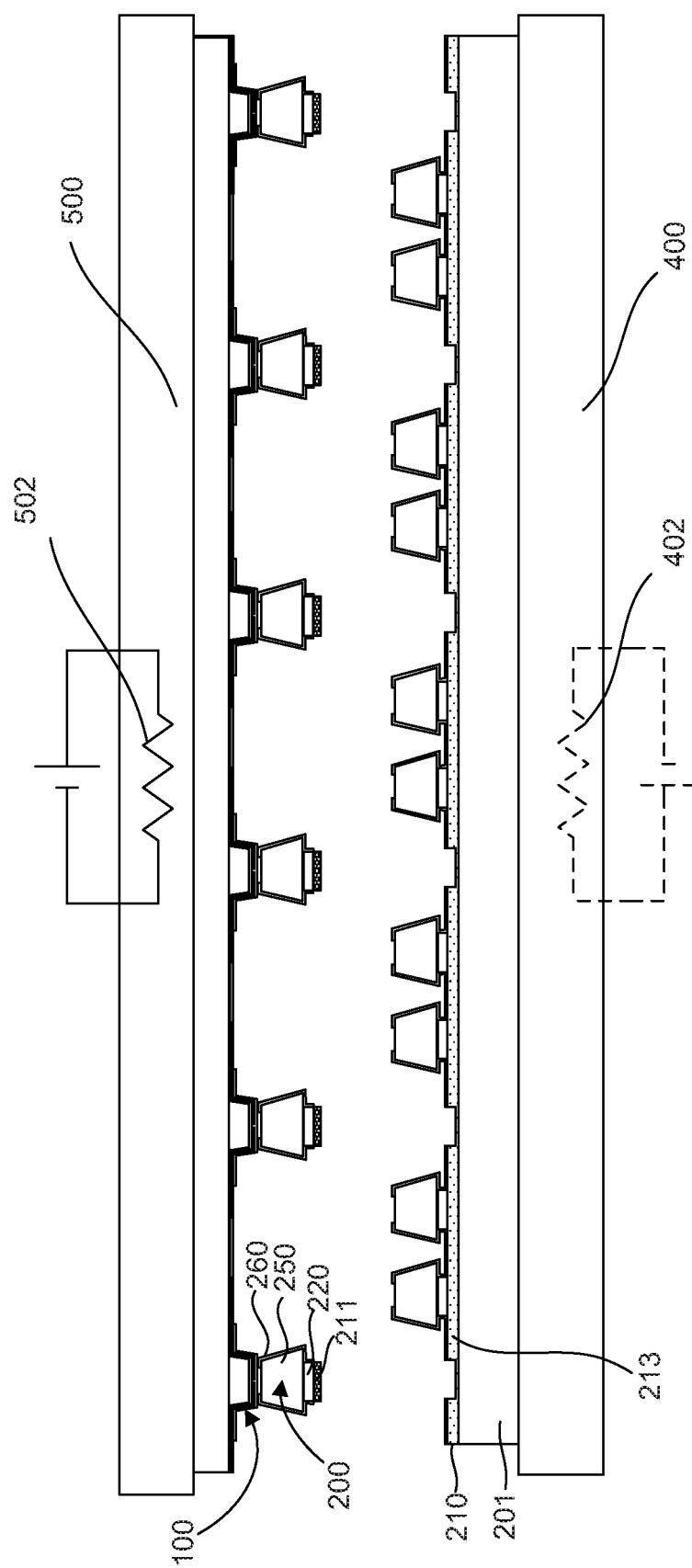
FIG. 38 is a cross-sectional side view illustration of an array of micro device transfer heads picking up an array of micro LED devices in accordance with an embodiment of the invention.

Referring again to FIG. 36 a voltage is then selectively applied to the electrode(s) 116 in a portion of the array of transfer heads 100 to create a grip pressure on the corresponding array of micro devices 200 at operation 3640, and at operation 3645 the corresponding portion of the array of micro devices 200 are picked up with the portion of the array of transfer heads 100. As described above, the order of operations in the flow charts illustrated in FIG. 32 and FIG. 36 can be performed in different orders than the sequentially numbered operations. For example, operation 3640 of applying a voltage to the transfer head to create a grip pressure on the micro device can be performed earlier in the sequence of operations. In an embodiment, a substantial portion of the plurality of locations of the bonding layer 210 is picked up with the array of micro devices 200 at operation 3645. For example, approximately half of the plurality of locations of the bonding layer 210 may be picked up with the array of micro devices 200. In an alternative embodiment, none of the bonding layer 210 is picked up with the array of micro devices 200. In an embodiment, a portion of the conformal dielectric barrier layer 260 is picked up with the micro devices 200. For example, a portion of the conformal dielectric barrier layer spanning sidewalls 235 and a portion of the bottom surfaces 251 of the micro devices is picked up with the micro devices. The portion of conformal dielectric barrier layer spanning the sidewalls 235 may cover a quantum well layer 216 in each of the micro devices. FIG. 38 is a side view illustration of an array of micro device transfer heads 100 picking up an array of micro LED devices 200 in accordance with an embodiment of the invention, in which a substantial portion of the plurality locations of bonding layer are picked up in the liquid state 211 along with the array of micro LED devices 200.

At operation 3650 the corresponding portion of the array of micro devices 200 and optionally the portion of the bonding layer 210 and portion of the conformal dielectric barrier layer 260 which have been picked up are placed in contact with a receiving substrate. The bonding layer 210 may be in either the solid state 213 or liquid state 211 when contacting the substrate. The portion of the array of micro devices and optionally the portion of the bonding layer 210 and portion of the conformal dielectric barrier layer 260 are then selectively released onto the at least one receiving substrate at operation 3660. Thus, the array of micro devices can all be released onto a single receiving substrate, or selectively released onto multiple substrates. The receiving substrate may be, but is not limited to, a display substrate, a lighting substrate, a substrate with functional devices such as transistors or ICs, or a substrate with metal redistribution lines. Release may be accomplished by turning off the voltage source, grounding the voltage source, or reversing the polarity of the constant voltage.

Figure 39:
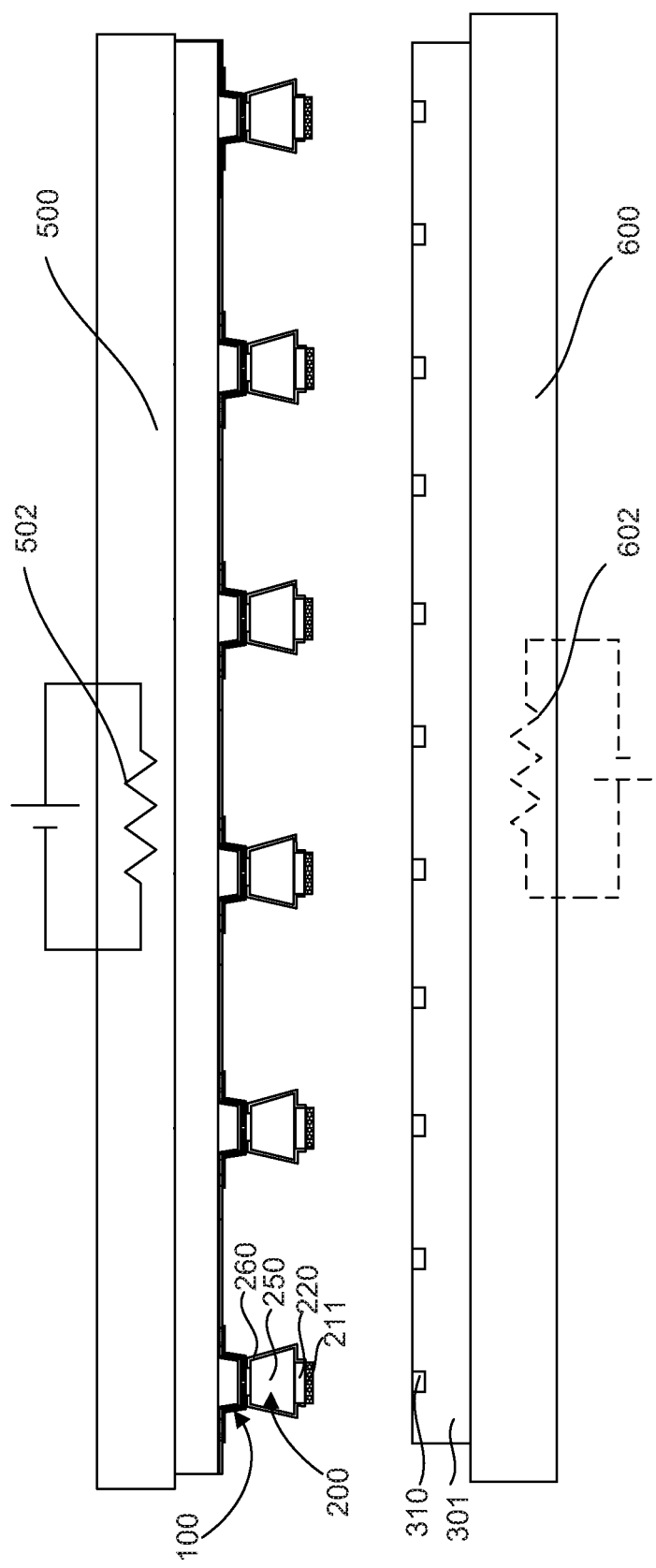
FIG. 39 is a side view illustration of an array of micro device transfer heads with an array of micro LED devices positioned over a receiving substrate in accordance with an embodiment of the invention.
Figure 40:
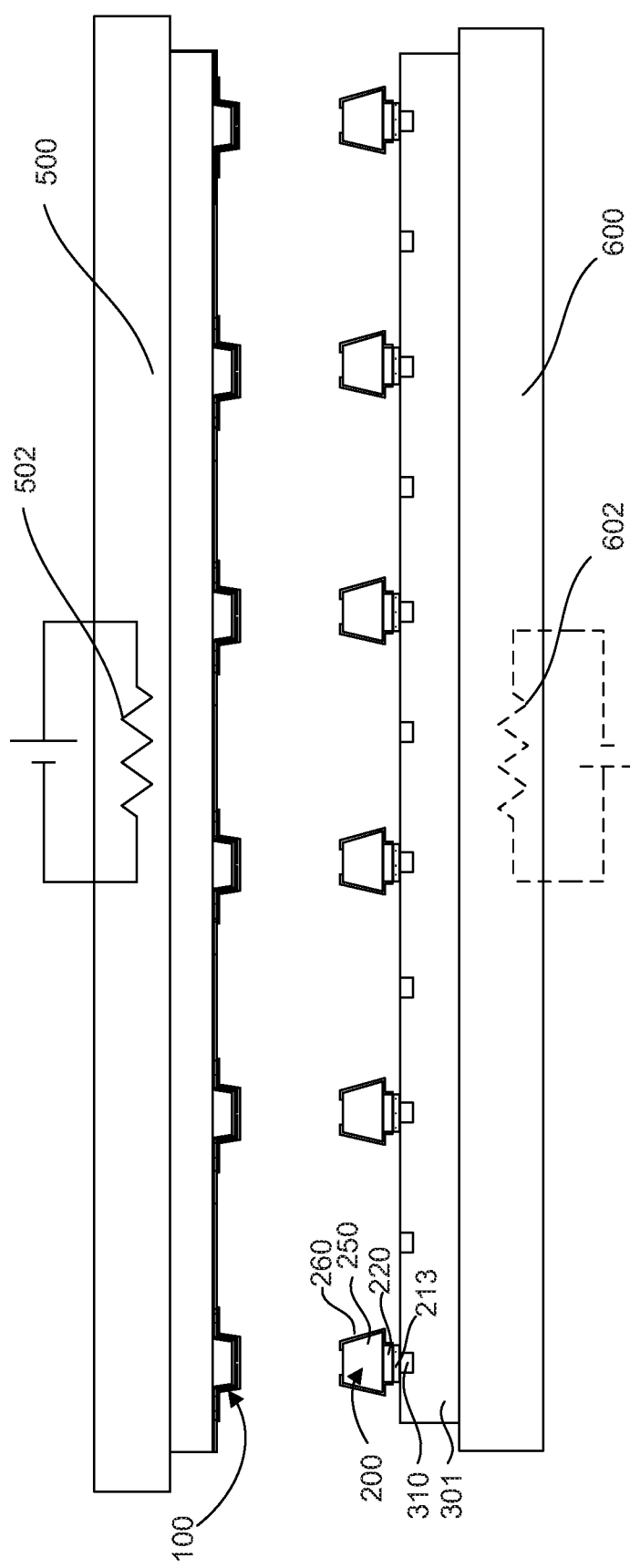
FIG. 40 is a side view illustration of an array of micro LED devices selectively released onto a receiving substrate in accordance with an embodiment of the invention.

FIG. 39 is a side view illustration of an array of micro device transfer heads with an array of micro LED devices positioned over a receiving substrate 301 including a plurality of driver contacts 310 in accordance with an embodiment of the invention, in which the portions of the bonding layer which have been picked up are in the liquid state 211. FIG. 40 is a side view illustration of an array of micro LED devices selectively released onto the receiving substrate 301 over the driver contacts 310 in accordance with an embodiment of the invention. In another embodiment, a single micro LED device 200 or a portion of the micro LED devices 200 are released. Upon release of the micro devices 200 onto the receiving substrate 301 the corresponding portions of the bonding layer are allowed to cool to the solid state 213.

In an embodiment, the receiving substrate 301 can be heated to a temperature above or below the liquidus temperature of the bonding layer 210 to assist with the transfer process. The receiving substrate 301 can also be locally or globally heated. In one embodiment, the receiving substrate is globally heated with a heating element 602 and heat distribution plate 600 similar to the carrier substrate. Heat can be applied in other fashions, such as IR heat lamps, lasers, resistive heating elements, amongst others. In one embodiment, a localized laser can be provided above a top surface of the receiving substrate 301 to provide localized heating to the bonding layer or receiving substrate. In another embodiment, a localized laser can be provided below a bottom surface of the receiving substrate 301, so that the bonding layer or receiving substrate is locally heated from the backside. Where localized heating of the receiving substrate 301 is utilized, for example by laser, temperatures below or above the liquidus temperature of the bonding layer may be accomplished. For example, a local region of receiving substrate 301 adjacent contact 310 can be locally heated to or above the liquidus temperature of the bonding layer to facilitate bonding, followed by cooling to solidify the bond. Likewise, the receiving substrate 301 can be locally or globally maintained at an elevated temperature below the liquidus temperature of the bonding layer, or allowed to remain at room temperature.

A variety of operations can be performed to control the phase of the portion of the bonding layer when picking up, transferring, contacting the receiving substrate, and releasing the micro devices and portion of the bonding layer 210 on the receiving substrate. For example, the portion of the bonding layer which is picked up with the micro device can be maintained in the liquid state during the contacting operation 3650 and during the release operation 3660. In another embodiment, the portion of the bonding layer can be allowed to cool to a solid phase after being picked up. For example, the portion of the bonding layer can be in a solid phase during contacting operation 3650, and again melted to the liquid state prior to or during the release operation 3660. A variety of temperature and material phase cycles can be performed in accordance with embodiments of the invention.

In utilizing the various aspects of this invention, it would become apparent to one skilled in the art that combinations or variations of the above embodiments are possible for forming a micro device transfer head and head array, and for transferring a micro device and micro device array. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

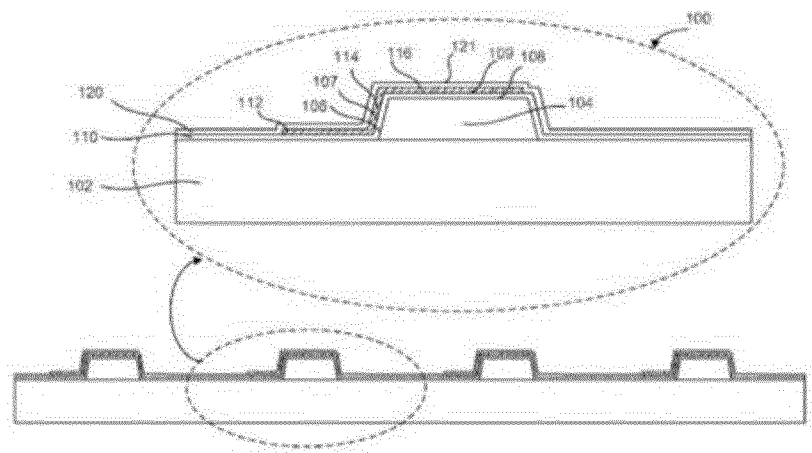

What is claimed is:

1. A micro device transfer head comprising:
   a base substrate;
   a mesa structure protruding away from the base substrate, wherein the mesa structure includes a top surface and sidewalls;
   wherein the top surface of the mesa structure has x-y dimensions, each x dimension and y dimension of 1 to 100 μm;

a passivation layer covering the top surface and the sidewalls of the mesa structure; and a patterned conductive layer spanning over the passivation layer and the top surface of the mesa structure.

2. The micro device transfer head of claim 1, wherein the patterned conductive layer is formed of a metal or metal alloy.

3. The micro device transfer head of claim 2, wherein the top surface of the mesa structure has rectangular x-y dimensions.

4. The micro device transfer head of claim 2, wherein the top surface of the mesa structure has square x-y dimensions.

5. The micro device transfer head of claim 2, wherein the sidewalls are tapered and protrude away from the base substrate to the top surface of the mesa structure.

6. The micro device transfer head of claim 2, wherein the mesa structure is integrally formed with the base substrate.

7. The micro device transfer head of claim 6, wherein the base substrate and the mesa structure comprise silicon.

8. The micro device transfer head of claim 7, wherein the patterned conductive layer spans along one or more of the sidewalls of the mesa structure.

9. The micro device transfer head of claim 8, wherein the patterned conductive layer does not completely cover the top surface of the mesa structure.

10. The micro device transfer head of claim 9, wherein the patterned conductive layer is connected to a voltage source.

11. A micro device transfer head array comprising:
an array of transfer heads, each transfer head including a mesa structure protruding away from a base substrate, wherein each mesa structure includes a top surface and sidewalls;
wherein the top surface has x-y dimensions, each x dimension and y dimension of 1 to 100 µm;
a passivation layer covering the top surface and the sidewalls of each mesa structure; and
a patterned conductive layer spanning over the passivation layer and the top surface of each mesa structure.

12. The micro device transfer head array of claim 11, wherein the patterned conductive layer is formed of a metal or metal alloy.

13. The micro device transfer head array of claim 12, wherein the top surface of each mesa structure has rectangular x-y dimensions.

14. The micro device transfer head array of claim 12, wherein the top surface of each mesa structure has square x-y dimensions.

15. The micro device transfer head array of claim 12, wherein the sidewalls for each mesa structure are tapered and protrude away from the base substrate to the top surface of the mesa structure.

16. The micro device transfer head array of claim 12, wherein each mesa structure is integrally formed with the base substrate.

17. The micro device transfer head array of claim 16, wherein the base substrate and each mesa structure comprise silicon.

18. The micro device transfer head array of claim 17, wherein the patterned conductive layer spans along one or more of the sidewalls of each mesa structure.

19. The micro device transfer head array of claim 18, wherein the patterned conductive layer does not completely cover the top surface of each mesa structure.

20. The micro device transfer head array of claim 19, wherein the patterned conductive layer is connected to a voltage source.

* * * * *

UNITED STATES PATENT AND TRADEMARK OFFICE
CERTIFICATE OF CORRECTION

PATENT NO. : 11,552,046 B2
APPLICATION NO. : 16/809386
DATED : January 10, 2023
INVENTOR(S) : Andreas Bibl et al.

It is certified that error appears in the above-identified patent and that said Letters Patent is hereby corrected as shown below:

On the Title Page

Item (12) delete "Bibi et al." and insert in place there of --Bibl et al.-- (As shown on the attached Title Page)

Item (72) Inventors: delete "Andreas Bibi" and insert in place there of --Andreas Bibl--

Signed and Sealed this
Tenth Day of September, 2024

Katherine Kelly Vidal
*Director of the United States Patent and Trademark Office*

CERTIFICATE OF CORRECTION (continued)

(12) United States Patent
Bibl et al.

(10) Patent No.: US 11,552,046 B2
(45) Date of Patent: *Jan. 10, 2023

(54) MICRO DEVICE TRANSFER HEAD ASSEMBLY

(71) Applicant: Apple Inc., Cupertino, CA (US)

(72) Inventors: Andreas Bibl, Los Altos, CA (US); John A. Higginson, Santa Clara, CA (US); Hung-Fai Stephen Law, Los Altos, CA (US); Hsin-Hua Hu, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 248 days.

This patent is subject to a terminal disclaimer.

(21) Appl. No.: 16/809,386

(22) Filed: Mar. 4, 2020

(65) Prior Publication Data
US 2020/0219840 A1 Jul. 9, 2020

Related U.S. Application Data

(63) Continuation of application No. 16/117,414, filed on Aug. 30, 2018, now Pat. No. 10,607,961, which is a
(Continued)

(51) Int. Cl.
*H01L 23/00* (2006.01)
*H01L 21/67* (2006.01)
(Continued)

(52) U.S. Cl.
CPC ......... *H01L 24/83* (2013.01); *B32B 38/18* (2013.01); *H01L 21/67144* (2013.01);
(Continued)

(58) Field of Classification Search
CPC ... H04L 24/83; H04L 21/67144; H04L 24/75; H04L 24/95; H04L 24/97; H04L 25/0753;
(Continued)

(56) References Cited

U.S. PATENT DOCUMENTS 3,717,743 A 2/1973 Costello
3,935,986 A 2/1976 Lattari et al.
(Continued)

FOREIGN PATENT DOCUMENTS

CN 101728288 A 1/2003
CN 1639841 A 7/2005
(Continued)

OTHER PUBLICATIONS

"Characteristics of electrostatic Chuck(ESC)" Advanced Materials Research Group New Technology Research Laboratory 2000 pp. 51-53 accessed at http://www.socnb.com/report/ptech_e/2000p51_e.pdf.
(Continued)

*Primary Examiner* — Jacob T Minskey
*Assistant Examiner* — Caroline Beha
(74) *Attorney, Agent, or Firm* — Aikin & Gallant, LLP

(57) ABSTRACT

A method of transferring a micro device and an array of micro devices are disclosed. A carrier substrate carrying a micro device connected to a bonding layer is heated to a temperature below a liquidus temperature of the bonding layer, and a transfer head is heated to a temperature above the liquidus temperature of the bonding layer. Upon contacting the micro device with the transfer head, the heat from the transfer head transfers into the bonding layer to at least partially melt the bonding layer. A voltage applied to the transfer head creates a grip force which picks up the micro device from the carrier substrate.

20 Claims, 37 Drawing Sheets